(12) United States Patent
Ito et al.

(10) Patent No.: US 12,422,200 B2
(45) Date of Patent: Sep. 23, 2025

(54) CAGE ASSEMBLY AND RECEPTACLE ASSEMBLY

(71) Applicant: Yamaichi Electronics Co., Ltd., Tokyo (JP)

(72) Inventors: Toshiyasu Ito, Tokyo (JP); Masaaki Saito, Tokyo (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 125 days.

(21) Appl. No.: 18/372,841

(22) Filed: Sep. 26, 2023

(65) Prior Publication Data

US 2025/0102246 A1    Mar. 27, 2025

(51) Int. Cl.

| | |
|---|---|
| *G06F 1/16* | (2006.01) |
| *F28F 9/00* | (2006.01) |
| *F28F 9/02* | (2006.01) |
| *G02B 6/42* | (2006.01) |
| *H05K 5/00* | (2025.01) |
| *H05K 7/00* | (2006.01) |
| *H05K 7/20* | (2006.01) |

(52) U.S. Cl.
CPC ............ *F28F 9/002* (2013.01); *F28F 9/0273* (2013.01); *F28F 9/0278* (2013.01); *G02B 6/4269* (2013.01); *H05K 7/20418* (2013.01); *F28F 2009/004* (2013.01); *F28F 2265/02* (2013.01)

(58) Field of Classification Search
CPC ........... H05K 7/20418; H05K 7/20409; H05K 7/2039; F28F 9/002; F28F 9/0273; F28F 9/0278; G02B 6/4269
See application file for complete search history.

(56) References Cited

U.S. PATENT DOCUMENTS

| 9,391,407 B1 * | 7/2016 | Bucher ............... H01R 13/659 |
| 9,407,046 B1 | 8/2016 | Bucher |
| 9,474,188 B2 | 10/2016 | Moore et al. |
| | (Continued) | |

FOREIGN PATENT DOCUMENTS

| CN | 108028494 A | 5/2018 |
| CN | 108987966 A | 12/2018 |
| | (Continued) | |

OTHER PUBLICATIONS

Extended European Search Report issued Feb. 7, 2025 in EP Application No. 24201717.6.

(Continued)

*Primary Examiner* — Anthony M Haughton
(74) *Attorney, Agent, or Firm* — Panitch Schwarze Belisario & Nadel LLP

(57) ABSTRACT

Provided are a cage assembly and a receptacle assembly that can efficiently cool a heat sink. An embodiment includes: a cage 100 configured to house an optical module 310; and a heat sink 50 configured to thermally contact with the optical module 310, the cage 100 has a port wall 110 defining a port Sp in which the optical module 310 is housed, a first adjacent wall 120 defining a first adjacent space S1 that is adjacent to the port Sp in the second direction, and a second adjacent wall 130 defining a second adjacent space S2 that is adjacent to the port Sp in the third direction and in which the optical module 310 is not housed, and the heat sink 50 is housed in the first adjacent space S1.

25 Claims, 54 Drawing Sheets

(56) References Cited

U.S. PATENT DOCUMENTS

| | | | |
|---|---|---|---|
| 9,547,141 | B2 | 1/2017 | Wu et al. |
| 9,761,974 | B2 | 9/2017 | L'Esperance et al. |
| 10,114,182 | B2 | 10/2018 | Zbinden et al. |
| 11,271,348 | B1 * | 3/2022 | Chen .................... H01R 12/724 |
| 2017/0077643 | A1 | 3/2017 | Zbinden et al. |
| 2018/0049348 | A1 | 2/2018 | Bucher |
| 2018/0337476 | A1 | 11/2018 | Guy Ritter et al. |
| 2019/0116692 | A1 * | 4/2019 | Little ................. H05K 7/20336 |
| 2019/0215989 | A1 | 7/2019 | Su et al. |
| 2020/0091637 | A1 * | 3/2020 | Scholeno ................. G02B 6/42 |
| 2021/0132311 | A1 * | 5/2021 | Shearman ............ G02B 6/4261 |
| 2021/0282301 | A1 | 9/2021 | Dogruoz et al. |
| 2022/0087070 | A1 | 3/2022 | Wang et al. |
| 2022/0159878 | A1 * | 5/2022 | Dillman ............. H05K 7/20509 |
| 2022/0190407 | A1 * | 6/2022 | Schmidt ................ H02M 7/003 |
| 2022/0244472 | A1 * | 8/2022 | Goergen ................. G02B 6/428 |
| 2022/0384996 | A1 | 12/2022 | Brunker et al. |
| 2023/0124658 | A1 | 4/2023 | Dogruoz et al. |
| 2023/0403814 | A1 * | 12/2023 | Ali ..................... H01R 13/6581 |

FOREIGN PATENT DOCUMENTS

| | | |
|---|---|---|
| CN | 114325962 A | 4/2022 |
| JP | 2022-548080 A | 11/2022 |
| TW | 201931980 A | 8/2019 |

OTHER PUBLICATIONS

Office Action and Search Report issued Jun. 12, 2025 in TW Application No. 113135844.

\* cited by examiner

FIG. 1
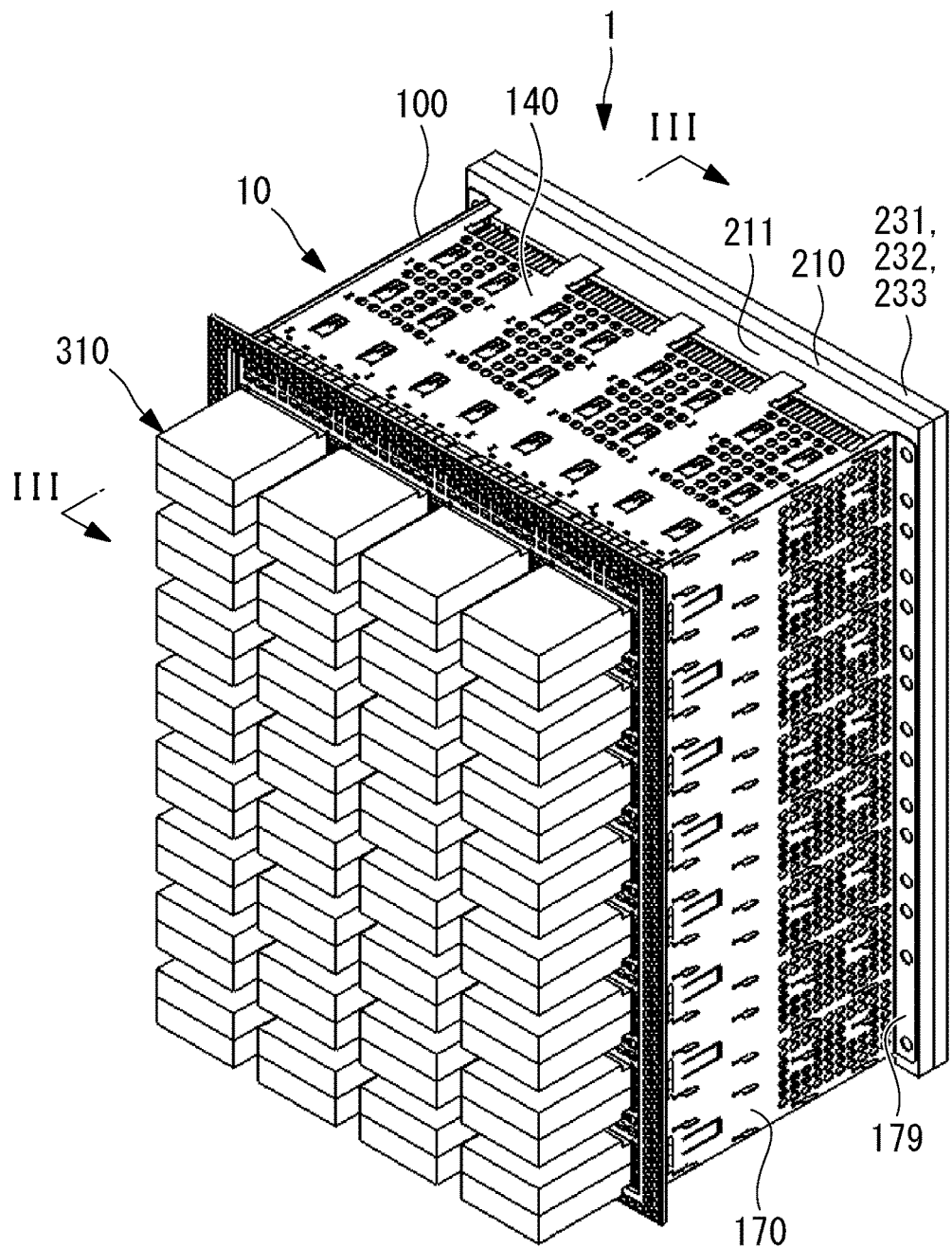
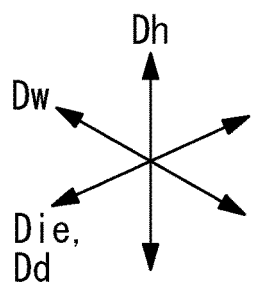

FIG. 3
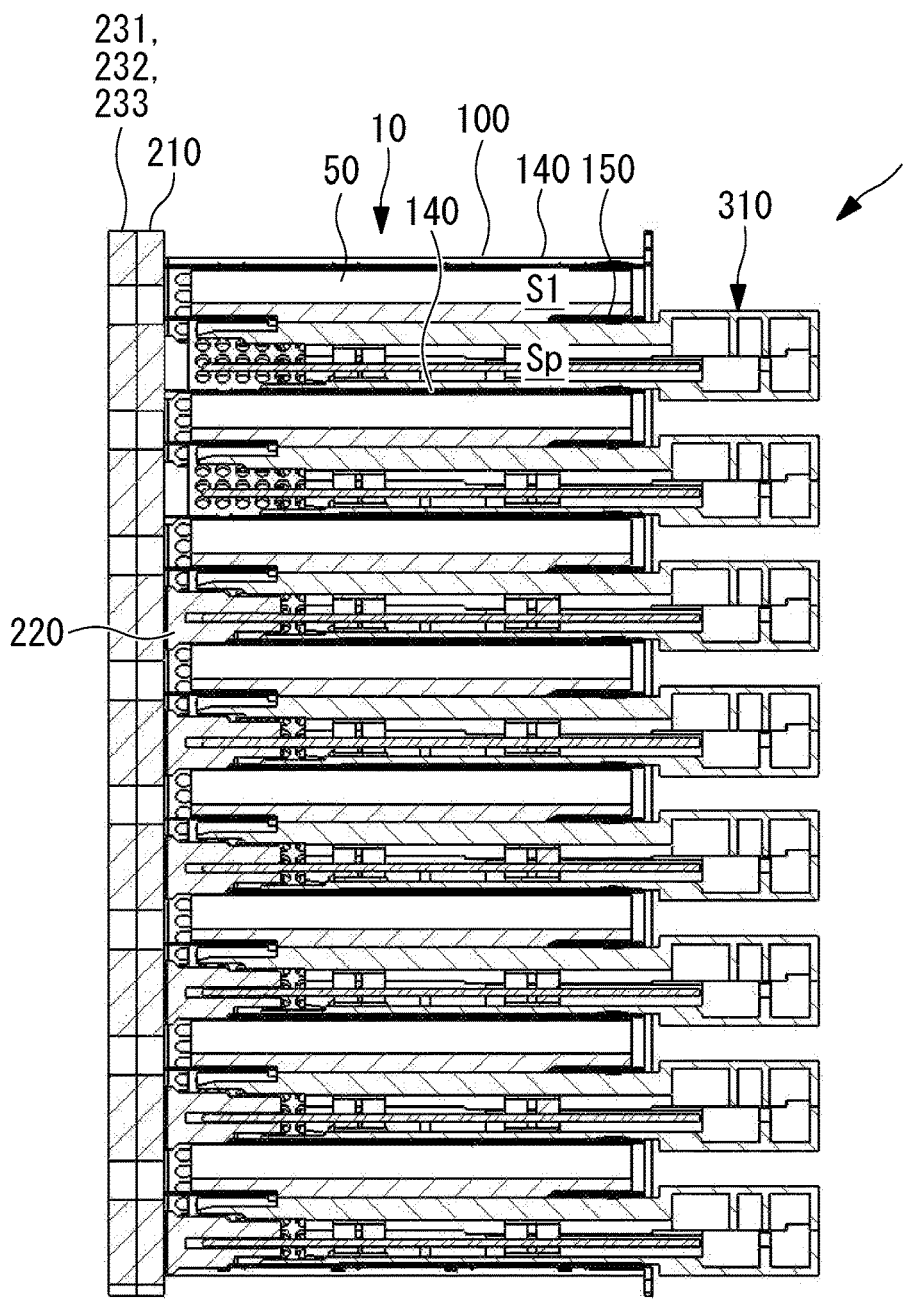
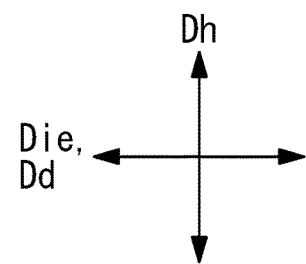

FIG. 8
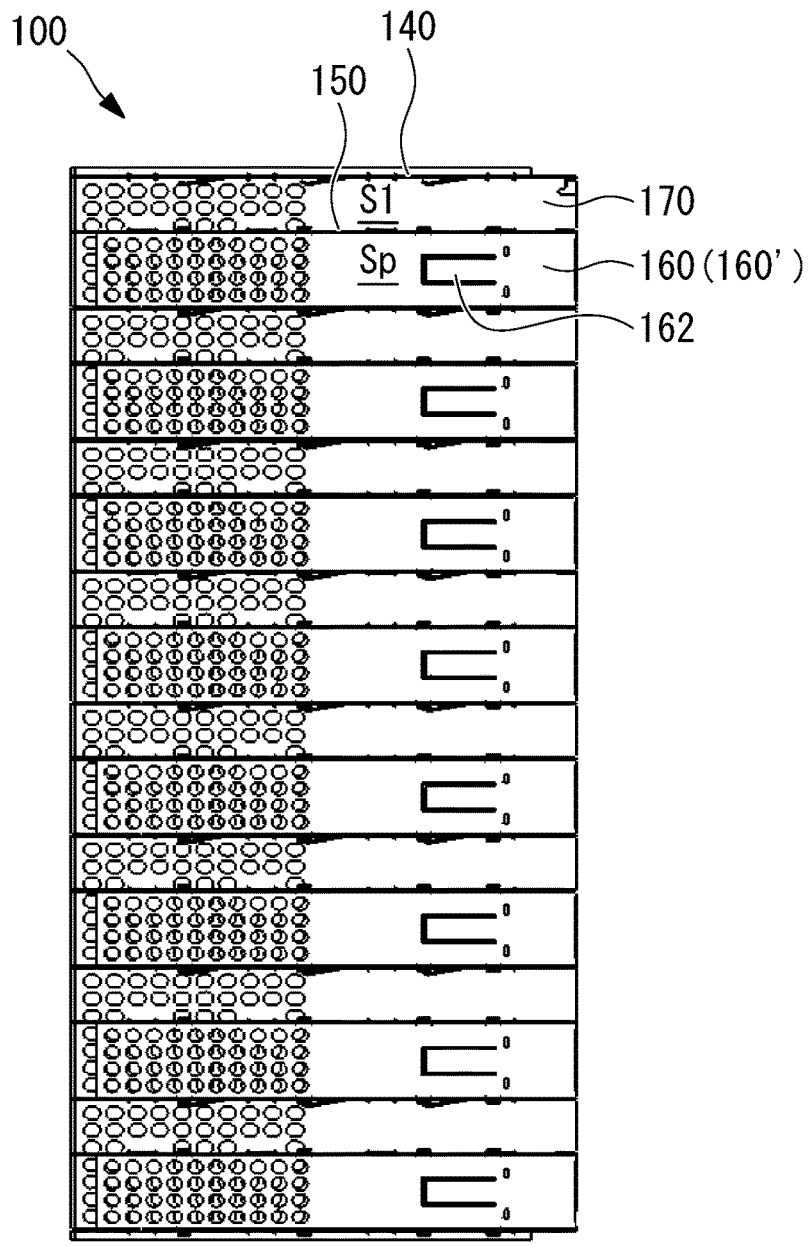
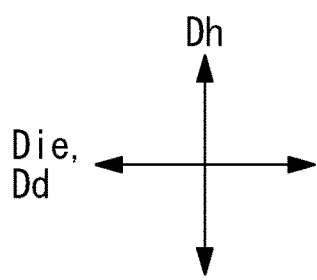

FIG. 15
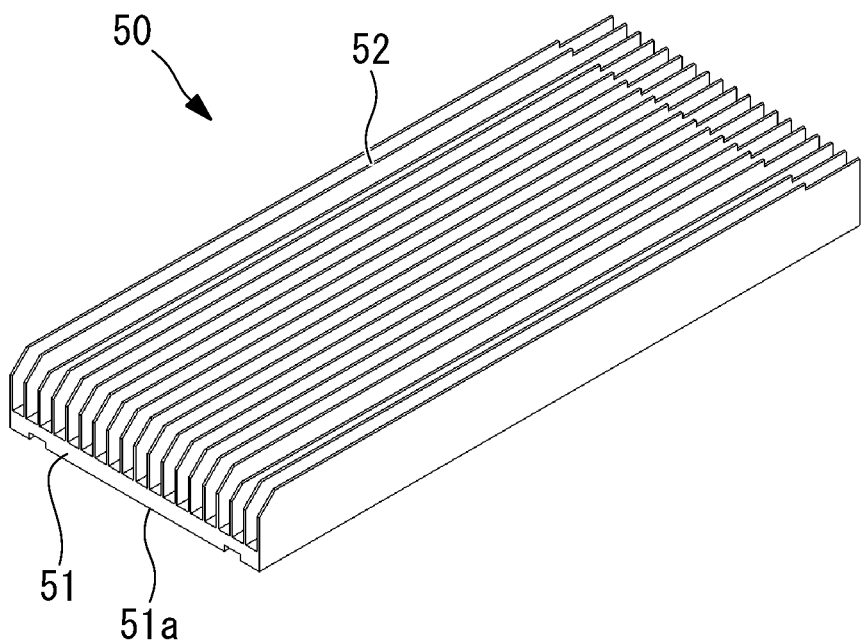
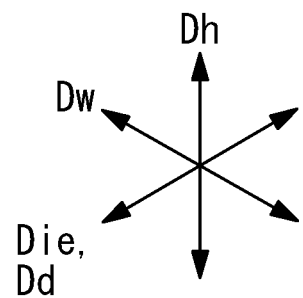

FIG. 16
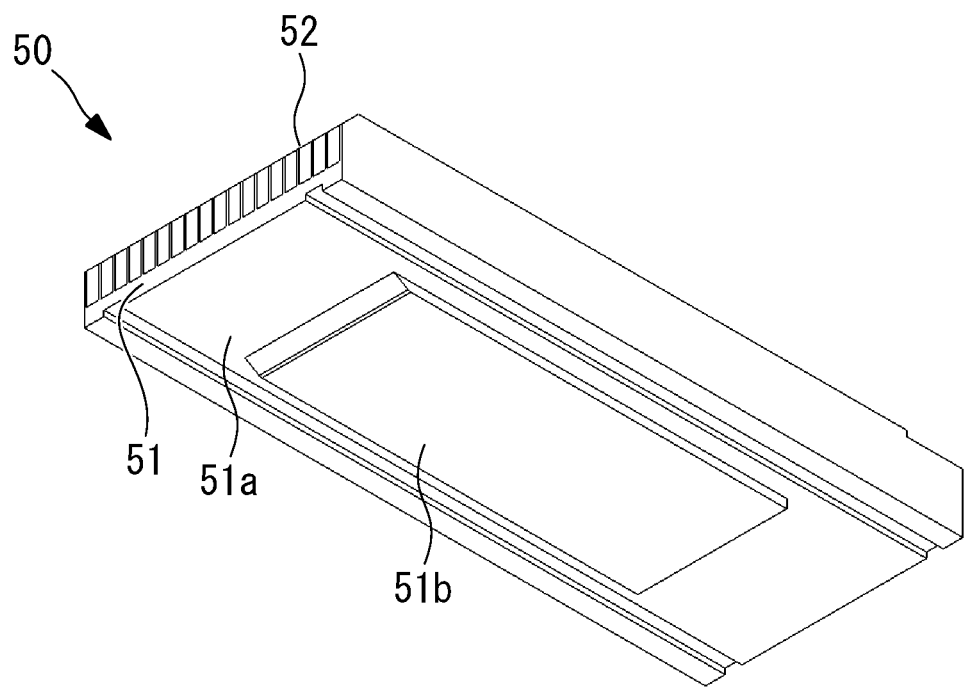
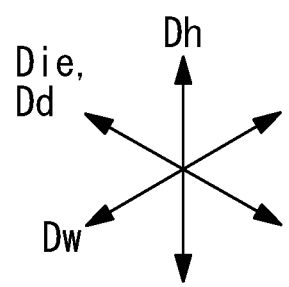

FIG. 18
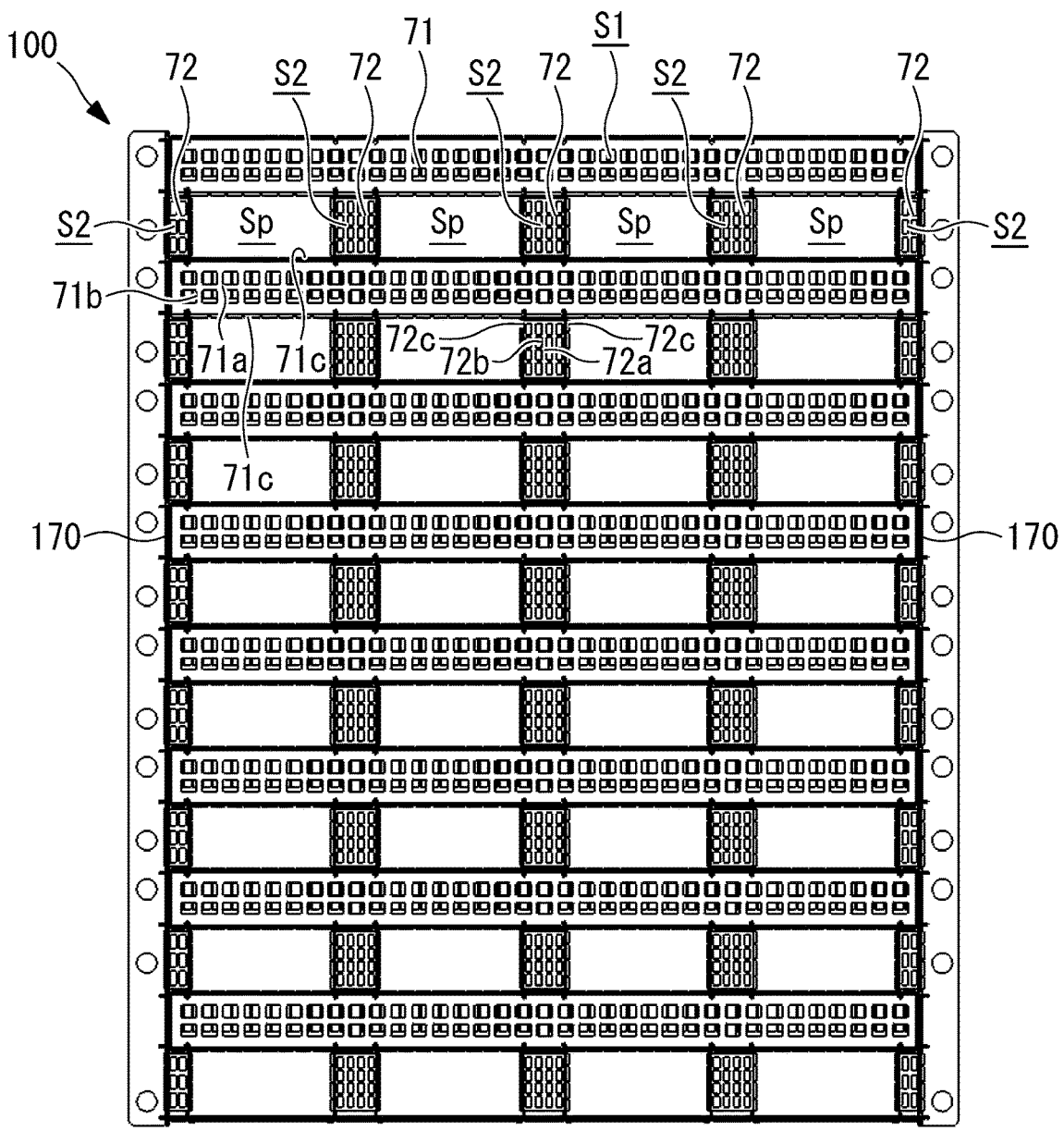
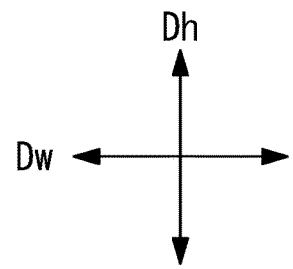

FIG. 20
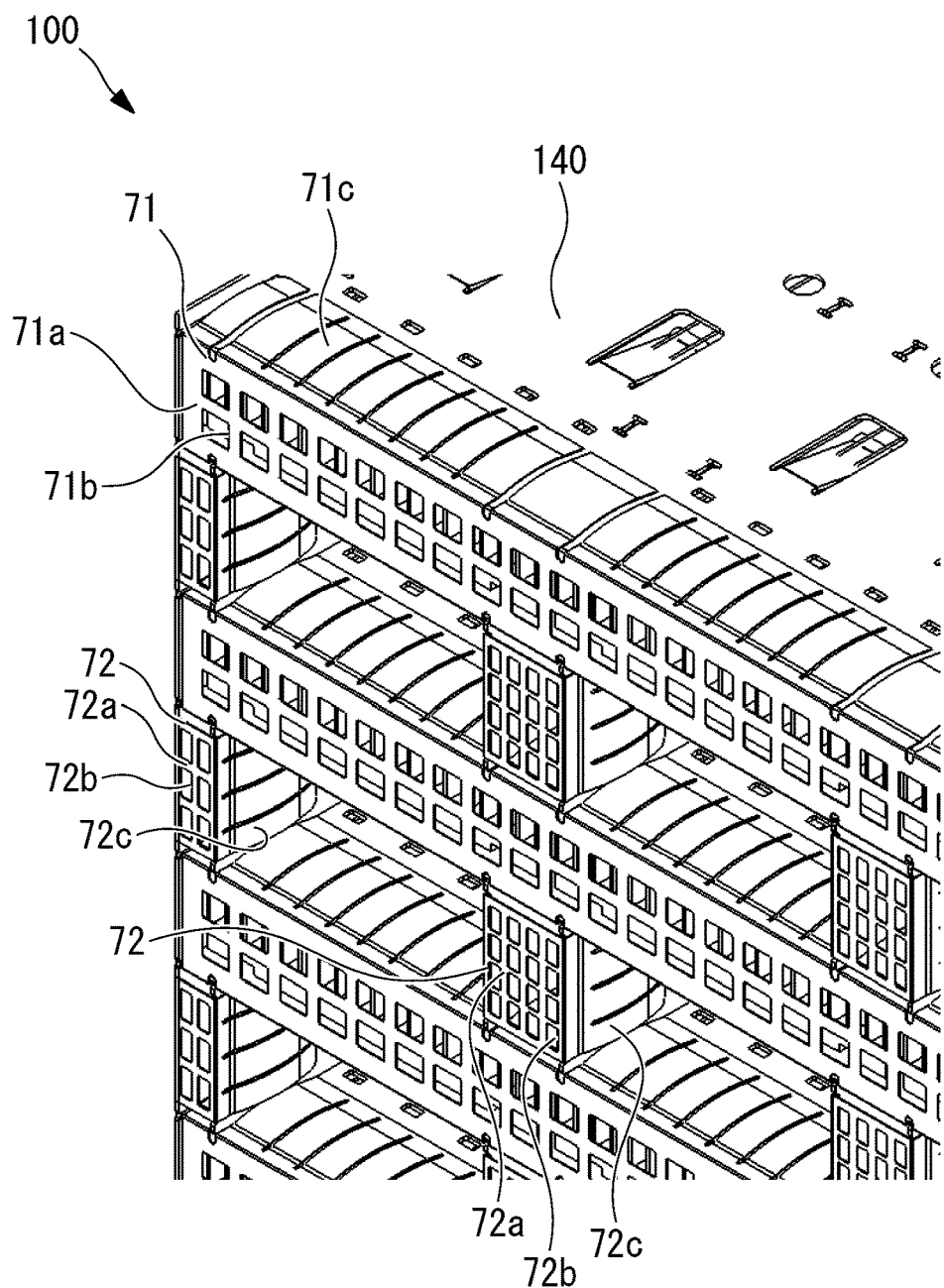
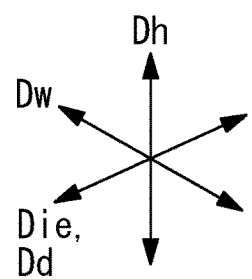

FIG. 27
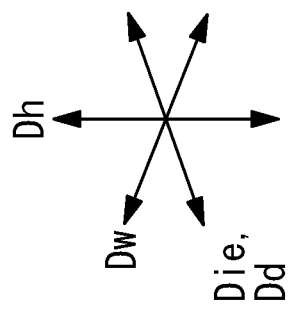
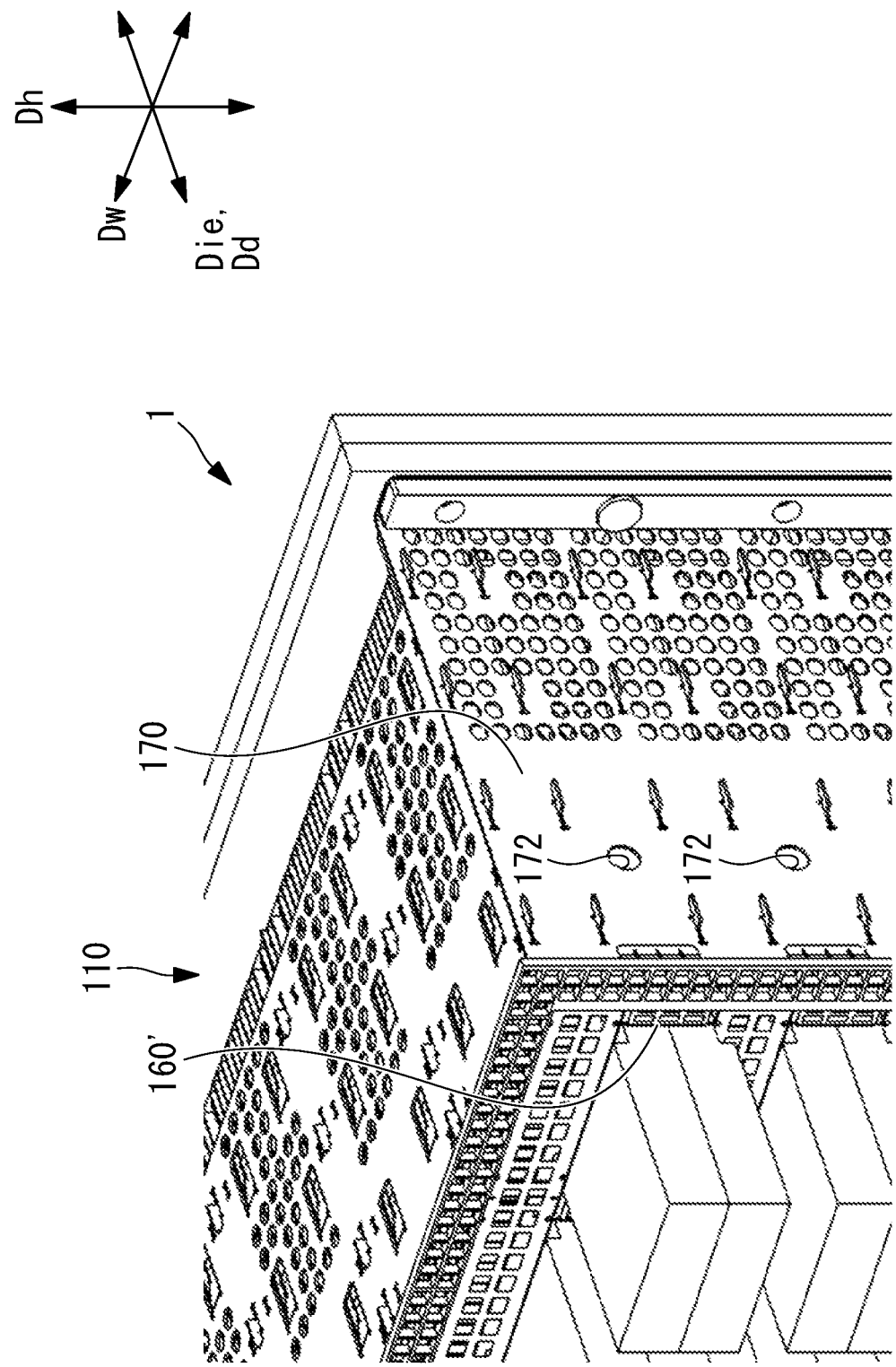

FIG. 29
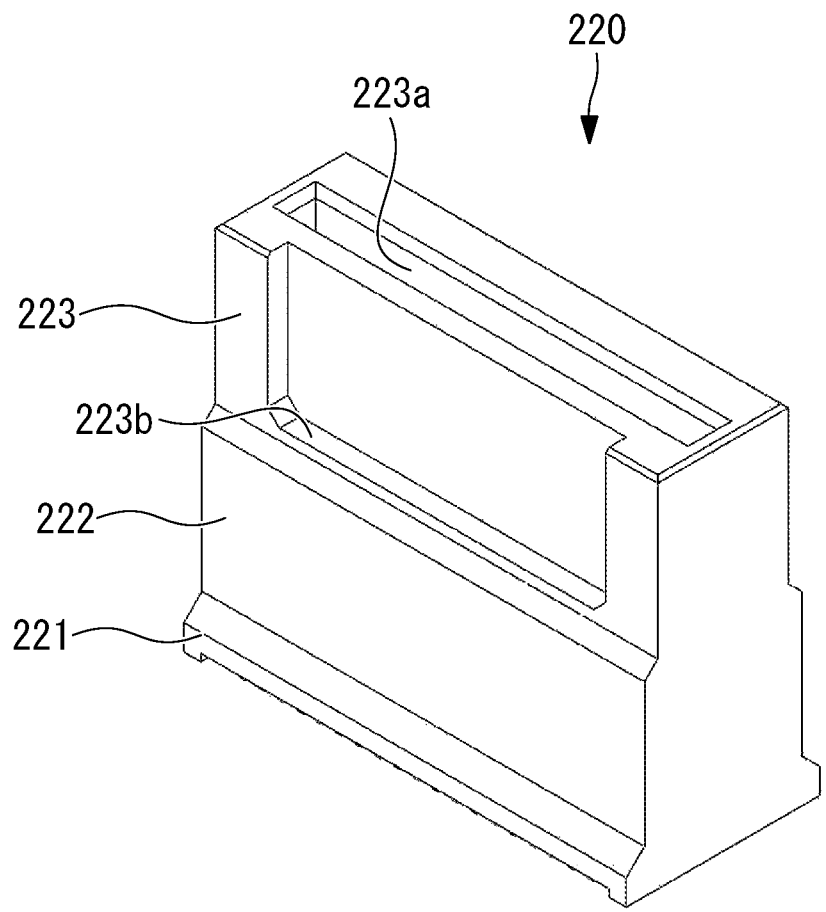
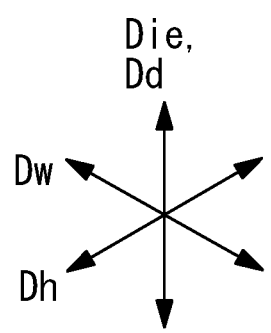

FIG. 36
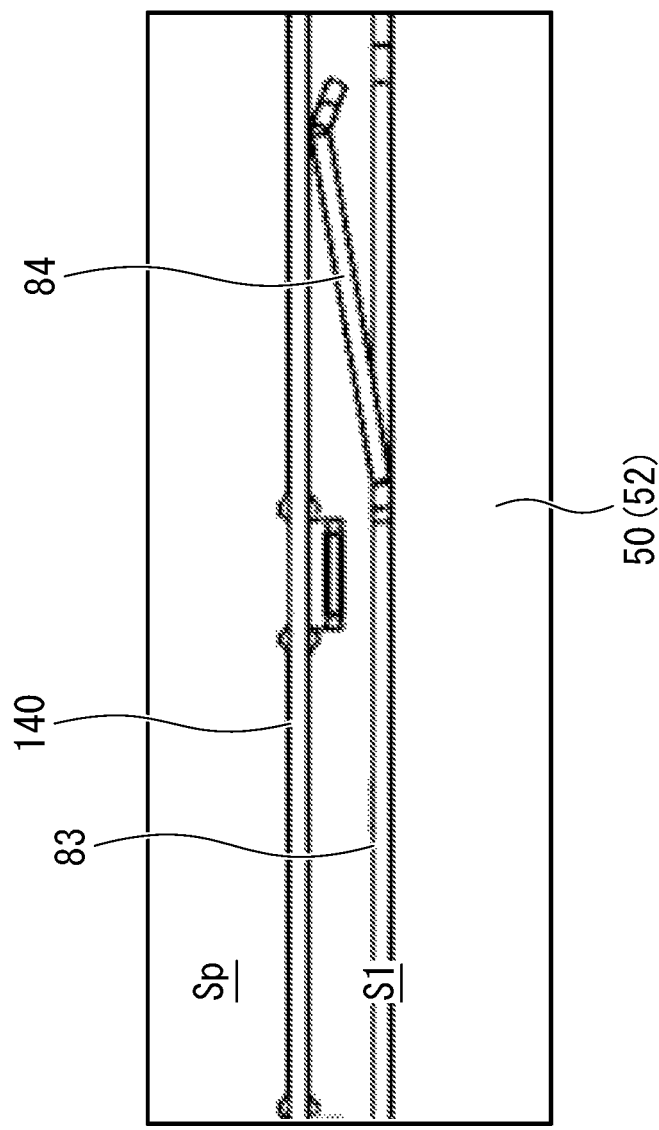
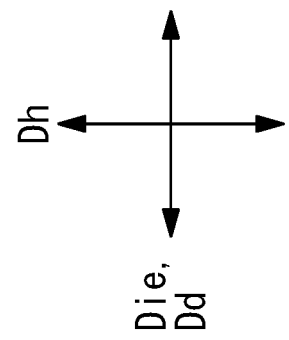

FIG. 38
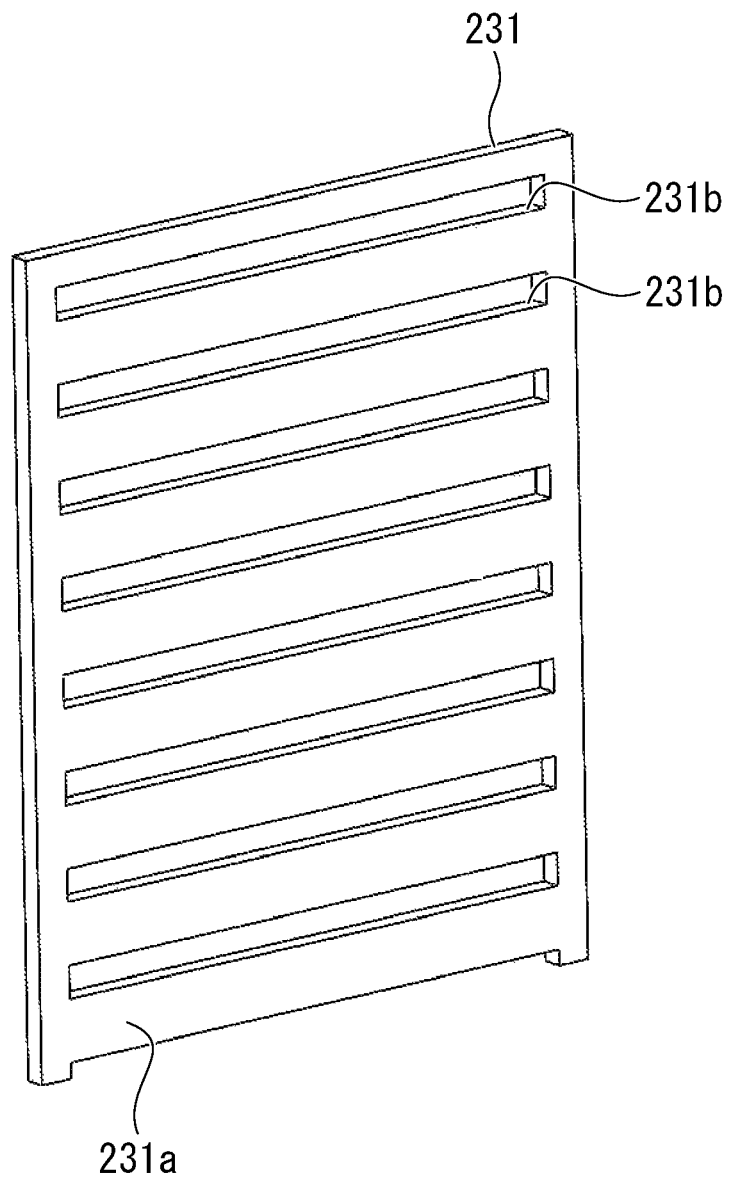
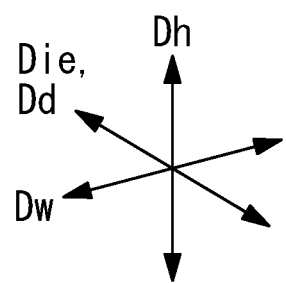

FIG. 39
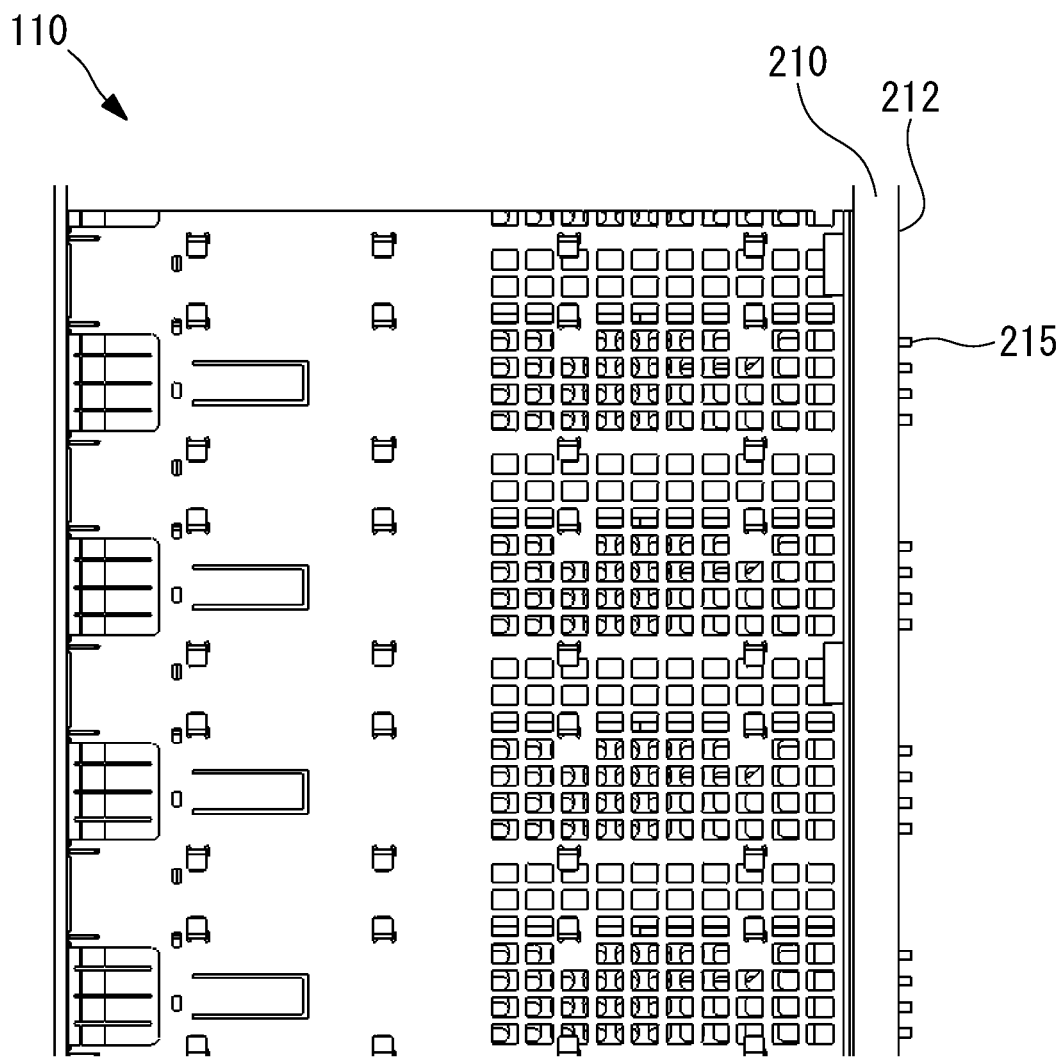
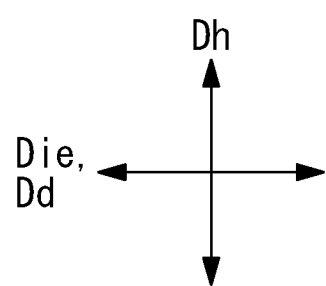

FIG. 40
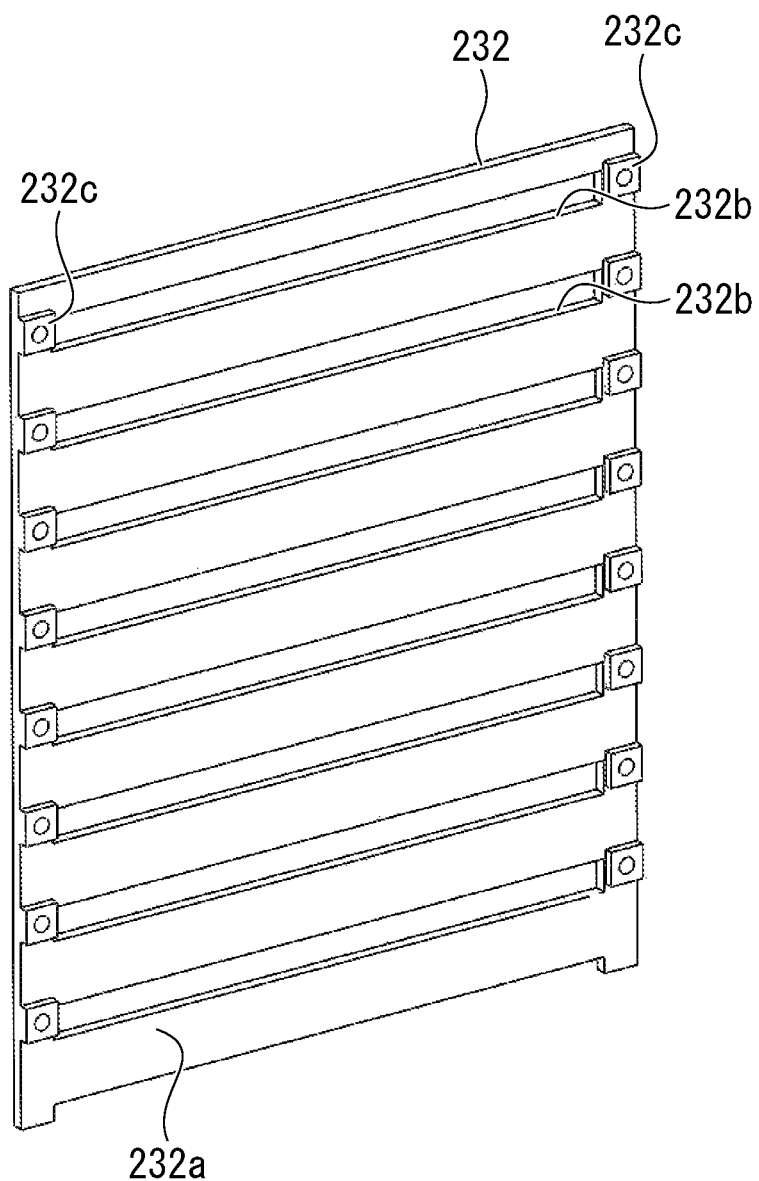
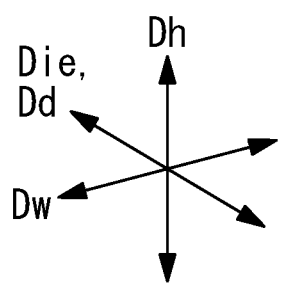

FIG. 41
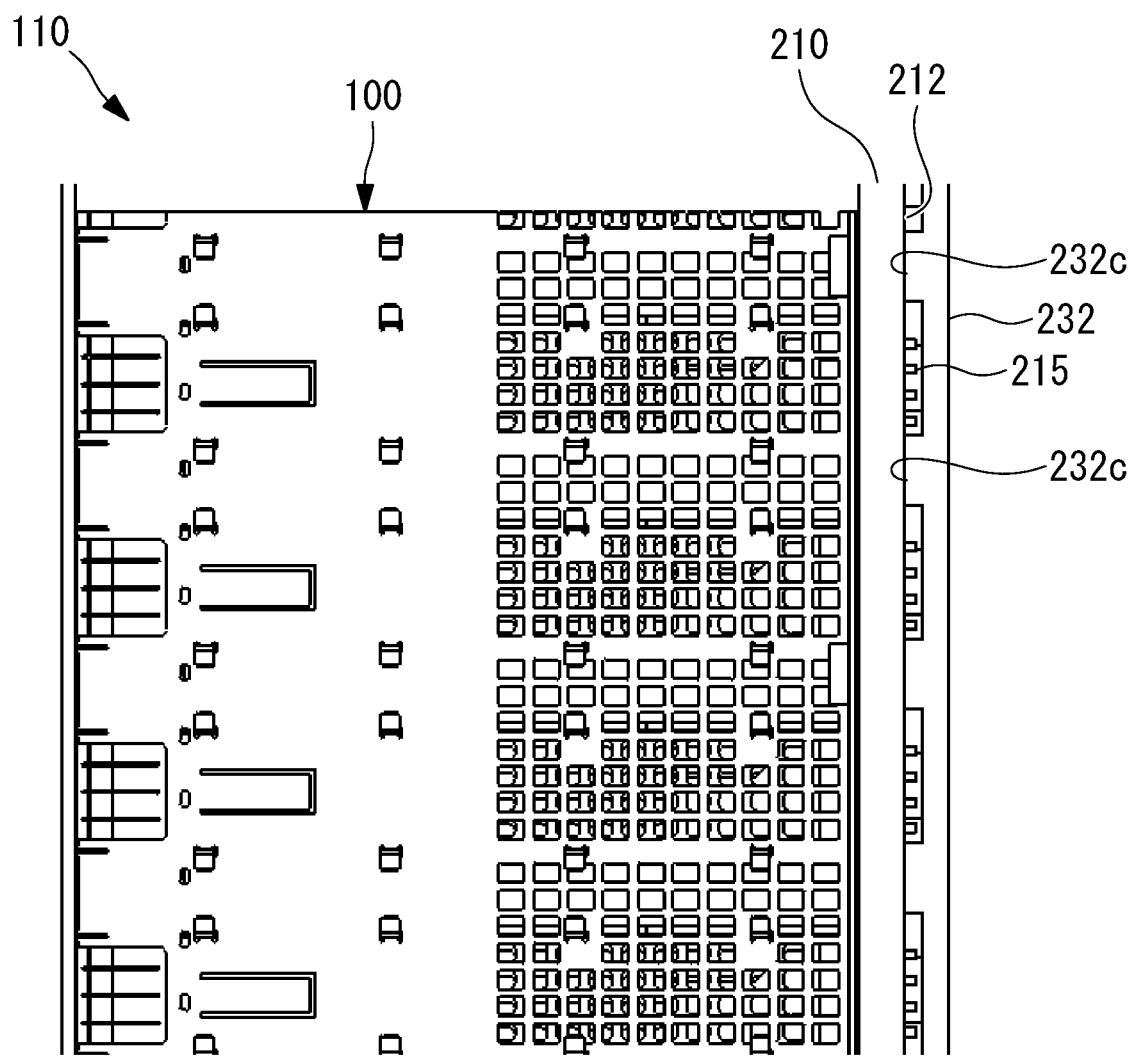
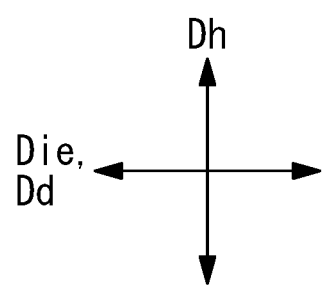

FIG. 42
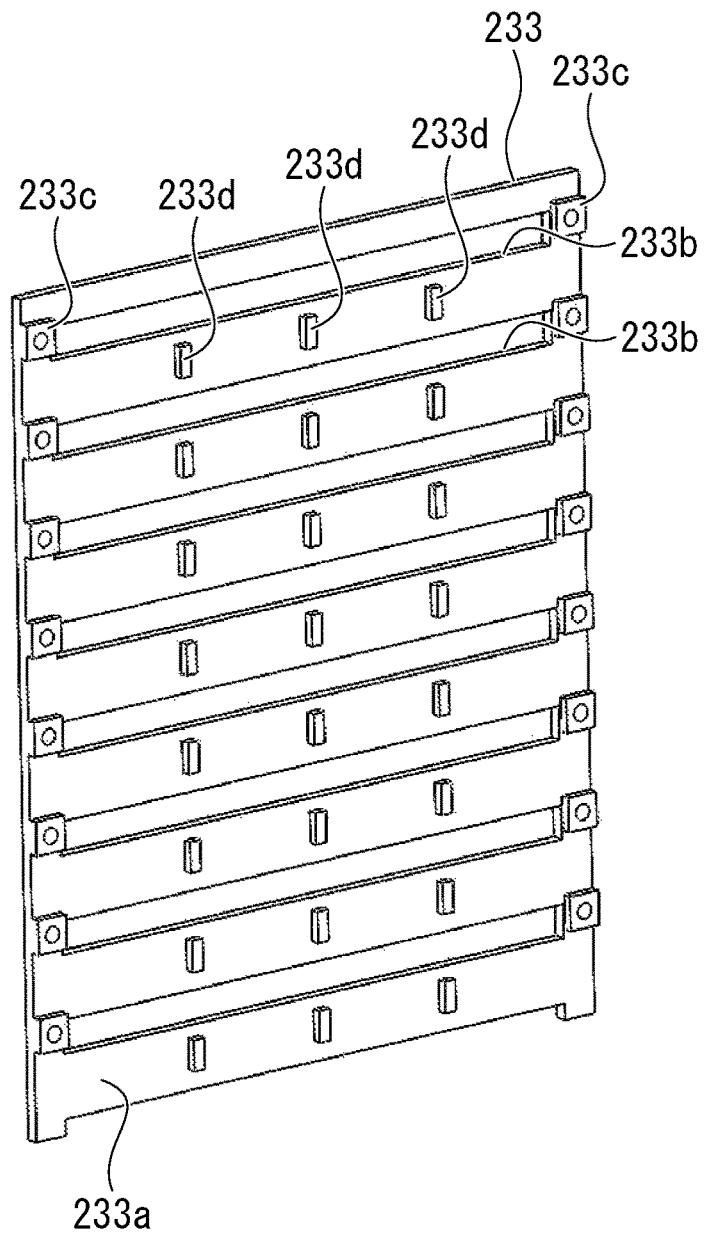
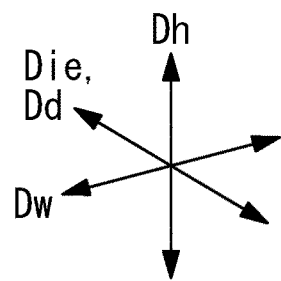

FIG. 43
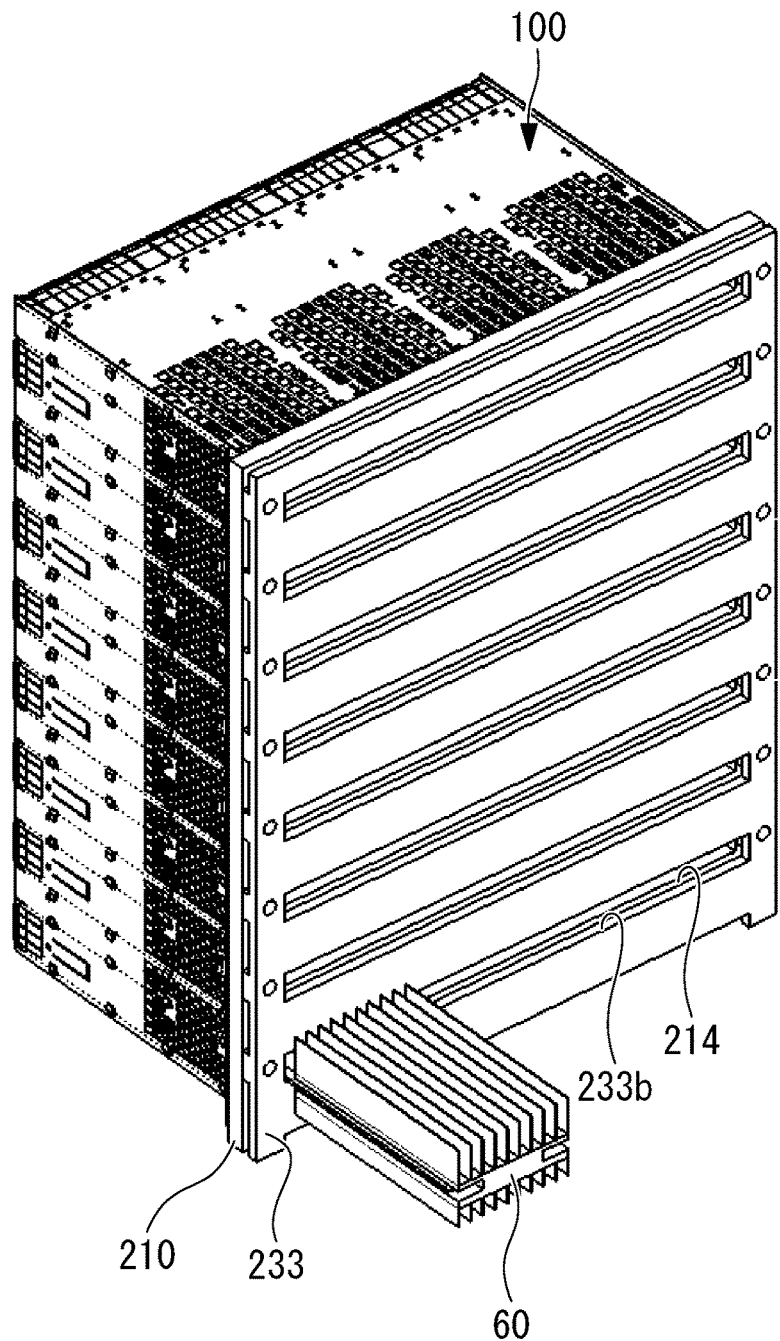
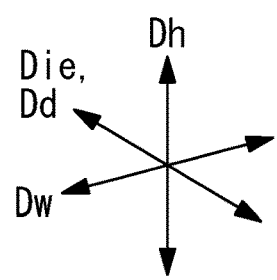

FIG. 45
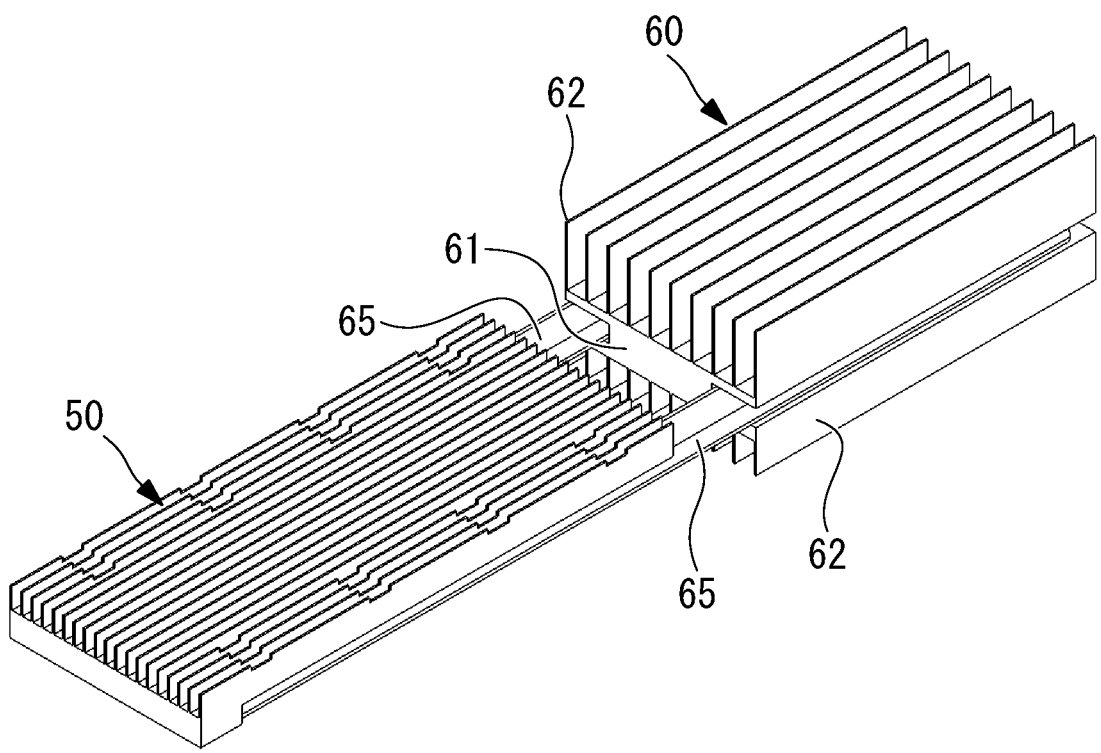
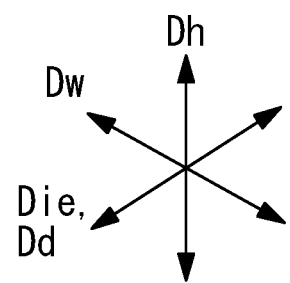

FIG. 46
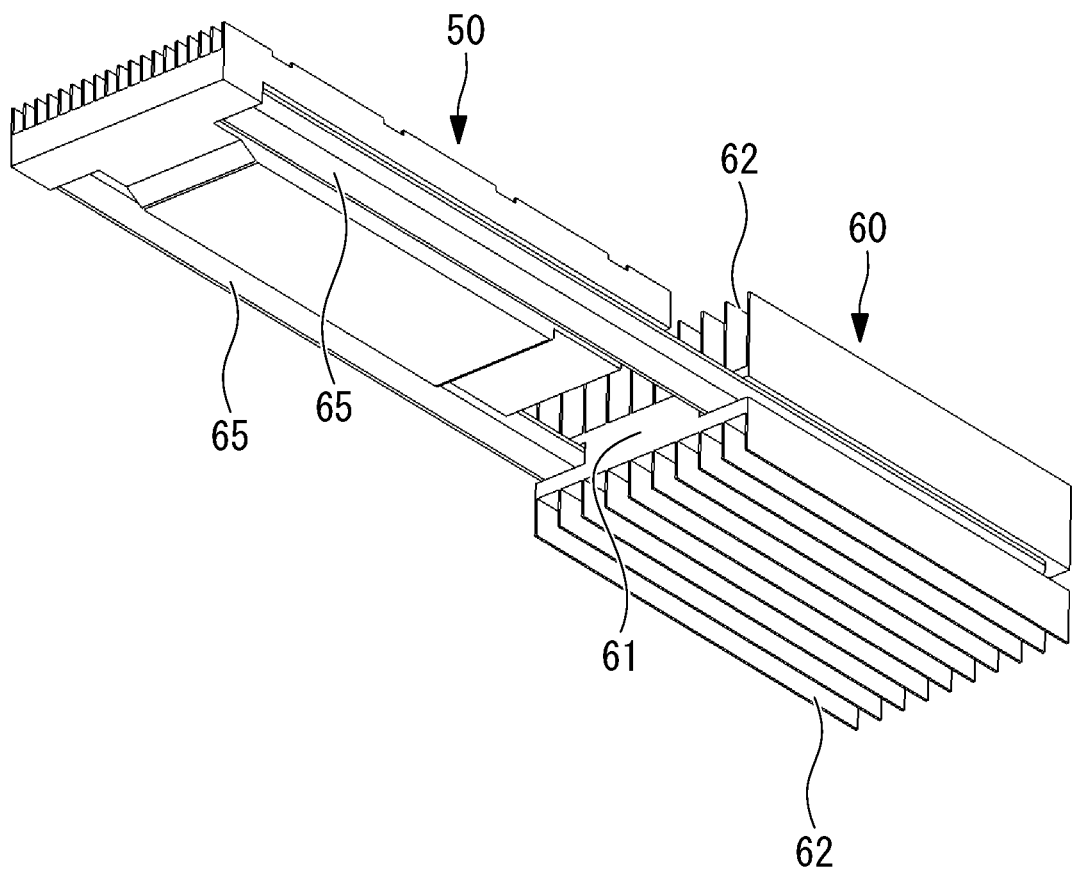
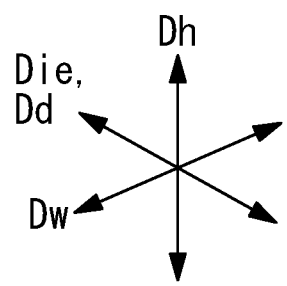

FIG. 47
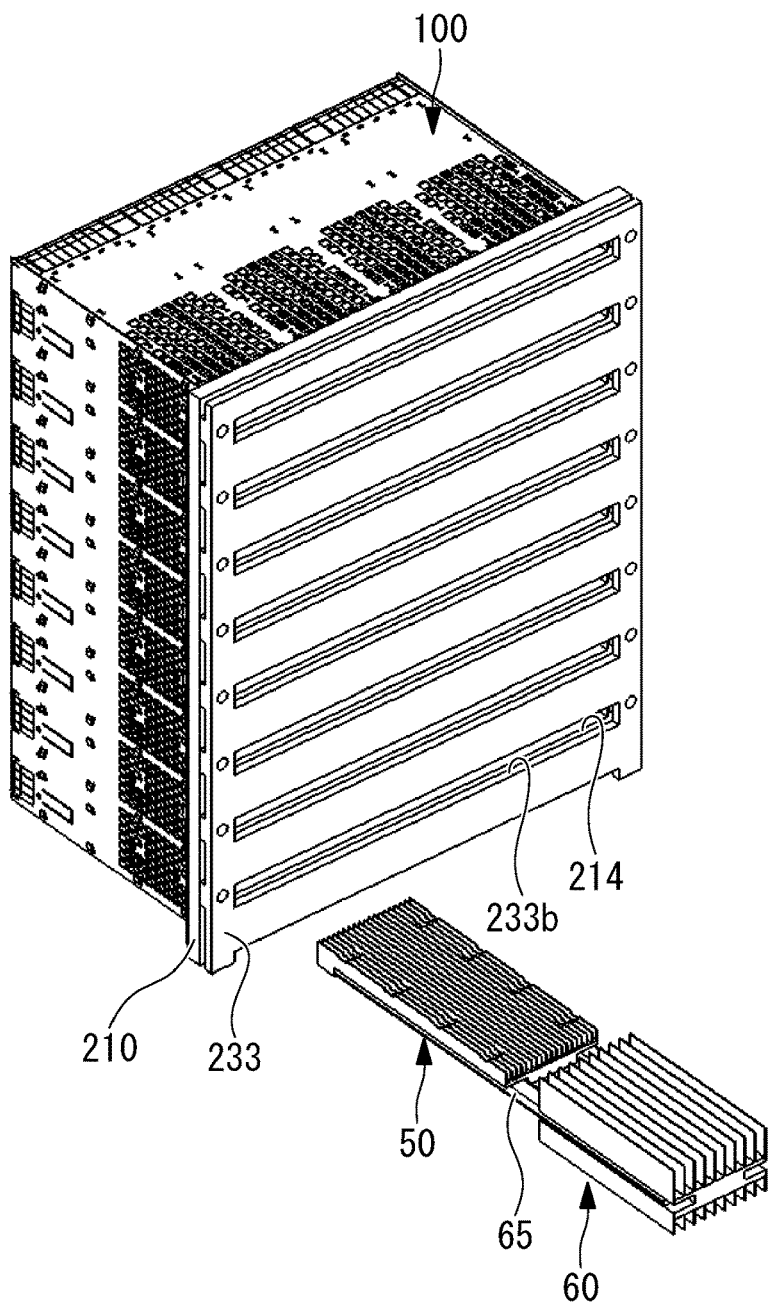
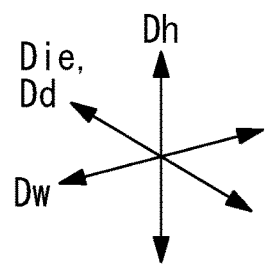

FIG. 48
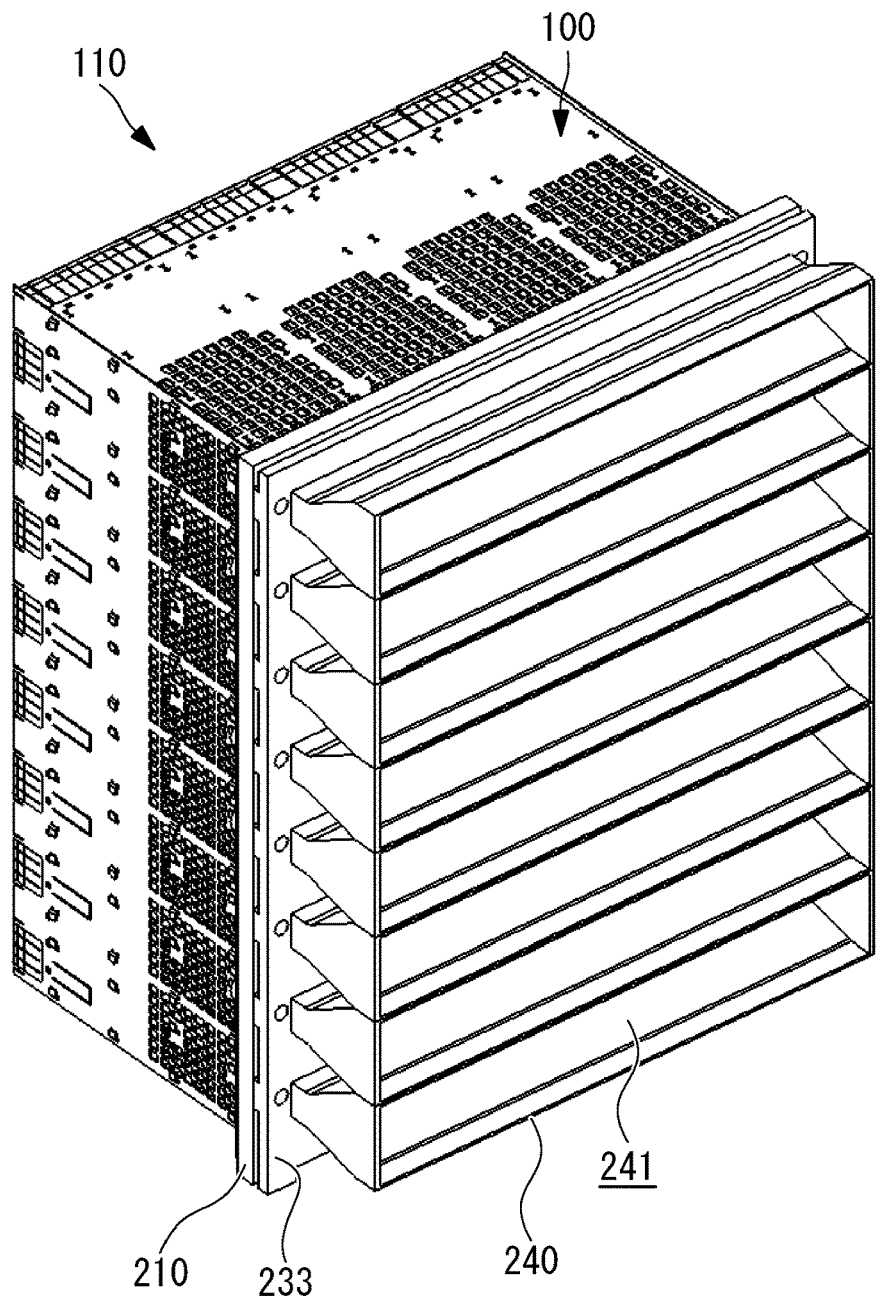
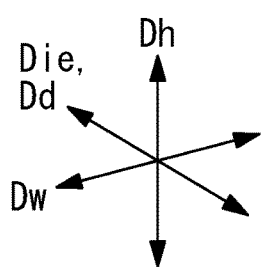

FIG. 49
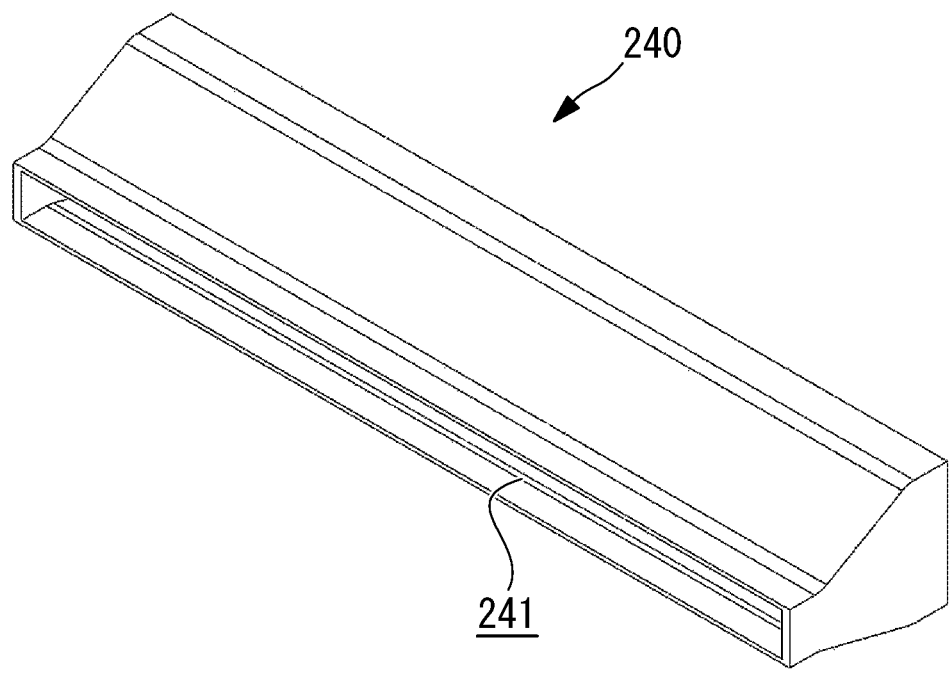
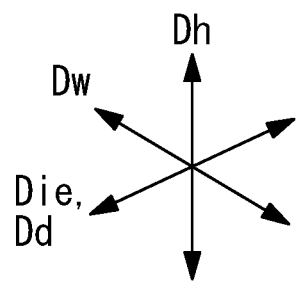

FIG. 50
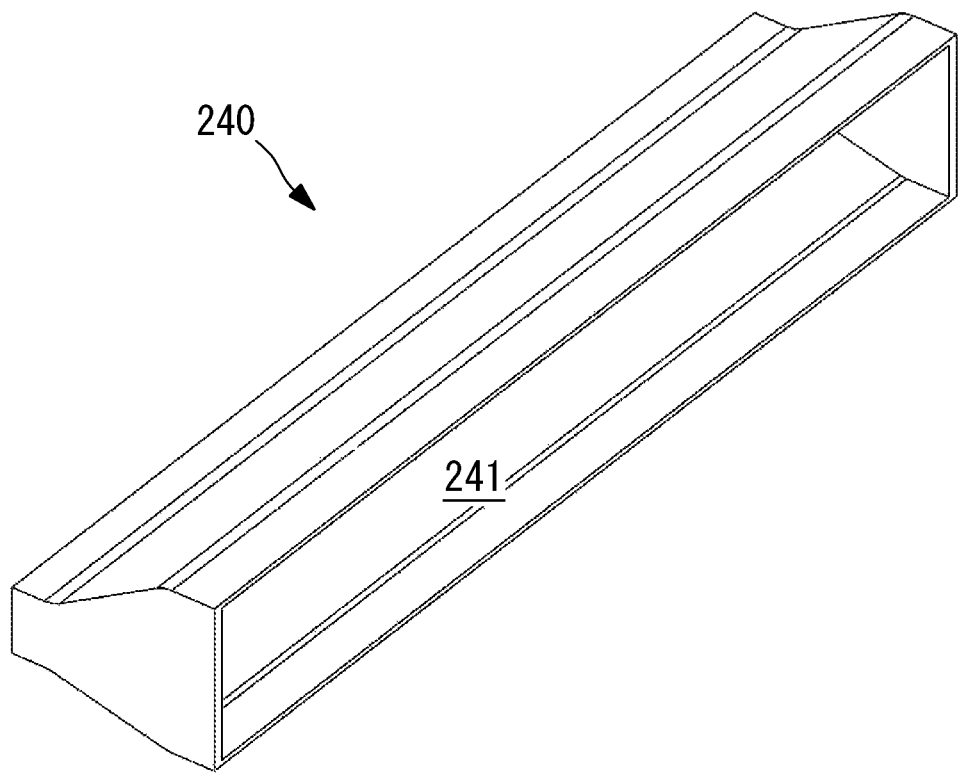
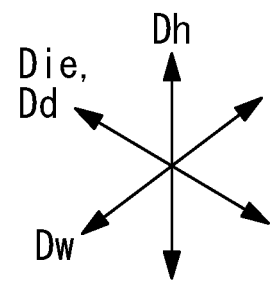

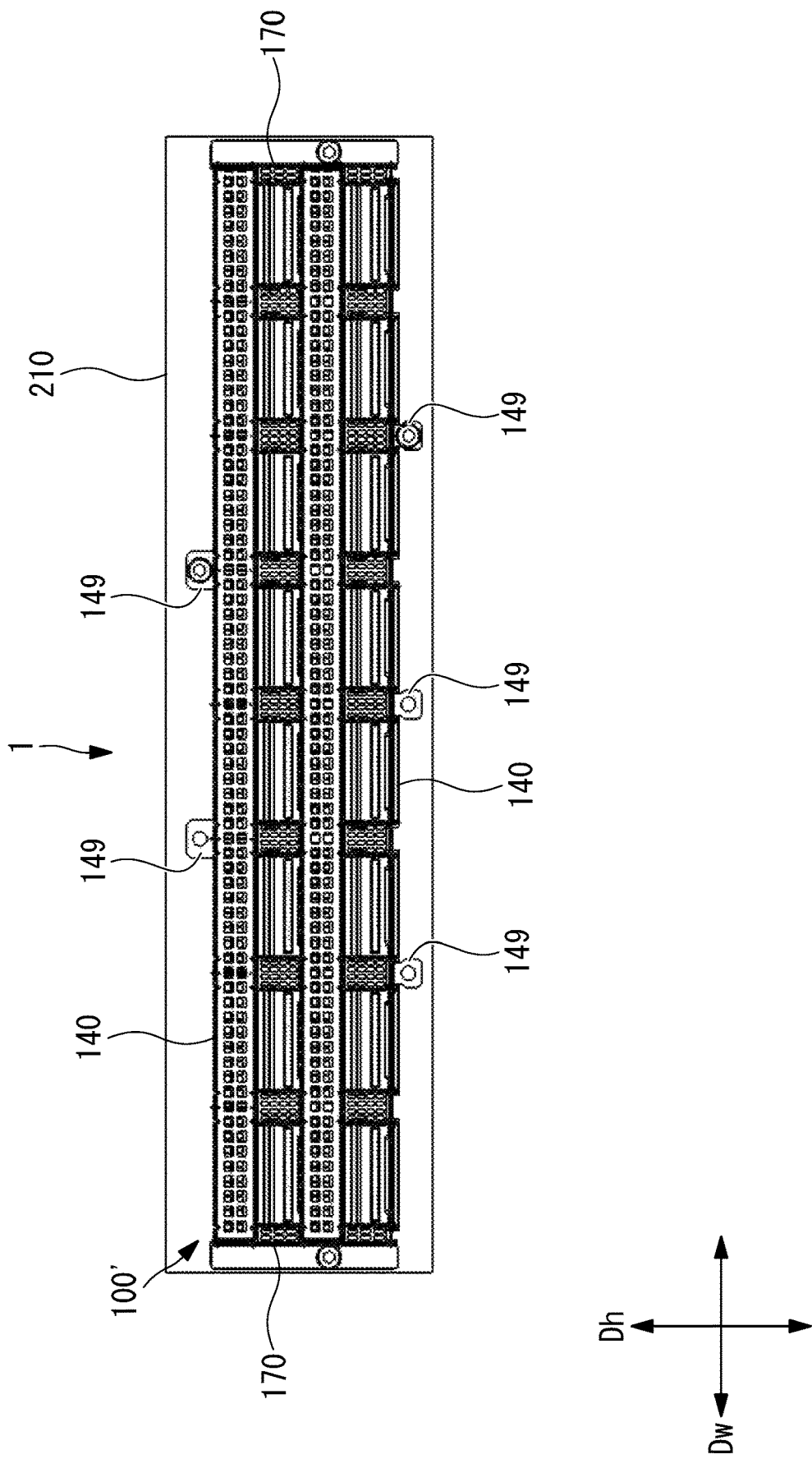

CAGE ASSEMBLY AND RECEPTACLE ASSEMBLY

BACKGROUND

1. Technical Field

The present invention relates to a cage assembly and a receptacle assembly.

2. Description of Related Art

Optical modules for converting electrical signals into optical signals and vice versa (also referred to as an optical transceiver) may be, for example, mounted on a printed wiring board, while housed in a cage, and thus electrically connected to an application specific integrated circuit (ASIC).

An example of a cage that houses an optical module is disclosed in U.S. Patent Publication No. 2022/0087070, Japanese Patent Application Laid-Open No. 2022-548080, and U.S. Pat. No. 10,114,182.

An optical module in driving operation is a heat element, and when power consumption per optical module is 5 W or higher, cooling of the optical module is highly required.

For example, in a case of an optical module compatible with a form factor of QSFP, QSFP-DD, or OSFP-XD, the power consumption per optical module may be 15 W or higher, and cooling of the optical module is more highly required.

One solution to cool an optical module is use of a heat sink. For example, heat sinks are attached to a cage in which an optical module is housed, as disclosed in U.S. Patent Publication No. 2022/0087070 and Japanese Patent Application Laid-Open No. 2022-548080 listed above.

To efficiently cool an optical module, it is required to efficiently cool heat sinks that are in thermal contact with the optical module.

Accordingly, the present invention intends to provide a cage assembly and a receptacle assembly that can efficiently cool at least one of an optical module and a heat sink.

BRIEF SUMMARY

To achieve the object described above, a cage assembly and a receptacle assembly of the present invention employ the following solutions.

A cage assembly according to the first aspect of the present invention is a cage assembly configured to be attached to a first face of an external circuit board and house an external module, the external module is inserted in the cage assembly along a first direction that is substantially orthogonal to the first face, and when a direction orthogonal to the first direction is defined as a second direction, and when a direction orthogonal to the first direction and the second direction is defined as a third direction, the cage assembly includes: a cage configured to house the external module; and a heat sink configured to thermally contact with the external module. The cage has a port wall defining a port in which the external module is housed, a first adjacent wall defining a first adjacent space that is adjacent to the port in the second direction, and a second adjacent wall defining a second adjacent space that is adjacent to the port in the third direction and in which the external module is not housed, and the heat sink is housed in the first adjacent space.

According to the cage assembly of the present aspect, since cooling air flows into the second adjacent space, cooling of the external module can be facilitated compared to a case where no second adjacent space is provided.

Further, since the second adjacent space is provided and thereby external modules are spaced apart from each other in the width direction, heat dissipation from the external module can be facilitated. If the external modules are excessively close to each other in the width direction, heat generated from the external modules is easily retained.

In the cage assembly according to the second aspect of the present invention dependent on the first aspect, the first adjacent space is larger than the port in the third direction.

According to the cage assembly of the present aspect, the dimension in the width direction of the heat sink housed in the first adjacent space can be larger than the dimension in the width direction of the external module housed in the port.

This can improve the cooling efficiency when the heat sink cools the external module.

In the cage assembly according to the third aspect of the present invention dependent on the first aspect or the second aspect, at least any one of the port wall, the first adjacent wall, and the second adjacent wall has a plurality of holes.

According to the cage assembly of the present aspect, cooling air that has flown into the first adjacent space and the second adjacent space easily flows out of the first adjacent space and the second adjacent space through the plurality of holes, and thereby the cooling air can smoothly flow.

This improves cooling efficiency.

In the cage assembly according to the fourth aspect of the present invention dependent on the third aspect, the plurality of holes are arranged in a region close to the external circuit board.

According to the cage assembly of the present aspect, cooling air that has flown into the first adjacent space and the second adjacent space from front of the cage easily flows out of the rear parts of the first adjacent space and the second adjacent space through the plurality of holes, and thereby the cooling air can smoothly flow.

This improves cooling efficiency.

The cage assembly according to the fifth aspect of the present invention dependent on any one of the first aspect to the fourth aspect, includes: a first shield member; and a second shield member, the first adjacent space has a first opening on the opposite side from the external circuit board, the second adjacent space has a second opening on the opposite side from the external circuit board, the first shield member covers the first opening, the second shield member covers the second opening, the first shield member has a plurality of holes, the plurality of holes are arranged in only a portion of the first shield member, the portion covering the first opening, the second shield member has a plurality of holes, and the plurality of holes are arranged in only a portion of the second shield member, the portion covering the second opening.

According to the cage assembly of the present aspect, cooling air can be guided to the first adjacent space and the second adjacent space while leakage of noise is prevented.

The cage assembly according to the sixth aspect of the present invention dependent on any one of the first aspect to the fifth aspect, includes a heat dissipation material provided on a face of the heat sink facing the external module.

According to the cage assembly of the present aspect, thermal coupling force between the external module and the heat sink can be improved, and thereby cooling efficiency when the heat sink cools the external module can be improved.

In the cage assembly according to the seventh aspect of the present invention dependent on any one of the first aspect to the sixth aspect, the port wall has a latch part configured to latch the external module, and the second adjacent wall has a hole through which the latch part is visible in the third direction.

According to the cage assembly of the present aspect, it is possible to visually check the lock state (whether or not locking is completed) in the latch part.

In the cage assembly according to the eighth aspect of the present invention dependent on the seventh aspect, the second adjacent wall having the hole is arranged only both sides in the third direction.

According to the cage assembly of the present aspect, it is possible to visually check the lock state (whether or not locking is completed) in the latch part on both sides in the third direction.

In the cage assembly according to the ninth aspect of the present invention dependent on any one of the first aspect to the eighth aspect, the external module is a module connected to an external connector mounted on the external circuit board, and the port wall has a first cutout formed in an edge facing the external circuit board such that the first cutout is apart from the external circuit board and is adapted to the shape of the external connector.

According to the cage assembly of the present aspect, avoidance of a part of the connector is made possible without requiring the plate forming the port wall to be bent in a complex manner.

Further, the external module can be mounted at a high density while the size of the first adjacent space is maintained, and this can make the cage assembly compact.

The cage assembly according to the tenth aspect of the present invention dependent on any one of the first aspect to the ninth aspect, includes a protective plate arranged between the heat sink and the first adjacent wall, the first adjacent wall has a pressing part, and the pressing part extends from the first adjacent wall toward the protective plate and presses the heat sink against the port by being in contact with the protective plate.

According to the cage assembly of the present aspect, the heat sink can be in close contact with the external module housed in the port.

Further, because of the presence of the protective plate, the heat sink is less likely to be deformed.

The cage assembly according to the eleventh aspect of the present invention dependent on any one of the first aspect to the ninth aspect, includes a protective plate arranged between the heat sink and the first adjacent wall, the protective plate has a pushing part, and the pushing part extends from the protective plate toward the first adjacent wall and pushes the heat sink against the port by being in contact with the first adjacent wall.

According to the cage assembly of the present aspect, the heat sink can be in close contact with the external module housed in the port.

Further, because of the presence of the protective plate, the heat sink is less likely to be deformed.

In the cage assembly according to the twelfth aspect of the present invention dependent on the tenth aspect, the first adjacent wall has two second-direction plates extending in the second direction and facing each other in the third direction and two third-direction plates extending in the third direction and facing each other in the second direction, the first adjacent wall is configured with the two second-direction plates being arranged between the two third-direction plates and being latched to the third-direction plates by a latch part, and the pressing part is located in the third-direction plates near the latch part.

According to the cage assembly of the present aspect, it is easier for the latch part to bear the counterforce applied from the pressing part, which reduces deflection of the third-direction plate.

In the cage assembly according to the thirteenth aspect of the present invention dependent on the tenth aspect, the heat sink has a protruding part contacted with the external module on a bottom face of the heat sink, the first adjacent wall has two third-direction plates extending in the third direction and facing each other in the second direction, one of the third-direction plates which is in contact with the bottom face of the heat sink has a through-part that the protruding part of the heat sink enters, and another one of the third-direction plates which is not in contact with the bottom face of the heat sink has the pressing part.

According to the cage assembly of the present aspect, the protruding part of the heat sink can be in close contact with the external module housed in the port.

In the cage assembly according to the fourteenth aspect of the present invention dependent on the eleventh aspect, the heat sink has a protruding part contacted with the external module on a bottom face of the heat sink, the first adjacent wall has two third-direction plates extending in the third direction and facing each other in the second direction, one of the third-direction plates which is in contact with the bottom face of the heat sink has a through-part that the protruding part of the heat sink enters, and another one of the third-direction plates which is not in contact with the bottom face of the heat sink faces the protective plate and is in contact with the pushing part of the protective plate.

According to the cage assembly of the present aspect, the protruding part of the heat sink can be in close contact with the external module housed in the port.

In the cage assembly according to the fifteenth aspect of the present invention dependent on any one of the first aspect to the fourteenth aspect, the first adjacent wall has two third-direction plates extending in the third direction and facing each other in the second direction, and one of the third-direction plates which is not in contact with the bottom face of the heat sink has a second cutout in an edge facing the external circuit board, the second cutout being formed so as to be apart from the external circuit board.

According to the cage assembly of the present aspect, air that has passed through the heat sink can be smoothly guided to outside of the first adjacent space.

A receptacle assembly according to the sixteenth aspect of the present invention includes: the cage assembly according to any one of the first aspect to the fifteenth aspect; a circuit board as the external circuit board; and a connector mounted on the first face of the circuit board, the circuit board has a circuit board through-opening penetrating in the first direction, and the circuit board through-opening overlaps the first adjacent space when viewed in the first direction.

According to the receptacle assembly of the present aspect, air that has passed through the heat sink can be smoothly guided to outside of the receptacle assembly.

In the receptacle assembly according to the seventeenth aspect of the present invention dependent on the sixteenth aspect, the external module has a module board inserted into the connector and a protective wall configured to protect the module board, and the connector has a recess adapted to the shape of the protective wall.

According to the receptacle assembly of the present aspect, it is possible to prevent the connector from interfering with the protective wall when the external module has been inserted into the connector.

The receptacle assembly according to the eighteenth aspect of the present invention dependent on the sixteenth aspect or the seventeenth aspect, includes a backplate provided on the second face that is the backside of the first face of the circuit board, and the backplate is in close contact with the second face.

According to the receptacle assembly of the present aspect, it is possible to prevent deformation of the circuit board due to insertion/extraction of the external module.

The receptacle assembly according to the nineteenth aspect of the present invention dependent on the sixteenth aspect or the seventeenth aspect, includes a backplate provided on the second face that is the backside of the first face of the circuit board, an electronic component is mounted on the second face of the circuit board, the backplate has a fixing part to which a fastening member for fixing to the circuit board is attached, and the fixing part is a portion more protruding toward the circuit board than other portions and is provided at a position not interfering with the electronic component mounted on the second face.

According to the receptacle assembly of the present aspect, even when the electronic component has been mounted on the second face of the circuit board, it is possible to prevent deformation of the external circuit board due to insertion/extraction of the external module.

In the receptacle assembly according to the twentieth aspect of the present invention dependent on the first aspect, the backplate has a protrusion contacted with the second face, and the protrusion is a portion protruding toward the circuit board by approximately the same degree as the fixing part and is provided at a position not interfering with the electronic component mounted on the second face.

According to the receptacle assembly of the present aspect, even when the electronic component has been mounted on the second face of the circuit board, it is possible to prevent deformation of the external circuit board due to insertion of the external module.

The receptacle assembly according to the 21th aspect of the present invention dependent on any one of the sixteenth aspect to the twentieth aspect, includes a second heat sink that is in thermal contact with the heat sink, and the second heat sink protrudes from the second face that is the backside of the first face of the circuit board that is in thermal contact with the heat sink.

According to the receptacle assembly of the present aspect, the cooling efficiency when the heat sink cools the external module can be improved.

The receptacle assembly according to the 22th aspect of the present invention dependent on the 21th aspect, includes a heat pipe connecting the heat sink and the second heat sink to each other.

According to the receptacle assembly of the present aspect, heat transfer between the heat sink and the second heat sink is made possible.

The receptacle assembly according to the 23th aspect of the present invention dependent on any one of the 16th aspect to the 22th aspect, includes a nozzle defining a throat flow path, and the throat flow path is a flow path to guide air flowing out of the circuit board through-opening to outside and is configured such that the flow path area gradually increases along the first direction.

According to the receptacle assembly of the present aspect, smooth discharge of air can be facilitated, and the cooling efficiency when the heat sink cools the external module can be improved.

In the receptacle assembly according to the 24th aspect of the present invention dependent on the eighteenth aspect, the backplate has a plate through-opening penetrating in the first direction, and the circuit board through-opening and the plate through-opening overlap each other when viewed in the first direction.

According to the receptacle assembly of the present aspect, air that has passed through the heat sink can be smoothly guided to outside of the receptacle assembly.

In the receptacle assembly according to the 25th aspect of the present invention dependent on the nineteenth aspect, the backplate has a plate through-opening penetrating in the first direction, and the circuit board through-opening and the plate through-opening overlap each other when viewed in the first direction.

According to the receptacle assembly of the present aspect, air that has passed through the heat sink can be smoothly guided to outside of the receptacle assembly.

BRIEF DESCRIPTION OF THE SEVERAL VIEWS OF THE DRAWINGS

FIG. 1 is a front perspective view of a receptacle assembly in which an optical module is housed.

FIG. 3 is a sectional view taken along a cut line III-III illustrated in FIG. 1.

FIG. 8 is a sectional view taken along a cut line VIII-VIII illustrated in FIG. 5.

FIG. 15 is a top perspective view of a heat sink.

FIG. 16 is a bottom perspective view of the heat sink.

FIG. 18 is a front view of the cage assembly.

FIG. 20 is a partial front perspective view of the cage assembly.

FIG. 27 is a partial front perspective view of the cage assembly.

FIG. 29 is a perspective view of a connector.

FIG. 36 is a side view of FIG. 35.

FIG. 38 is a front perspective view of the backplate.

FIG. 39 is a side view of FIG. 37.

FIG. 40 is a front perspective view of the backplate having fixing parts.

FIG. 41 is a side view of the cage assembly.

FIG. 42 is a front perspective view of the backplate having fixing parts and protrusions.

FIG. 43 is a rear perspective view of the cage assembly provided with a single second heat sink.

FIG. 45 is a top perspective view of the heat sink and the second heat sink.

FIG. 46 is a bottom perspective view of the heat sink and the second heat sink.

FIG. 47 is a rear perspective view of the cage assembly.

FIG. 48 is a rear perspective view of the cage assembly provided with nozzles.

FIG. 49 is a front perspective view of a nozzle.

FIG. 50 is a rear perspective view of the nozzle.

FIG. 54 is a front view of the receptacle assembly according to the modified example.

DETAILED DESCRIPTION

Figure 2:
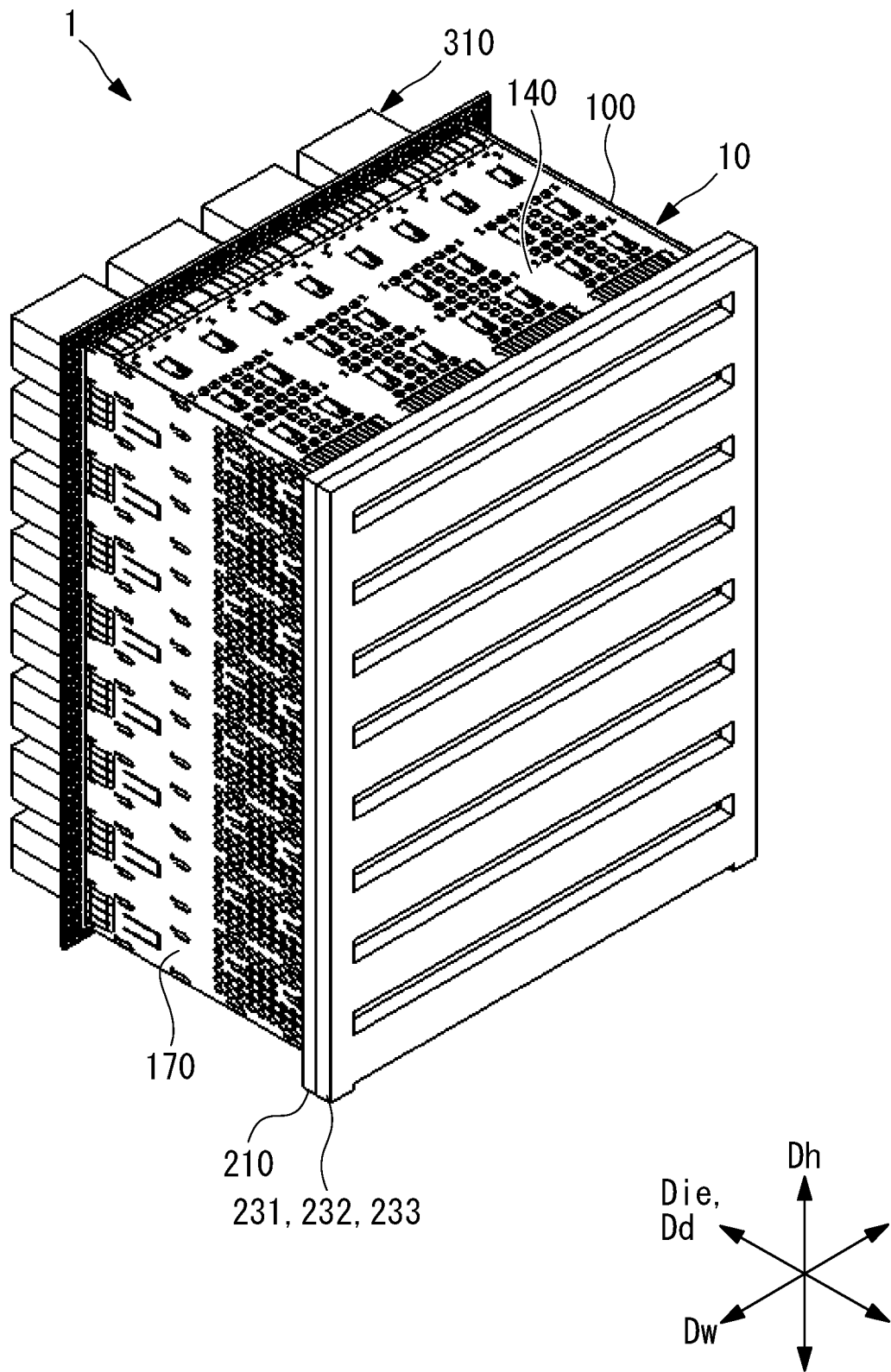
FIG. 2 is a rear perspective view of the receptacle assembly in which the optical module is housed.

A cage assembly and a receptacle assembly according to one embodiment of the present invention will be described below with reference to the drawings.

Note that an insertion-extraction direction Die, a depth direction Dd, a width direction Dw, and a height direction Dh used in the following description are intended to assist in understanding the description and not intended to limit actual postures or positions.

Further, when a direction in which an optical module is inserted/extracted is defined as the insertion-extraction direction Die, the depth direction Dd (first direction) matches the insertion-extraction direction Die, the height direction Dh (second direction) is orthogonal to the depth direction Dd, and the width direction Dw (third direction) is orthogonal to the depth direction Dd and the height direction Dh.

Further, in a cage assembly and each component or each element forming the cage assembly, a portion/part, an end, an edge, and a face which are close to a circuit board are referred to as "rear part", "rear end", "rear edge", and "rear/rear face", respectively, and a portion/part, an end, an edge, and a face which are far from the circuit board are referred to as "front part", "front end", "front edge", and "front/front face", respectively.

Overview of Receptacle Assembly

As illustrated in FIG. 1 to FIG. 4, a receptacle assembly 1 is a device to which optical modules 310 (external modules) are connected.

The receptacle assembly 1 includes a cage assembly 10, a circuit board 210 (external circuit board), and a plurality of connectors 220.

The receptacle assembly 1 is configured by the cage assembly 10 being attached to the circuit board 210 on which the plurality of connectors 220 are mounted.

In this state, the circuit board 210 has a first face 211 and a second face 212 corresponding to the backside of the first face 211, and the connectors 220 and the cage assembly 10 are located in a region in contact with the first face 211.

On the circuit board 210, an ASIC (not illustrated) is mounted. The ASIC is located in a region in contact with the second face 212.

Optical modules 310 are electrically connected to the connectors 220. Specifically, a module board 312 of each of the optical modules 310 is inserted into the connector 220 along the insertion-extraction direction Die and comes into contact with a plurality of terminals (contact pins) of the connector 220. Accordingly, the optical module 310 is electrically connected to the ASIC via the connector 220 and the circuit board 210.

The receptacle assembly 1 is supplied with cooling air. The cooling air is generated by a fan device (not illustrated), for example, and brown toward the front face of the receptacle assembly 1.

This cooling air will flow into first adjacent spaces S1 or second adjacent spaces S2 described later.

<<Basic Configuration of Cage Assembly>>

The cage assembly 10 includes a cage 100 and heat sinks 50 housed in the cage 100.

The cage 100 and the heat sinks 50 will be described below in detail.

<<<Cage>>>

The cage 100 is a structure that houses a plurality of optical modules 310 or a plurality of heat sinks 50 and is attached to the first face 211 of the circuit board 210.

As illustrated in FIG. 5 to FIG. 8, the cage 100 has a plurality of ports Sp, a plurality of first adjacent spaces S1, and a plurality of second adjacent spaces S2.

Figure 4:
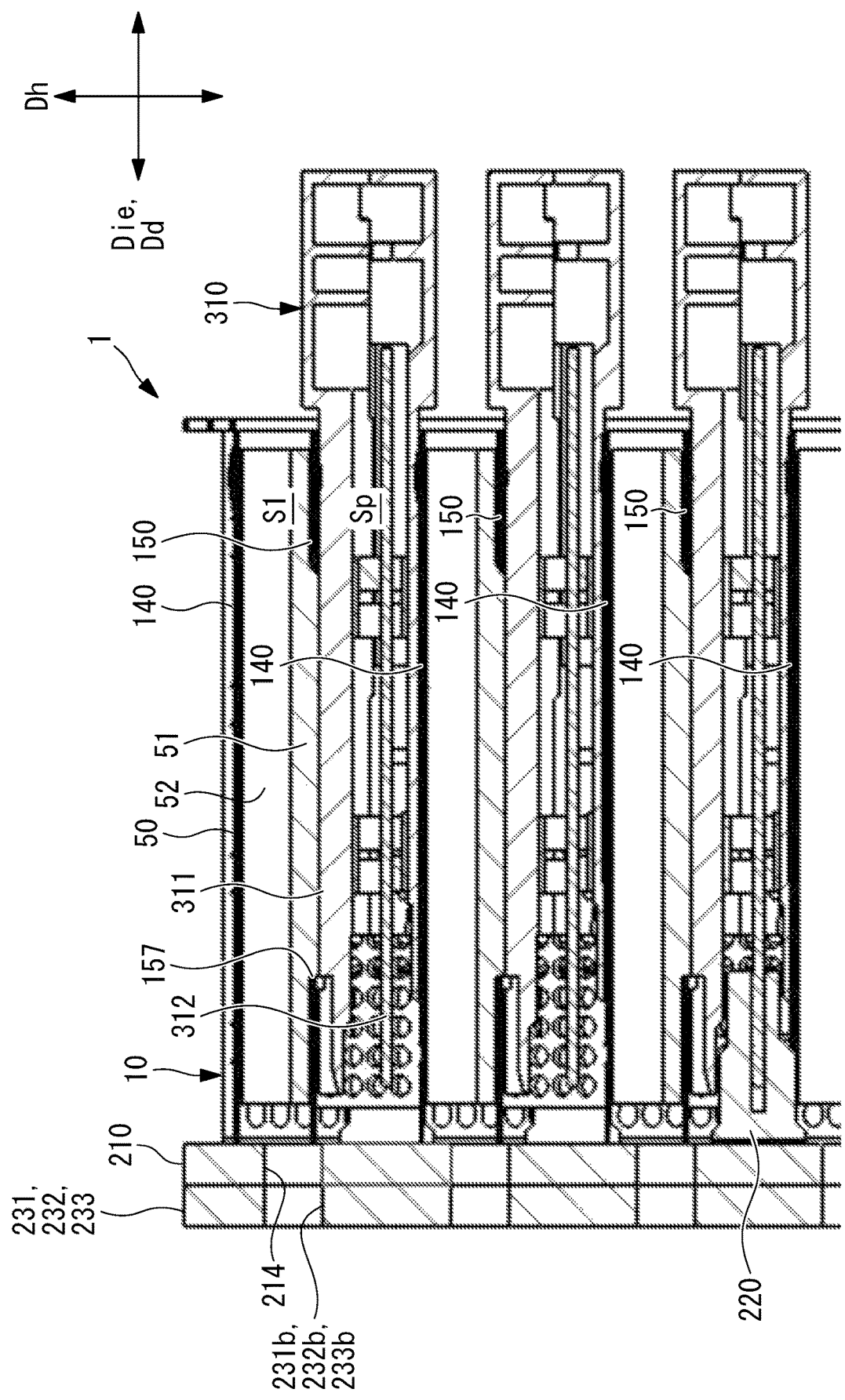
FIG. 4 is a partial enlarged view of FIG. 3.
Figure 5:
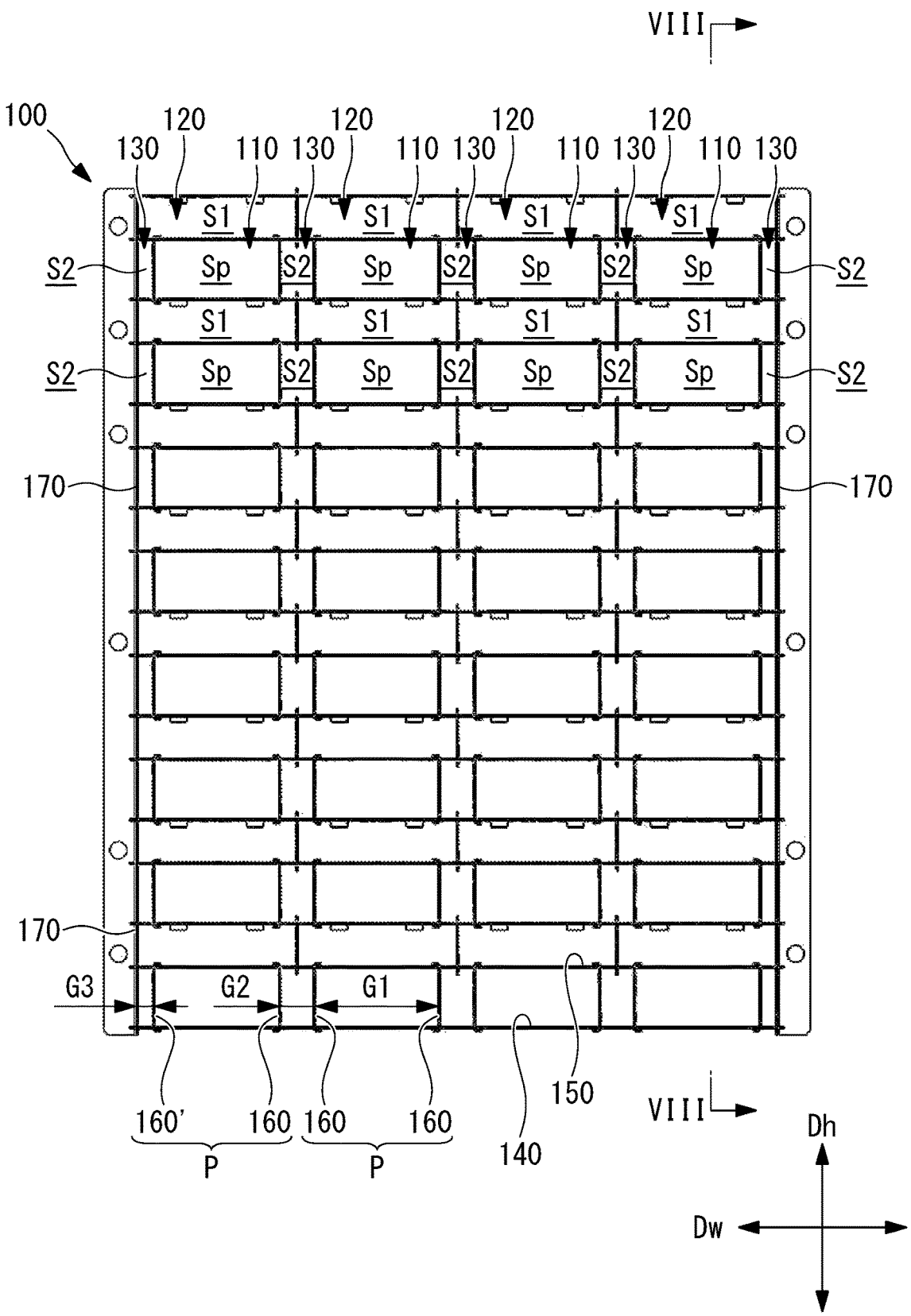
FIG. 5 is a front view of a cage.
Figure 7:
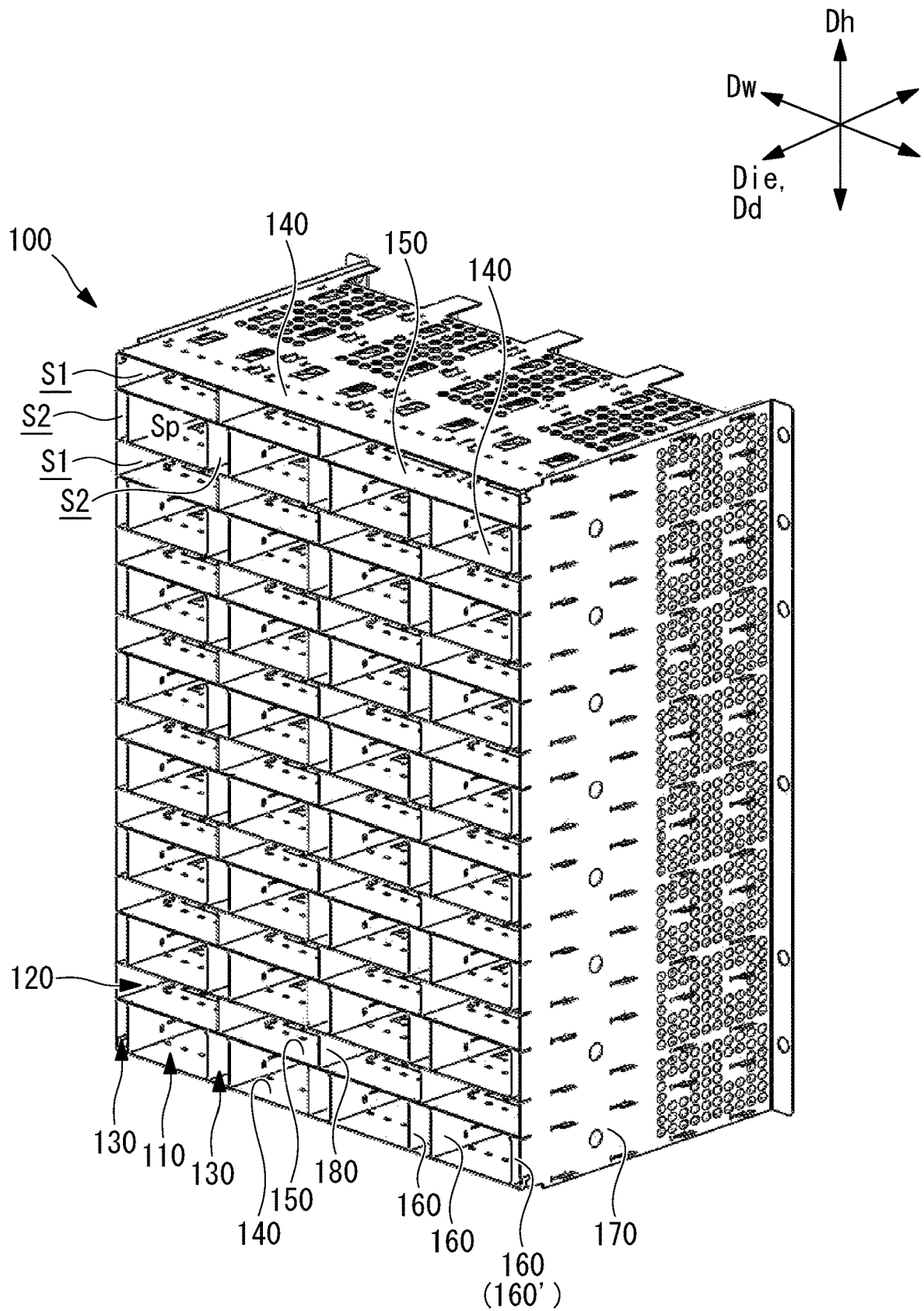
FIG. 7 is a front perspective view of the cage.

As illustrated in FIG. 5 and FIG. 7, each of the ports Sp is a space in which the optical module 310 is housed (see FIG. 1 to FIG. 4), and the port Sp is defined by a port wall 110 including four walls of top, bottom, left, and right walls.

The shape of the port wall 110 is adapted to the shape of the optical module 310 when viewed from front in the depth direction Dd.

Figure 9:
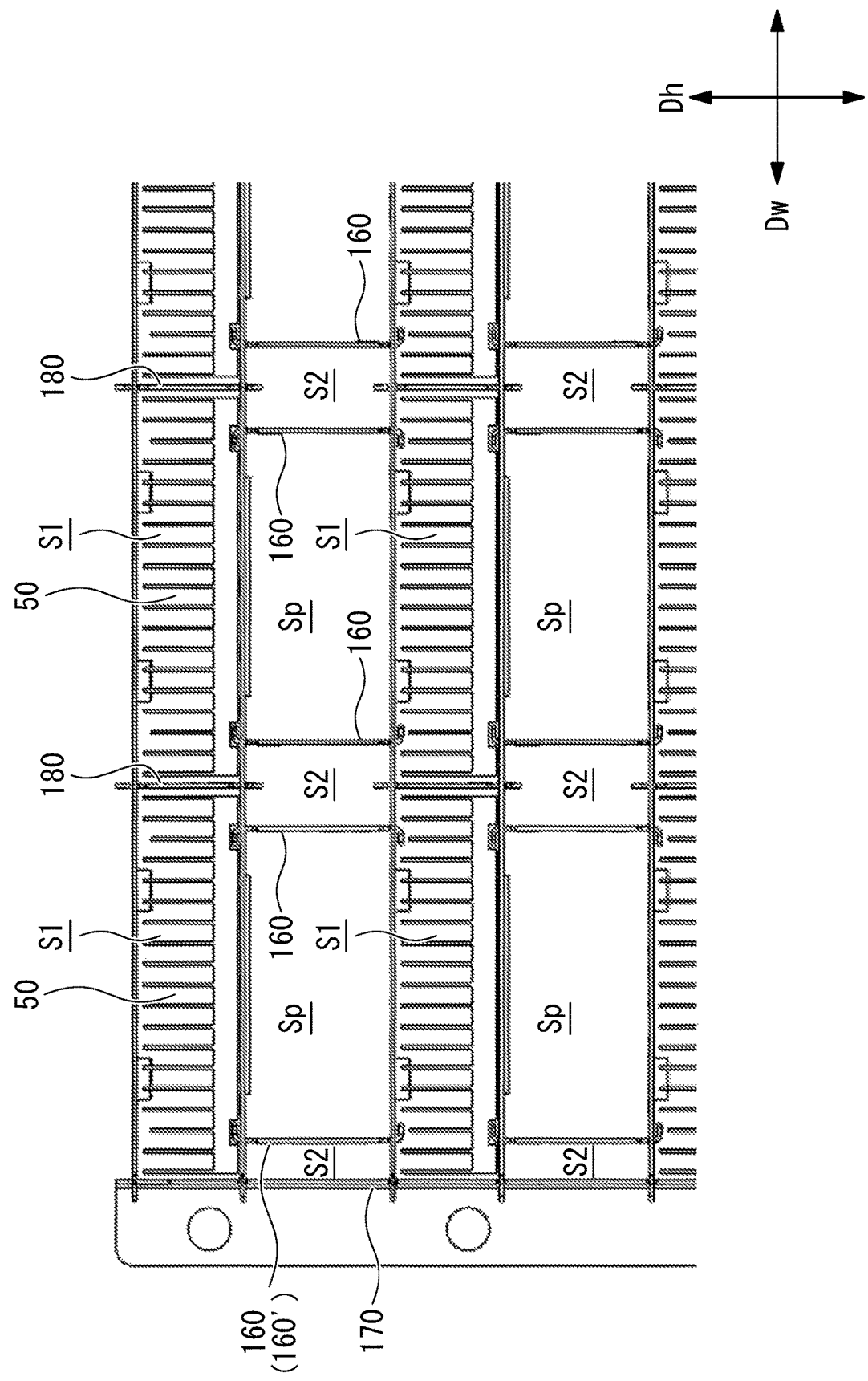
FIG. 9 is a partial front view of a cage assembly (shield members omitted)
Figure 10:
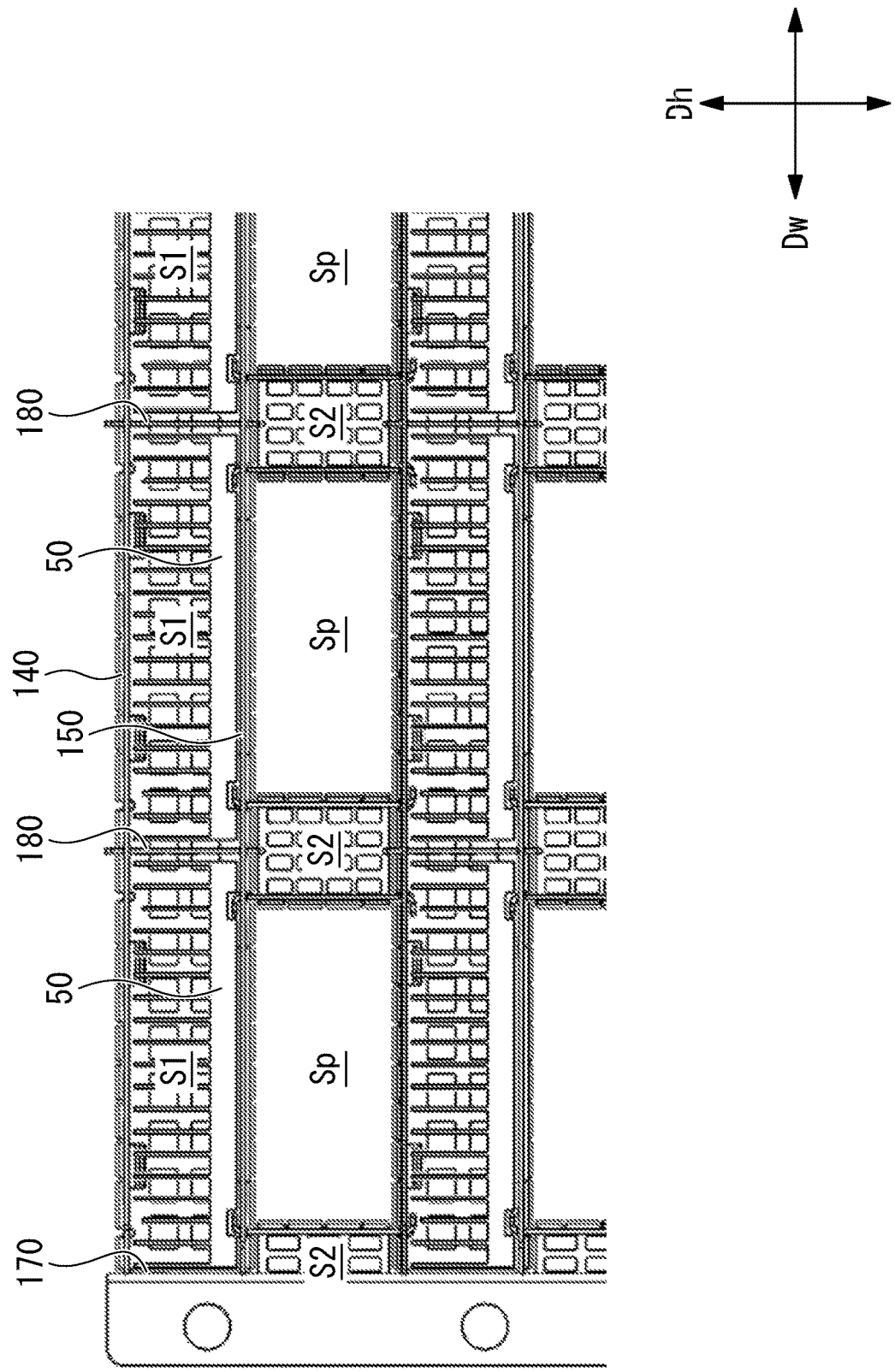
FIG. 10 is a partial rear view of the cage assembly.

As illustrated in FIG. 5 and FIG. 7, each of the first adjacent spaces S1 is a space in which the heat sink 50 is housed (see FIG. 4, FIG. 9, and FIG. 10), and the first adjacent space S1 is defined by a first adjacent wall 120 including four walls of top, bottom, left, and right walls.

The shape of the first adjacent space S1 is adapted to the shape of the heat sink 50 when viewed from front in the depth direction Dd.

The dimension in the width direction Dw of the first adjacent space S1 is larger than the dimension in the width direction Dw of the port Sp.

The first adjacent space S1 without the heat sink 50 being housed is a mere vacant space and is not provided with any member for suitably directing the cooling air (for example, a fin or a plate). Because the first adjacent space S1 is provided as a mere vacant space, it is possible to easily define the first adjacent space S1 by a combination of plates described later.

As illustrated in FIG. 5 and FIG. 7, each of the second adjacent spaces S2 is a space in which no device or component such as the optical module 310 or the heat sink 50 is housed, and the second adjacent space S2 is defined by a second adjacent wall 130 including four walls of top, bottom, left, and right walls.

The second adjacent space S2 has a rectangular shape when viewed from front in the depth direction Dd. However, the dimension in the width direction Dw of "some second adjacent spaces S2", among the plurality of the second adjacent spaces S2, located on both sides in the width direction Dw of the cage 100 is smaller than (approximately a half) the dimension in the width direction Dw of the remaining second adjacent spaces S2. In the case of FIG. 5, eight of these "some second adjacent spaces S2" are present on the left side and another eight of the same are present on the right side along the height direction Dh.

The ports Sp, the first adjacent spaces S1, and the second adjacent spaces S2 configured as described above are arranged in the following positional relationship with respect to the port Sp as a reference.

Figure 6:
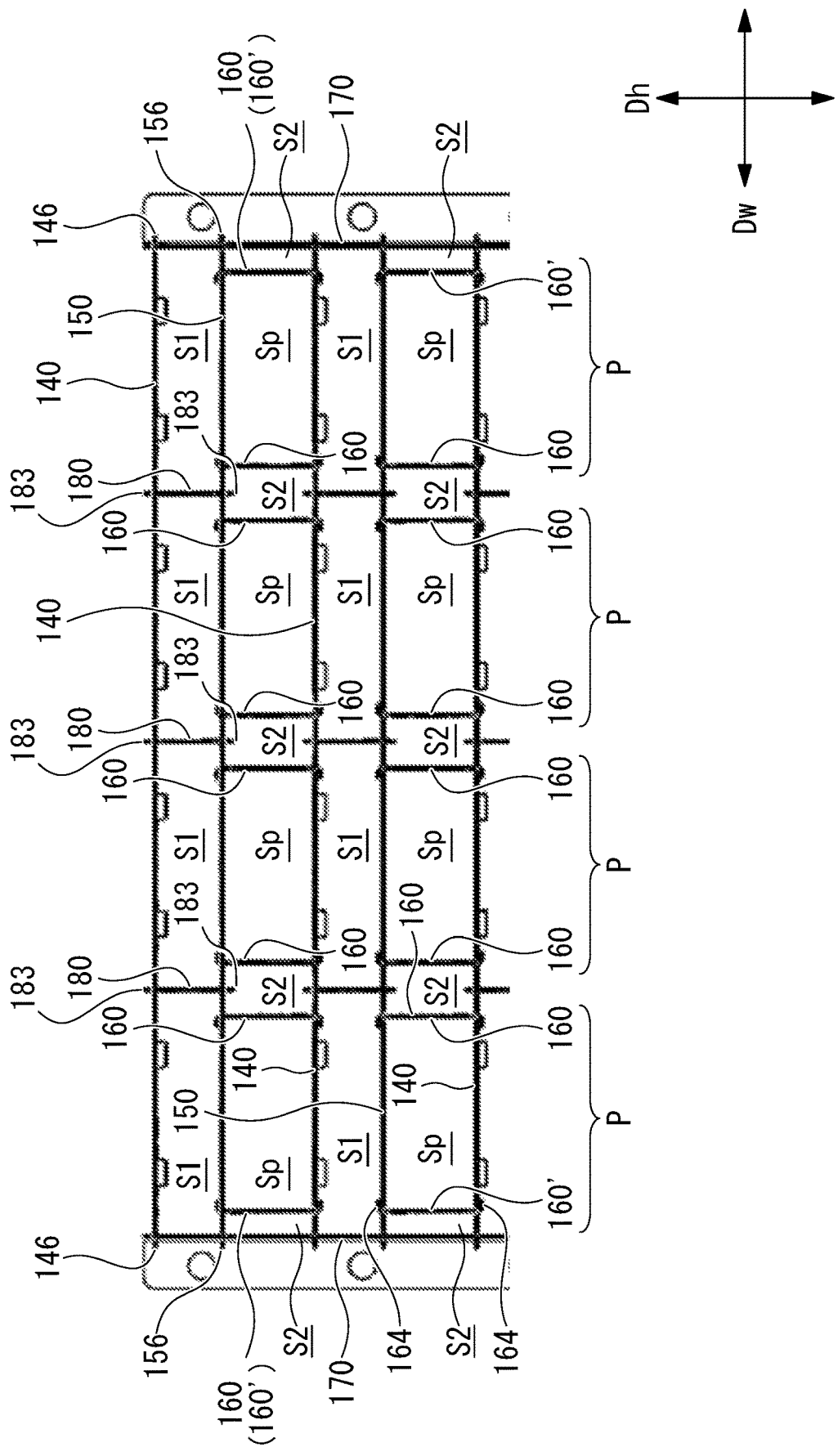
FIG. 6 is a partial enlarged view of FIG. 5.

As illustrated in FIG. 5 and FIG. 6, the first adjacent spaces S1 are adjacent to the ports Sp in the height direction Dh. Specifically, the first adjacent spaces S1 are arranged adjacent to (adjacent to the top of) the ports Sp in the height direction Dh.

Each second adjacent spaces S2 is adjacent to the ports Sp in the width direction Dw. Specifically, the second adjacent spaces S2 are arranged adjacent on both sides (adjacent to the right and left) of the port Sp in the width direction Dw. However, one port Sp and another port Sp adjacent thereto in the width direction Dw share a single second adjacent space S2 therebetween. Thus, the second adjacent space S2 adjacent to the right of one port Sp is also the second adjacent space S2 adjacent to the left of the other port Sp.

Further, the first adjacent spaces S1 are adjacent to the second adjacent spaces S2 in the height direction Dh. Specifically, the first adjacent spaces S1 are arranged adjacent to (adjacent to the top of) the second adjacent spaces S2 in the height direction Dh.

As illustrated in FIG. 6 to FIG. 8, the port walls 110, the first adjacent walls 120, and the second adjacent walls 130, which define the ports Sp, the first adjacent spaces S1, and the second adjacent spaces S2 arranged as described above, are formed of multiple types of plates.

Herein, the multiple types of plates include a plurality of top plates 140 (third-direction plates), a plurality of bottom plates 150 (third-direction plates), a plurality of partition plates 160 (second-direction plates), two side plates 170 (second-direction plates), and a plurality of second partition plates 180 (second-direction plates).

Each of the top plates 140 is a metal plate material expanding in the width direction Dw and the depth direction Dd and having a thickness in the height direction Dh.

Figure 11:
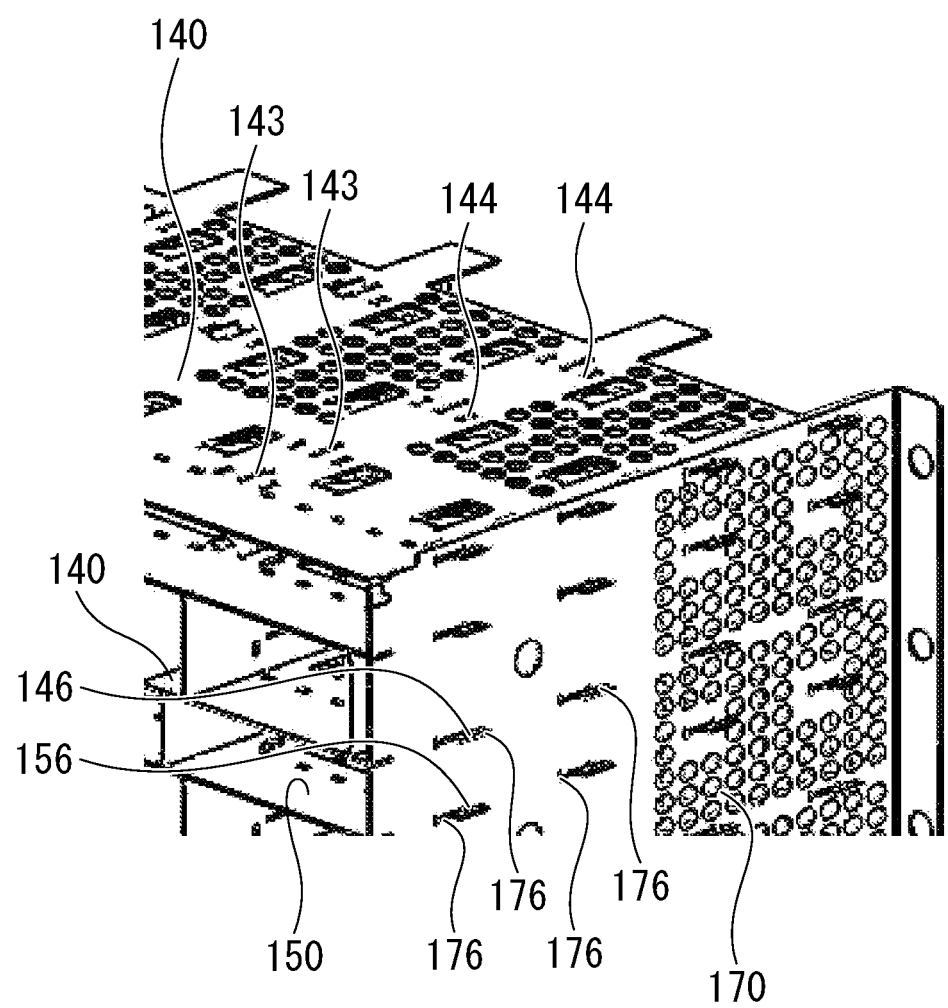
FIG. 11 is a partial enlarged view of FIG. 7.

The edge in the width direction Dw of the top plate 140 (that is, the edge along the depth direction Dd) is provided with a plurality of hooks 146 in the depth direction Dd. As illustrated in FIG. 11, the hooks 146 hang in a plurality of slits 176 provided in the side plate 170 along the depth direction Dd, and thereby the top plate 140 is latched to the side plate 170.

As illustrated in FIG. 6 to FIG. 8, each of the bottom plates 150 is a metal plate material expanding in the width direction Dw and the depth direction Dd and having a thickness in the height direction Dh.

The edge in the width direction Dw of the bottom plate 150 (that is, the edge along the depth direction Dd) is provided with a plurality of hooks 156 in the depth direction Dd. As illustrated in FIG. 11, the hooks 156 hang in a plurality of slits 176 provided in the side plate 170 along the depth direction Dd, and thereby the bottom plate 150 is latched to the side plate 170.

The top plates 140 and the bottom plates 150 as described above are arranged alternatingly spaced apart from each other in the order of the top plate 140, the bottom plate 150, the top plate 140, the bottom plate 150, . . . , the top plate 140 from above in the height direction Dh.

Each of the partition plates 160 is a metal plate material expanding in the height direction Dh and the depth direction Dd and having a thickness in the width direction Dw.

Figure 12:
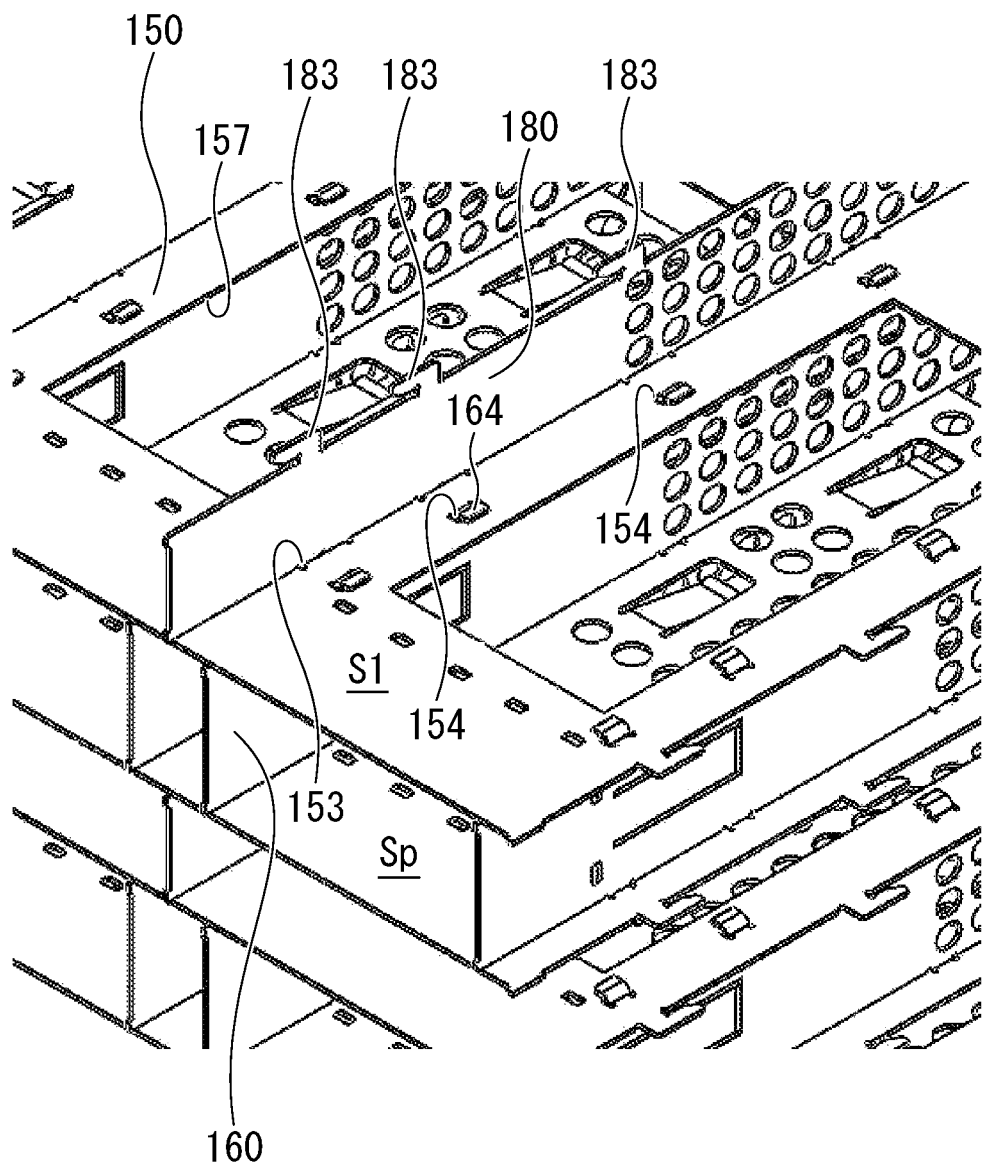
FIG. 12 is a partial front perspective view of the cage (some top plates omitted)

As illustrated in FIG. 11 and FIG. 12, the edge in the height direction Dh of the partition plate 160 (that is, the edge along the depth direction Dd) is provided with a plurality of latch claws 164 along the depth direction Dd. The latch claws 164 are inserted into a plurality of slits 144 provided along the depth direction Dd in the top plate 140 and a plurality of slits 154 provided along the depth direction Dd in the bottom plate 150 and then bent, and thereby the partition plate 160 is latched to the top plate 140 and the bottom plate 150.

As illustrated in FIG. 5 to FIG. 8, each of the side plates 170 is a metal plate material expanding in the height direction Dh and the depth direction Dd and having a thickness in the width direction Dw.

A flange 179 expanding in the width direction Dw is provided along the height direction Dh to the rear end of the side plate 170. The flange 179 is used for fixing the cage 100 to the circuit board 210. Specifically, fastening members such as bolts or screws are inserted through a plurality of holes provided in the flange 179, the inserted fastening members are threaded in backplates 231, 232, 233 (described later) in contact with the circuit board 210 or the second face 212 of the circuit board 210, and thereby the cage 100 is fixed to the circuit board 210. Note that it is not necessarily required to insert fastening members such as bolts or screws through all the holes provided in the flange 179, and the number of holes to be used can be changed as appropriate in accordance with a specification.

Each of the second partition plates 180 is a metal plate material expanding in the height direction Dh and the depth direction Dd and having a thickness in the width direction Dw.

Figure 13:
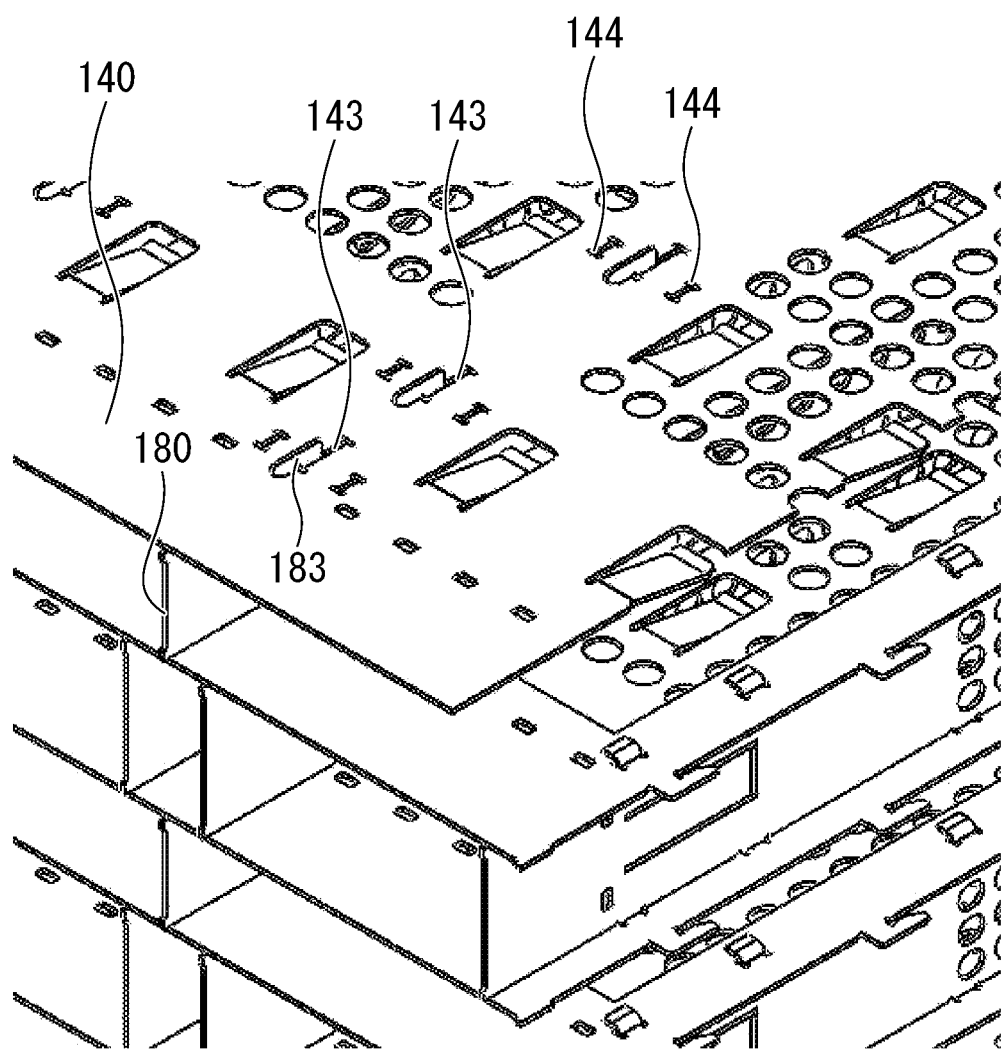
FIG. 13 is a partial front perspective view of the cage.

As illustrated in FIG. 12 and FIG. 13, the edge in the height direction Dh of the second partition plate 180 (that is, the edge along the depth direction Dd) is provided with a plurality of hooks 183 along the depth direction Dd. The hooks 183 are hung in a plurality of slits 143 provided along the depth direction Dd in the top plate 140 and a plurality of slits 153 provided along the depth direction Dd in the bottom plate 150, and thereby the second partition plate 180 is latched to the top plate 140 and the bottom plate 150.

The partition plates 160, the side plates 170, and the second partition plates 180 as described above are arranged as follows to a set of the top plates 140 and the bottom plates 150 that are regularly arranged.

As illustrated in FIG. 5 to FIG. 7, the two side plates 170 are arranged on both sides in the width direction Dw of the set of the top plates 140 and the bottom plates 150 arranged in the height direction Dh.

One of the side plates 170 spans the entire region in the height direction Dh of the set of the top plates 140 and the bottom plates 150.

The plurality of partition plates 160 are arranged between the underside of the bottom plate 150 and the top side of the top plate 140 facing that bottom plate 150 in the height direction Dh.

The plurality of partition plates 160 (eight plates per level in FIG. 6) are arranged spaced apart from each other in the width direction Dw. Specifically, pairs P (four pairs per level in FIG. 6) each formed of two partition plates 160 arranged with a first gap G1 in the width direction Dw are arranged at an equal pitch in the width direction Dw. In this state, a second gap G2 is present between one pair P and another pair P adjacent thereto in the width direction Dw. Further, two partition plates 160, among the eight partition plates 160, present on both sides in the width direction Dw (hereafter, reference 160' is used when distinguished from the remaining) are arranged with a third gap G3 from the side plate 170. The third gap G3 is approximately a half of the second gap G2.

The plurality of second partition plates 180 are arranged between the underside of the top plate 140 and the top side of the bottom plate 150 facing that top plate 140 in the height direction Dh.

The plurality of second partition plates 180 (three plates per level in FIG. 6) are arranged spaced apart from each other in the width direction Dw. Specifically, the second partition plates 180 are arranged at an equal pitch in the width direction Dw. In this state, each of the second partition plates 180 is located at substantially the center in the width direction Dw between paired partition plates 160.

As illustrated in FIG. 5 to FIG. 7, the plurality of top plates 140, the plurality of bottom plates 150, the plurality of partition plates 160, the two side plates 170, and the plurality of second partition plates 180 combined as described above define four types of spaces.

The first type of the spaces corresponds to spaces each defined between two partition plates 160 forming a pair P and between the underside of the bottom plate 150 and the top side of the top plate 140.

Herein, such spaces are the ports Sp. Four ports Sp are present per level.

The second type of the spaces corresponds to spaces each defined between one second partition plate 180 and another second partition plate 180 adjacent thereto in the width direction Dw and between the underside of the top plate 140 and the top side of the bottom plate 150 and spaces each defined between the side plate 170 and the second partition plate 180 adjacent thereto in the width direction Dw and between the underside of the top plate 140 and the top side of the bottom plate 150.

Herein, such spaces are the first adjacent spaces S1. Four first adjacent spaces S1 are present per level.

The third type of the spaces corresponds to spaces each defined between pairs P of the partition plates 160 (between the ports Sp) and between the underside of the bottom plate 150 and the top side of the top plate 140.

The fourth type of the spaces corresponds to spaces each defined between the side plates 170 and the partition plates 160' adjacent thereto in the width direction Dw and between the underside of the bottom plate 150 and the top side of the top plate 140.

Herein, these two types of the spaces are the second adjacent spaces S2. In short, the spaces obtained by removing the ports Sp from the space defined between the underside of the bottom plate 150, the top side of the top plate 140, and the two side plates 170 are the second adjacent spaces S2. Five second adjacent spaces S2 are present per level.

To summarize the above, in the space defined between the underside of the bottom plate 150, the top side of the top plate 140, and the two side plates 170, four ports Sp and five second adjacent spaces S2 are arranged in the order of the second adjacent space S2, the port Sp, the second adjacent space S2, the port Sp, the second adjacent space S2, the port Sp, the second adjacent space S2, the port Sp, and the second adjacent space S2 along the width direction Dw so as to be adjacent to each other.

Further, in the space defined between the underside of the top plate 140, the top side of the bottom plate 150, and the two side plates 170, four first adjacent spaces S1 are arranged so as to be adjacent to each other along the width direction Dw.

Further, the dimension in the width direction Dw of the first adjacent space S1 is larger than the dimension in the width direction Dw of the port Sp. This is because only four first adjacent spaces S1 are present on the level where the first adjacent spaces S1 are present, while five second adjacent spaces S2 are present in addition to four ports Sp on the level where the ports Sp are present.

As described above, the port wall 110 defining the port Sp includes the bottom plate 150, the top plate 140, and the partition plate 160.

Further, the first adjacent wall 120 defining the first adjacent space S1 includes the top plate 140, the bottom plate 150, and the second partition plate 180 or the side plate 170.

Further, the second adjacent wall 130 defining the second adjacent space S2 includes the bottom plate 150, the top plate 140, and the partition plate 160 or the side plate 170.

Further, the port wall 110 and the first adjacent wall 120 share the bottom plate 150 and the top plate 140.

Further, the port wall 110 and the second adjacent wall 130 share the partition plate 160.

Further, the first adjacent wall 120 and the second adjacent wall 130 share the bottom plate 150 and the top plate 140.

<<<Heat Sink>>>

The heat sinks 50 are components that absorb heat of the optical module 310 when being in thermal contact with the optical module 310 housed in the port Sp and dissipate the heat to the air. This cools the optical module 310.

As illustrated in FIG. 15 and FIG. 16, each of the heat sinks 50 has a base 51 and a plurality of fins 52 erected in the height direction Dh from the base 51.

As illustrated in FIG. 16, a bottom face 51a of the base 51 is provided with a protruding part 51b. The protruding part 51b is a portion located at the center region of the bottom face 51a and protruding from the bottom face 51a in the height direction Dh.

Figure 14:
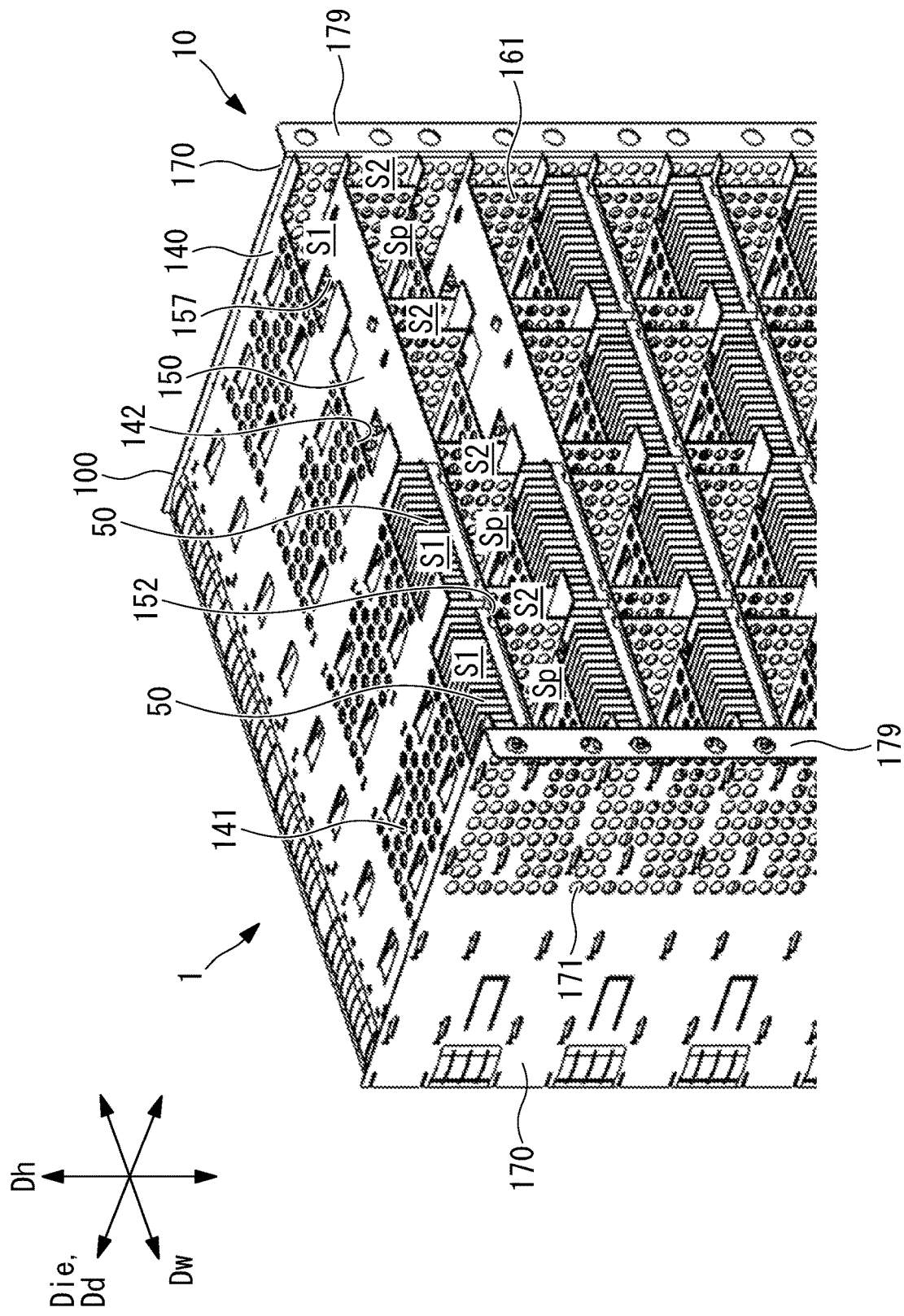
FIG. 14 is a partial rear perspective view of the cage assembly.

As illustrated in FIG. 4, FIG. 12, and FIG. 14, the top side of the bottom plate 150 defining the first adjacent spaces S1 of the cage 100 is a face in contact with the bottom faces 51a of the heat sinks 50 housed in the first adjacent spaces S1. Further, a plurality of through-parts 157 are formed in a single bottom plate 150.

Each of the through-parts 157 is a portion communicating between each first adjacent space S1 and each port Sp adjacent thereto in the height direction Dh.

The plurality of through-parts 157 are arranged spaced apart from each other along the width direction Dw.

As illustrated in FIG. 4, the protruding part 51b of the heat sink 50 housed in the first adjacent space S1 enters the through-part 157. The protruding part 51b that has entered the through-part 157 can reach the port Sp and come into contact with the optical module 310 housed in the port Sp.

<<<Advantageous Effects of Basic Configuration>>>

The cage assembly 10 configured as described above achieves the following advantageous effects.

Since cooling air flows into the second adjacent spaces S2, cooling of the optical modules 310 can be facilitated compared to a case where the second adjacent spaces S2 are not provided.

Further, since the second adjacent spaces S2 are provided and thereby the optical modules 310 are spaced apart from each other in the width direction Dw, heat dissipation from the optical modules 310 can be facilitated. If the optical modules 310 are excessively close to each other in the width direction Dw, heat generated from the optical modules 310 is easily retained.

Further, the dimension in the width direction Dw of the first adjacent space S1 is larger than the dimension in the width direction Dw of the port Sp.

Thus, the dimension in the width direction Dw of the heat sink 50 housed in the first adjacent space S1 can be larger than the dimension in the width direction Dw of the optical module 310 housed in the port Sp. This can improve the cooling efficiency when the heat sink 50 cools the optical module 310.

<<Ventilating Hole>>

Figure 17:
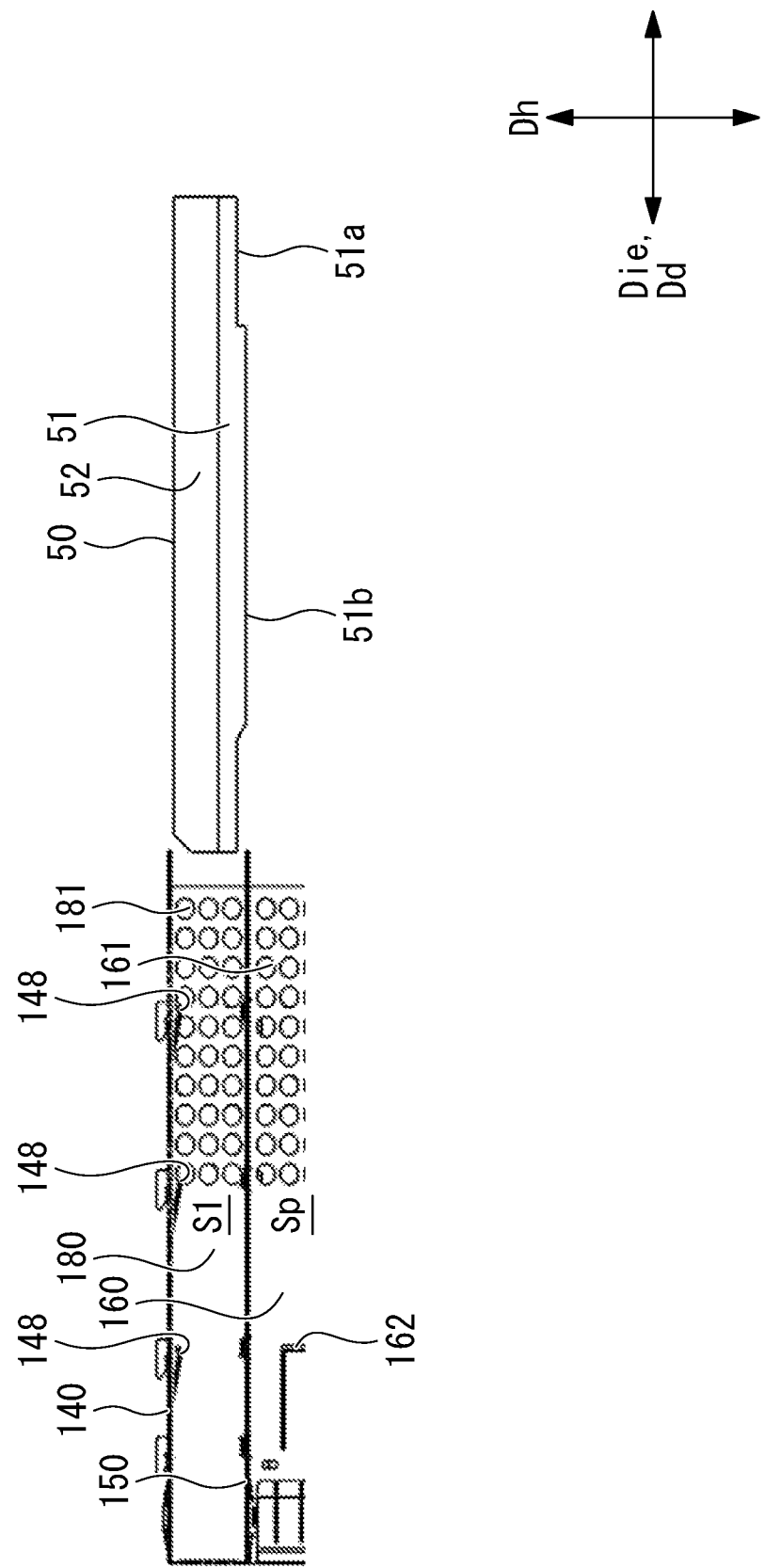
FIG. 17 is a partial sectional view of the cage and a diagram illustrating the heat sink.

As illustrated in FIG. 14 and FIG. 17, a plurality of ventilating holes 141 may be formed in the top plate 140. Further, a plurality of ventilating holes 161 may be formed in the partition plate 160. Further, a plurality of ventilating holes 171 may be formed in the side plate 170. Further, a plurality of ventilating holes 181 may be formed in the second partition plate 180.

The ventilating holes 141, the ventilating holes 161, the ventilating holes 171, and the ventilating holes 181 are through-holes for passing cooling air therethrough.

The ventilating holes 141, the ventilating holes 161, the ventilating holes 171, and the ventilating holes 181 are arranged collectively in a region close to the circuit board 210. The "region close to the circuit board 210" as used herein means that, for example, when the rear end of the cage 100 (the end close to the circuit board 210) is defined as 0% and the front end of the cage 100 (the end in front) is defined as 100%, the region is present in a range between 0% to 70%, preferably 0% to 60%, and more preferably 0% to 50%.

In other words, at least any one of the ventilating holes 141, the ventilating holes 161, the ventilating holes 171, and the ventilating holes 181 may be formed in the regions close to the circuit board 210 of the port wall 110, the first adjacent wall 120, and the second adjacent wall 130.

When at least any one of the ventilating holes 141, the ventilating holes 161, the ventilating holes 171, and the ventilating holes 181 is formed, cooling air that has flown into the first adjacent spaces S1 and the second adjacent spaces S2 from front of the cage 100 easily flows out of the rear parts of the first adjacent spaces S1 and the second adjacent spaces S2, and thereby the cooling air can smoothly flow. This improves cooling efficiency.

<<Shield Member>>

Figure 19:
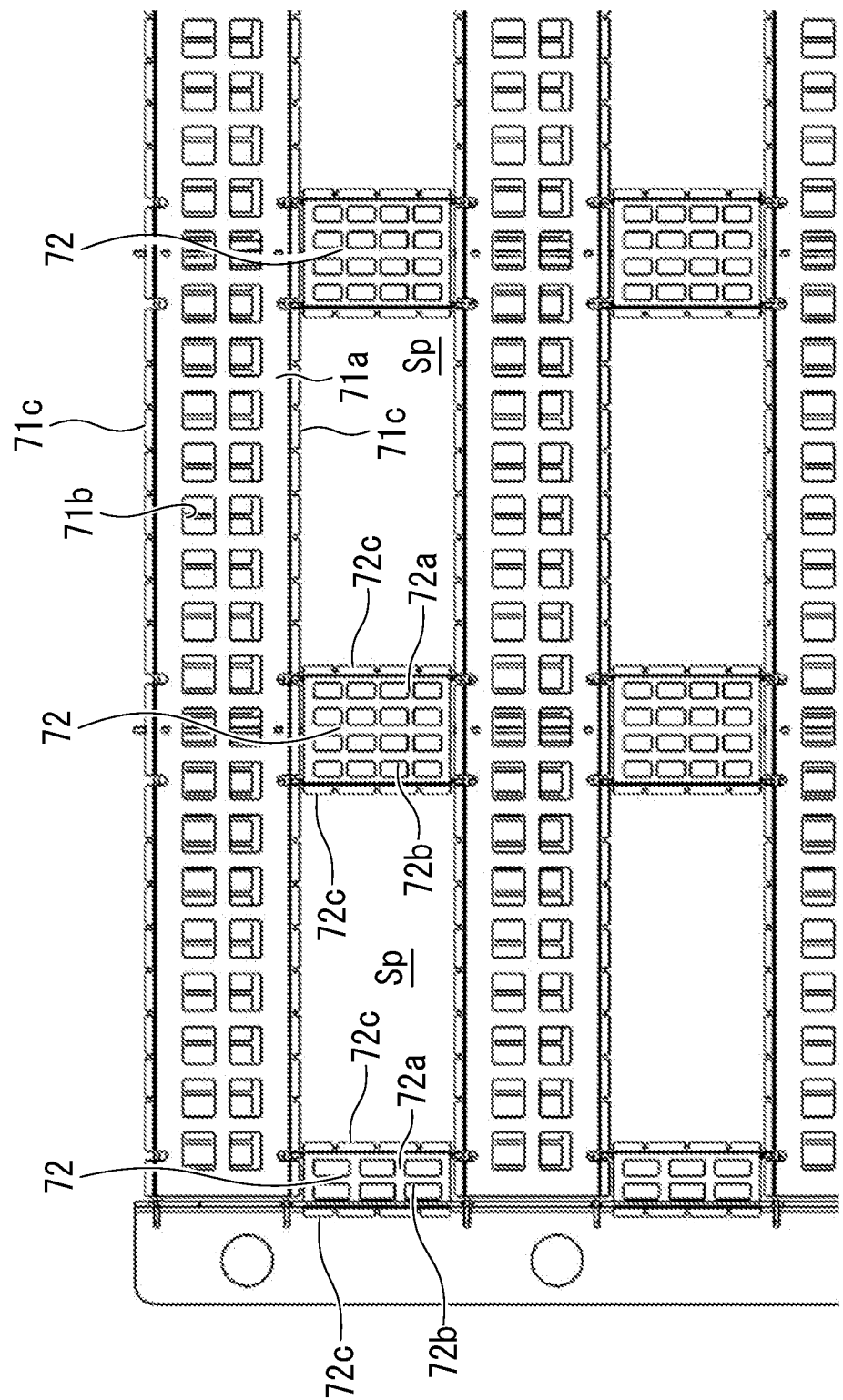
FIG. 19 is a partial enlarged view of FIG. 18.

As illustrated in FIG. 18 to FIG. 20, the cage assembly 10 may include first shield members 71 and second shield members 72.

The first shield members 71 and the second shield members 72 are components for preventing leakage of noise. The first shield members 71 and the second shield members 72 may be, for example, EMI fingers.

Each of the first shield members 71 has a plate-like part 71a and a plurality of finger parts 71c.

The plate-like part 71a is a plate-like portion covering an opening present in the front end of the first adjacent space S1 (first opening), and a plurality of front holes 71b are formed therein. The front holes 71b are holes for ventilation. Thus, even when the plate-like part 71a (the first shield member 71) has been attached to the cage 100, cooling air can be guided to the first adjacent spaces S1.

The plurality of finger parts 71c are connected to both edges in the height direction Dh of the plate-like part 71a (both edges along the width direction Dw), respectively. Each of the finger parts 71c extends along the top side of the top plate 140 and along the underside of the bottom plate 150 and is curved to be convex toward the port Sp. Each finger part 71c is configured to exert elasticity in the height direction Dh due to its curved shape to cause itself to come into close contact with the housed optical module 310.

Each of the second shield members 72 has a plate-like part 72a and a plurality of finger parts 72c.

The plate-like part 72a is a plate-like portion covering an opening present in the front end of the second adjacent space S2 (second opening), and a plurality of front holes 72b are formed therein. The front holes 72b are holes for ventilation. Thus, even when the plate-like part 72a (second shield member 72) has been attached to the cage 100, cooling air can be guided to the second adjacent spaces S2.

The plurality of finger parts 72c are connected to both edges in the width direction Dw of the plate-like part 72a (both edges along the height direction Dh), respectively. Each of the finger parts 72c extends along two partition plates 160 and is curved to be convex toward the port Sp. Alternatively, each the finger part 72c extends along the partition plate 160 and the side plate 170 and is curved to be convex toward the port Sp. Each finger part 72c is configured to exert elasticity in the width direction Dw due to its curved shape to cause itself to come into close contact with the housed optical module 310.

<<Heat Dissipation Material>>

Figure 21:
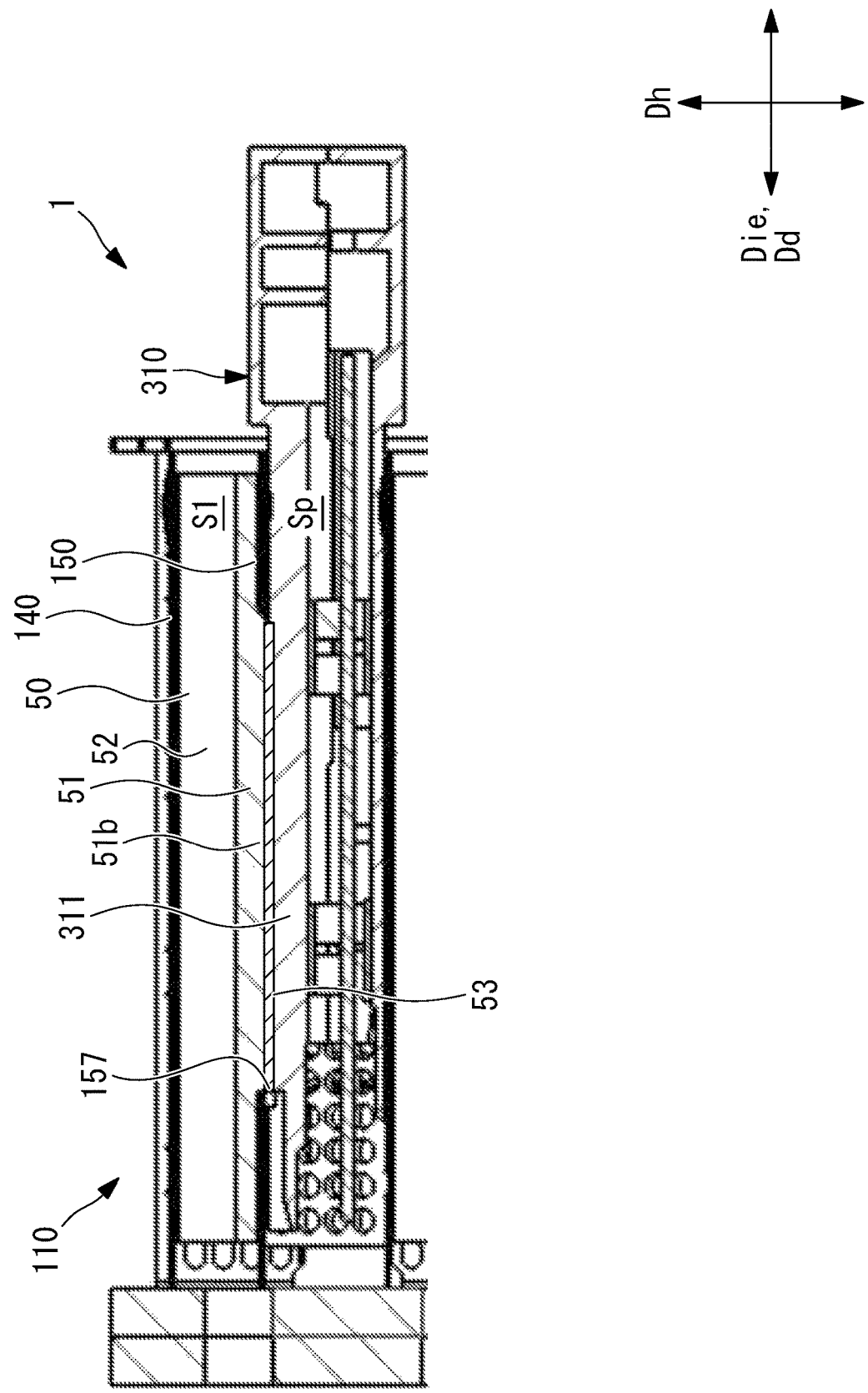
FIG. 21 is a partial sectional view of the cage assembly (with a heat dissipation material).

As illustrated in FIG. 21, the cage assembly 10 may include a heat dissipation material 53.

The heat dissipation material 53 is provided on a face of the protruding part 51b of the heat sink 50 facing the optical module 310.

The heat dissipation material 53 is for improving thermal coupling force between the optical module 310 and the protruding part 51b of the heat sink 50. This can improve cooling efficiency of the heat sink 50.

An example of the heat dissipation material 53 may be a thermal interface material (TIM).

<<Lock Mechanism and Hole for Visual Observation>>

The optical module 310 housed in the port Sp is latched to the port wall 110 of the cage 100.

Specific description will be provided below.

Figure 22:
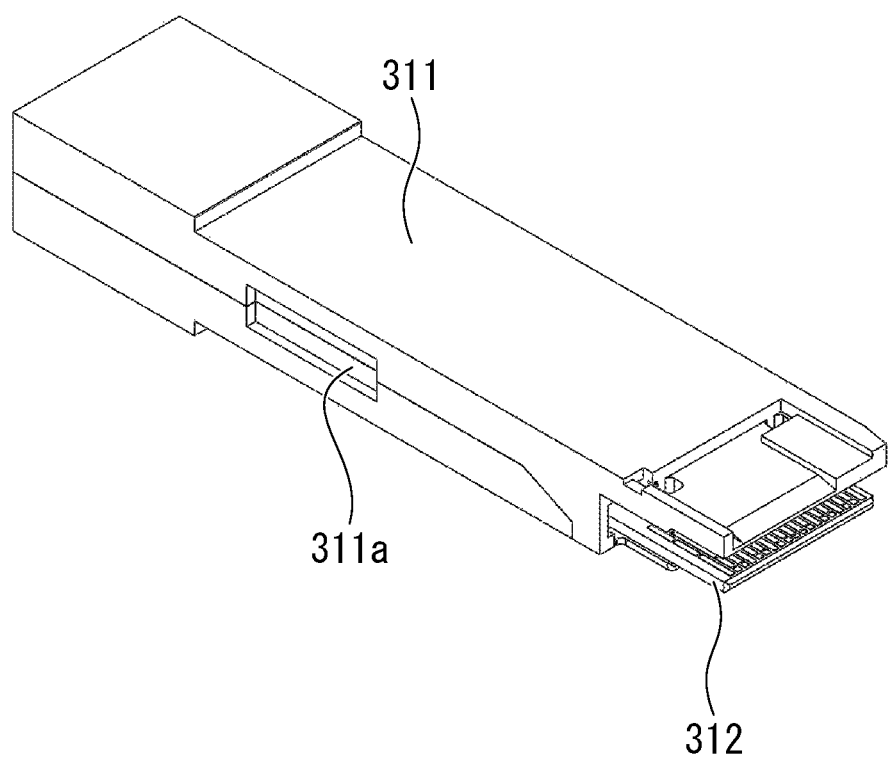
FIG. 22 is a top perspective view of the optical module.
Figure 23:
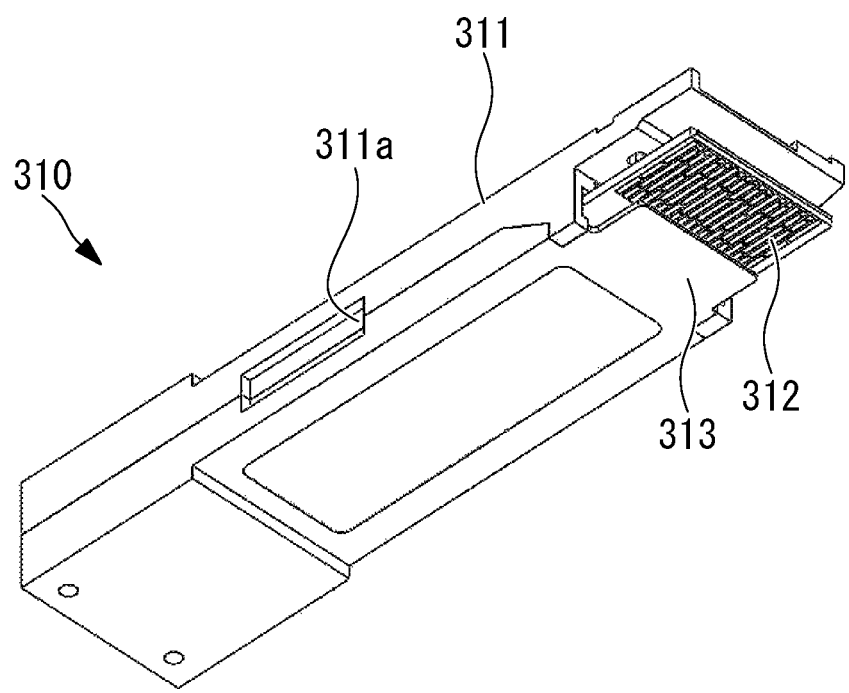
FIG. 23 is a bottom perspective view of the optical module.
Figure 24:
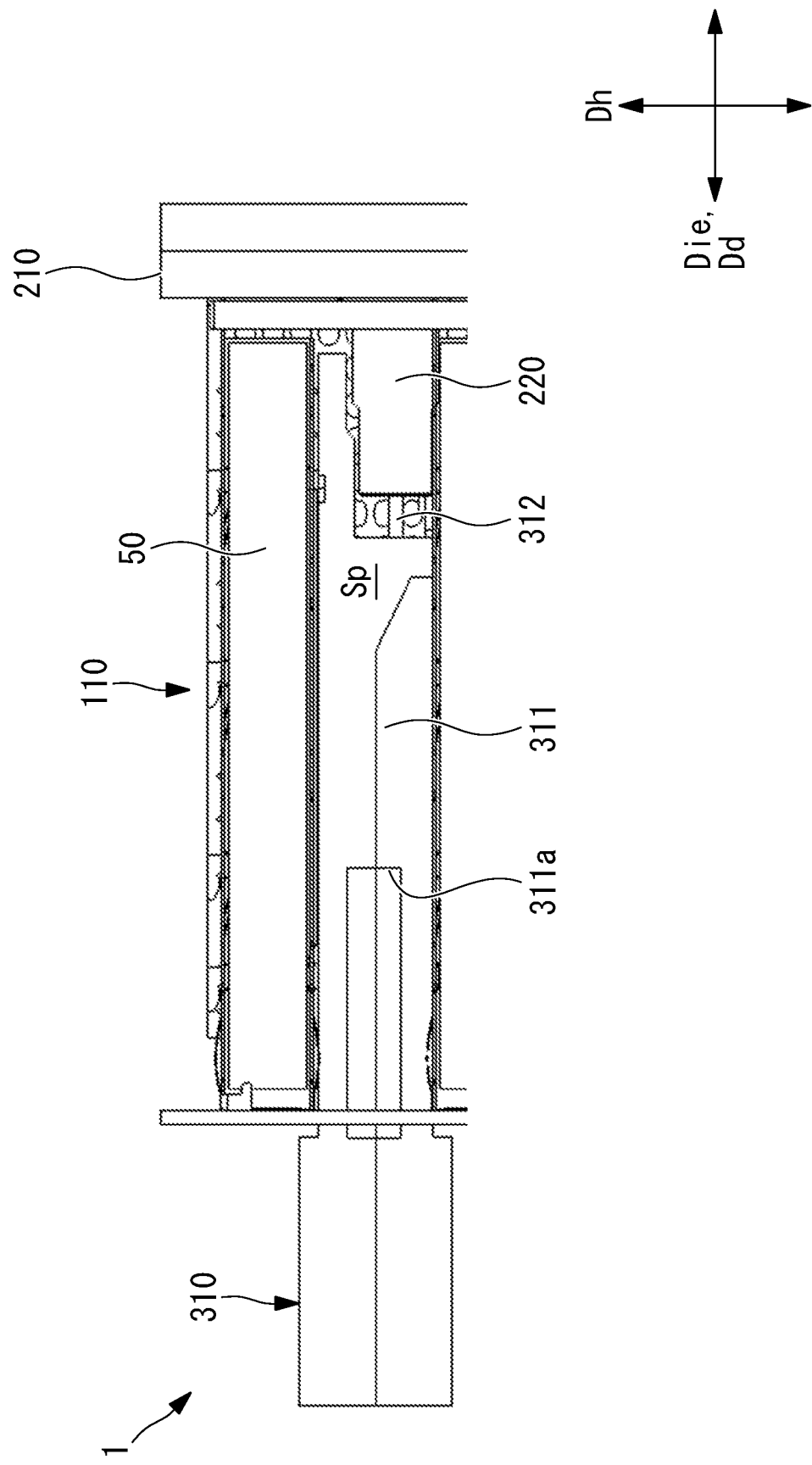
FIG. 24 is a partial sectional view of the cage assembly (partition plates omitted).

As illustrated in FIG. 22 to FIG. 24, the optical module 310 has a casing 311 and a module board 312 protruding out of the casing 311.

The casing 311 is provided with lock grooves 311a.

The lock grooves 311*a* are recessed areas provided on both side faces in the width direction Dw of the casing 311.

Each lock tab 162 described later enters each of the lock grooves 311*a*. Thus, the shape of the lock groove 311*a* is adapted to the shape of the lock tab 162.

Figure 25:
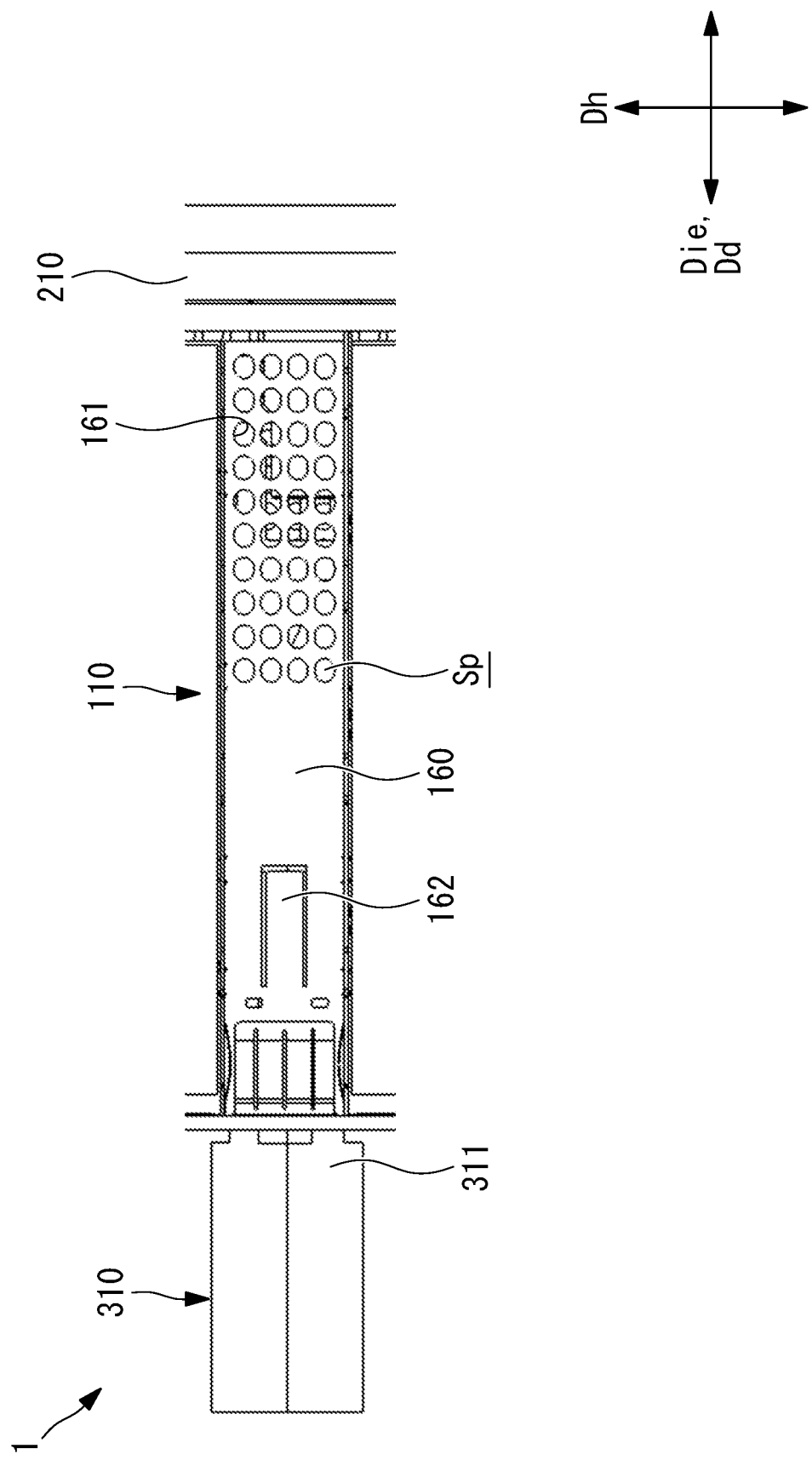
FIG. 25 is a partial sectional view of the cage assembly (with a partition plate).

As illustrated in FIG. 25, the partition plate 160 forming the port wall 110 is provided with the lock tab 162.

The lock tab 162 is a tongue-like portion made by cutting and erecting a part of the partition plate 160 and extends toward the port Sp by the tip being bent so as to enter the port Sp in an unloaded state. The tip of the lock tab 162 is elastically deformable as a free end.

Note that the lock tab 162 may also be formed by connecting an end of a piece, which is a separate component, to the partition plate 160, for example, instead of being formed by cutting and erecting a part of the partition plate 160.

The lock mechanism including the lock groove 311*a* and the lock tab 162 configured as described above functions as follows.

Figure 26:
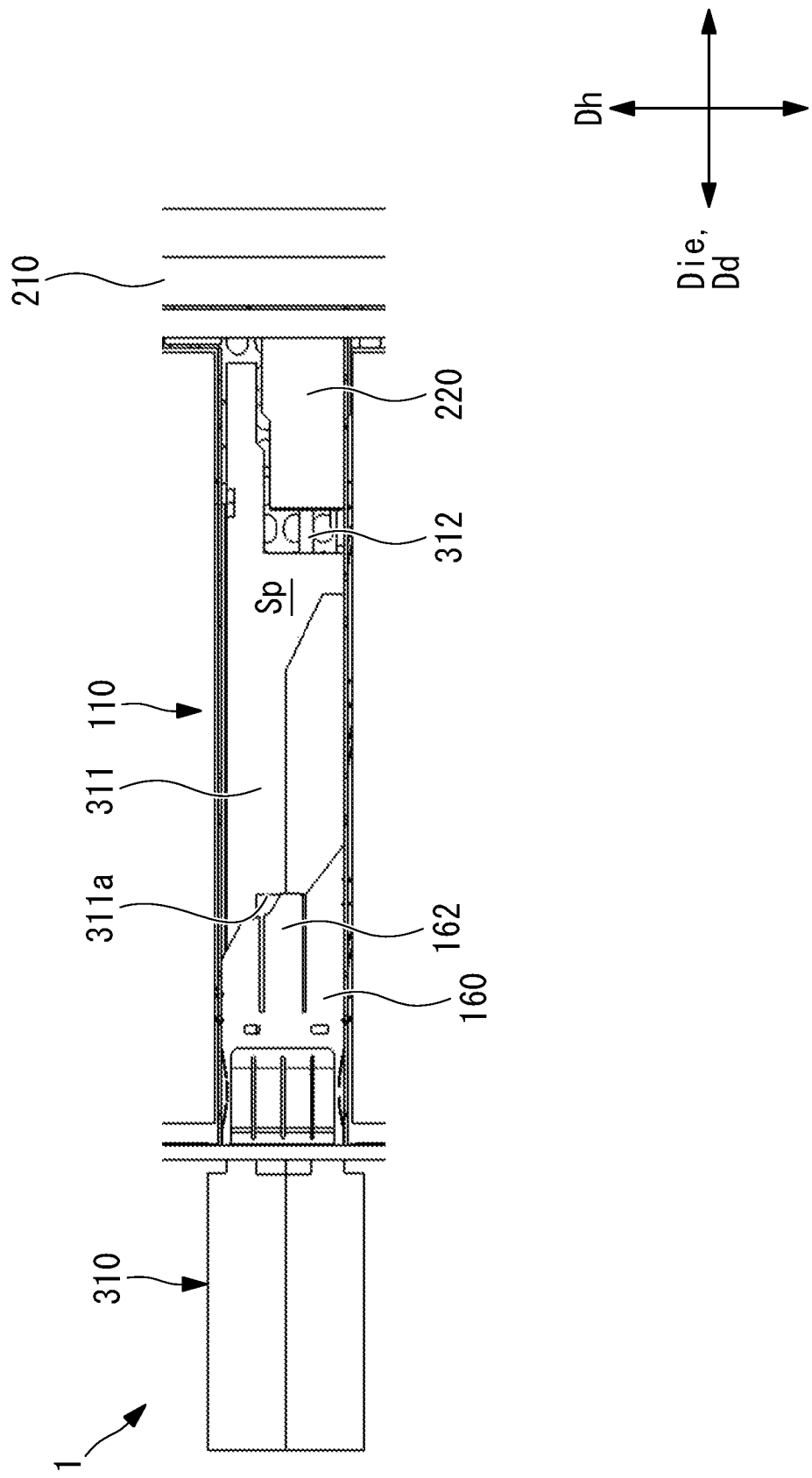
FIG. 26 is a partial sectional view of the cage assembly (a part of the partition plate omitted).

As illustrated in FIG. 26, the lock tab 162 enters the lock groove 311*a* of the optical module 310 inserted into the port Sp from the left. Then, the lock tab 162 latches to the lock groove 311*a*, and thereby motion in the extraction direction of the optical module 310 is restricted.

The position of the optical module 310 when the lock tab 162 has latched to the lock groove 311*a* is referred to as "lock position". The lock position determines the degree that the module board 312 is inserted into the connector 220 (insertion degree). This lock position is determined by the position of the tip of the lock tab 162, for example. The insertion degree of the module board 312 is determined based on a desired contact position (a position in the insertion-extraction direction Die) of contact pins of the connector 220 relative to electrode pads provided in the module board 312.

Figure 28:
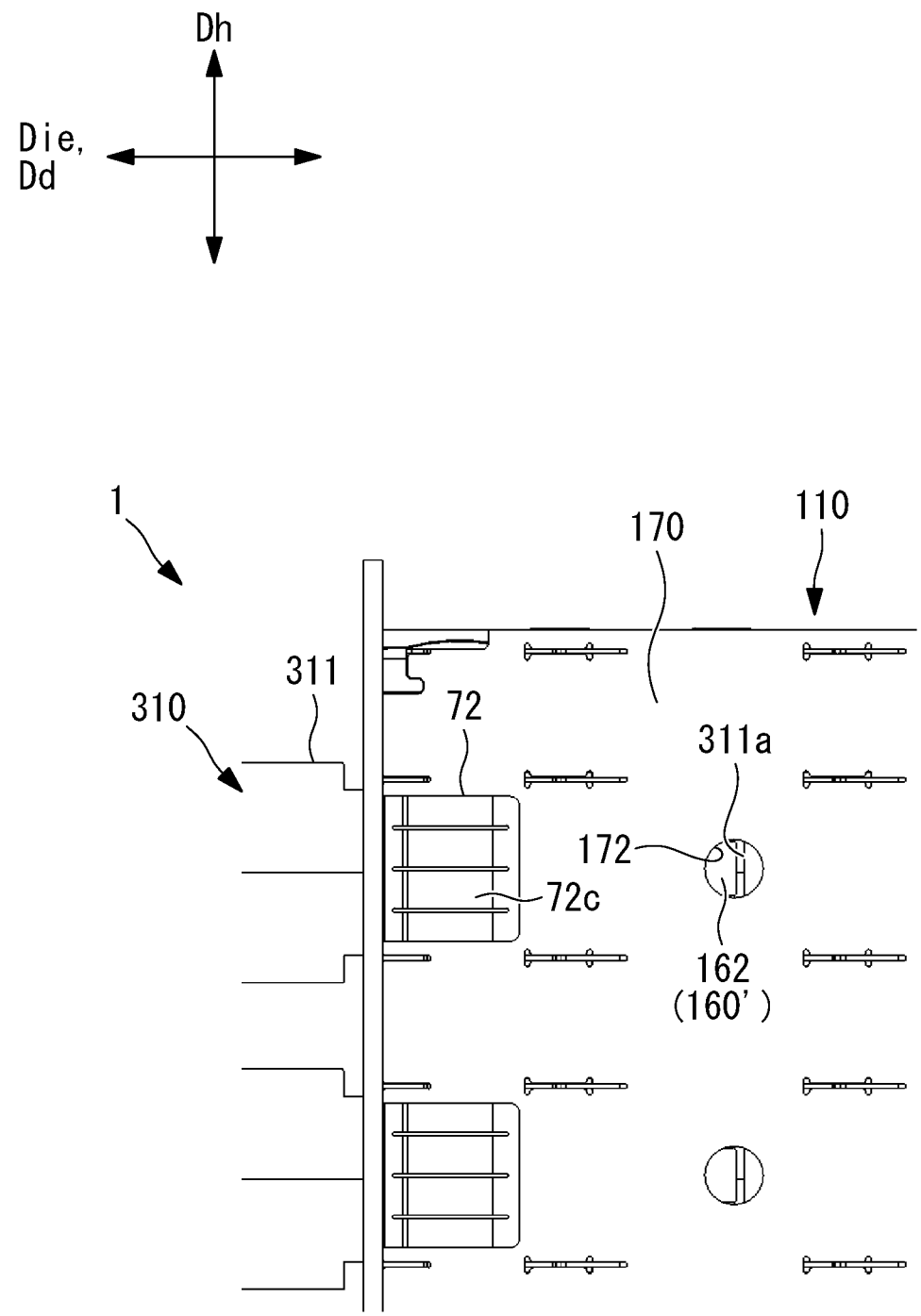
FIG. 28 is a side enlarged view of FIG. 27.

As illustrated in FIG. 27 and FIG. 28, a plurality of visual observation holes 172 (holes) may be formed in the side plate 170.

The visual observation holes 172 are holes used for visually checking whether or not the lock tab 162 provided on the partition plate 160' adjacent to the side plate 170 has properly latched to the lock groove 311*a* of the optical module 310 and/or whether or not the optical module 310 has been inserted as defined.

It is preferable that the visual observation holes 172 be formed at a position corresponding to the position in the height direction Dh and the position in the depth direction Dd at which the tip of the lock tab 162 of the partition plate 160' is present.

Accordingly, when the cage 100 is viewed from the side in the width direction Dw, it is possible to visually observe the tip of the lock tab 162 of the partition plate 160' and the lock groove 311*a* of the optical module 310 through the visual observation holes 172.

<<Cutout for Avoiding Interference with Connector>>

As illustrated in FIG. 29, the connector 220 mounted on the first face 211 of the circuit board 210 includes three portions of a base part 221, an intermediate part 222, and an end part 223, for example.

The base part 221 is a portion facing the first face 211 of the circuit board 210. The end part 223 is a portion where a slot opening 223*a* is formed into which the module board 312 of the optical module 310 is inserted. The intermediate part 222 is a portion present between the base part 221 and the end part 223.

In the height direction Dh, the dimension of the connector 220 decreases from the base part 221, the intermediate part 222, and the end part 223 in this order. Thus, the connector 220 is formed of a plurality of levels including the base part 221, the intermediate part 222, and the end part 223 (formed of three levels in the case of FIG. 29).

Figure 30:
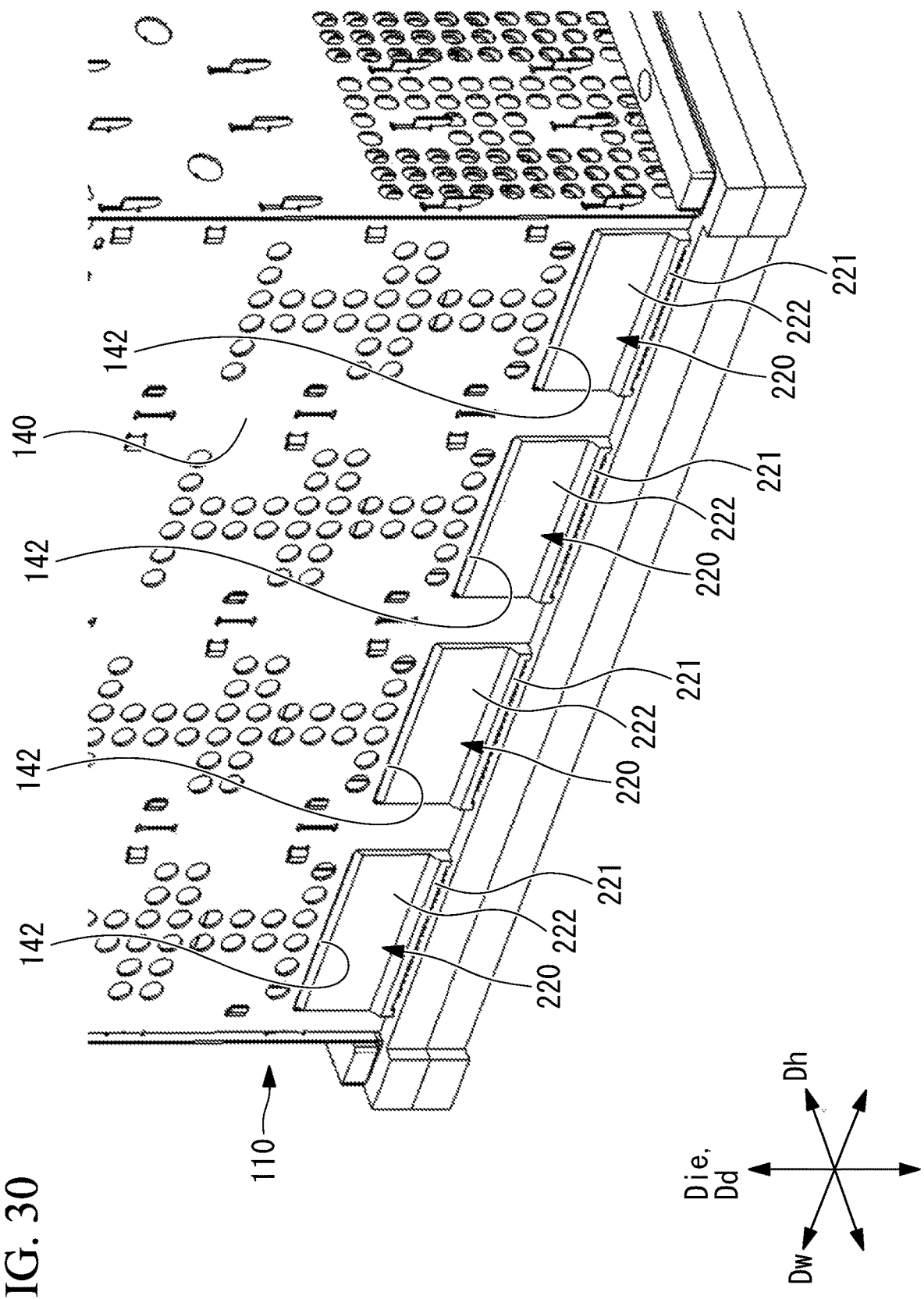
FIG. 30 is a partial underside perspective view of the cage assembly.
Figure 31:
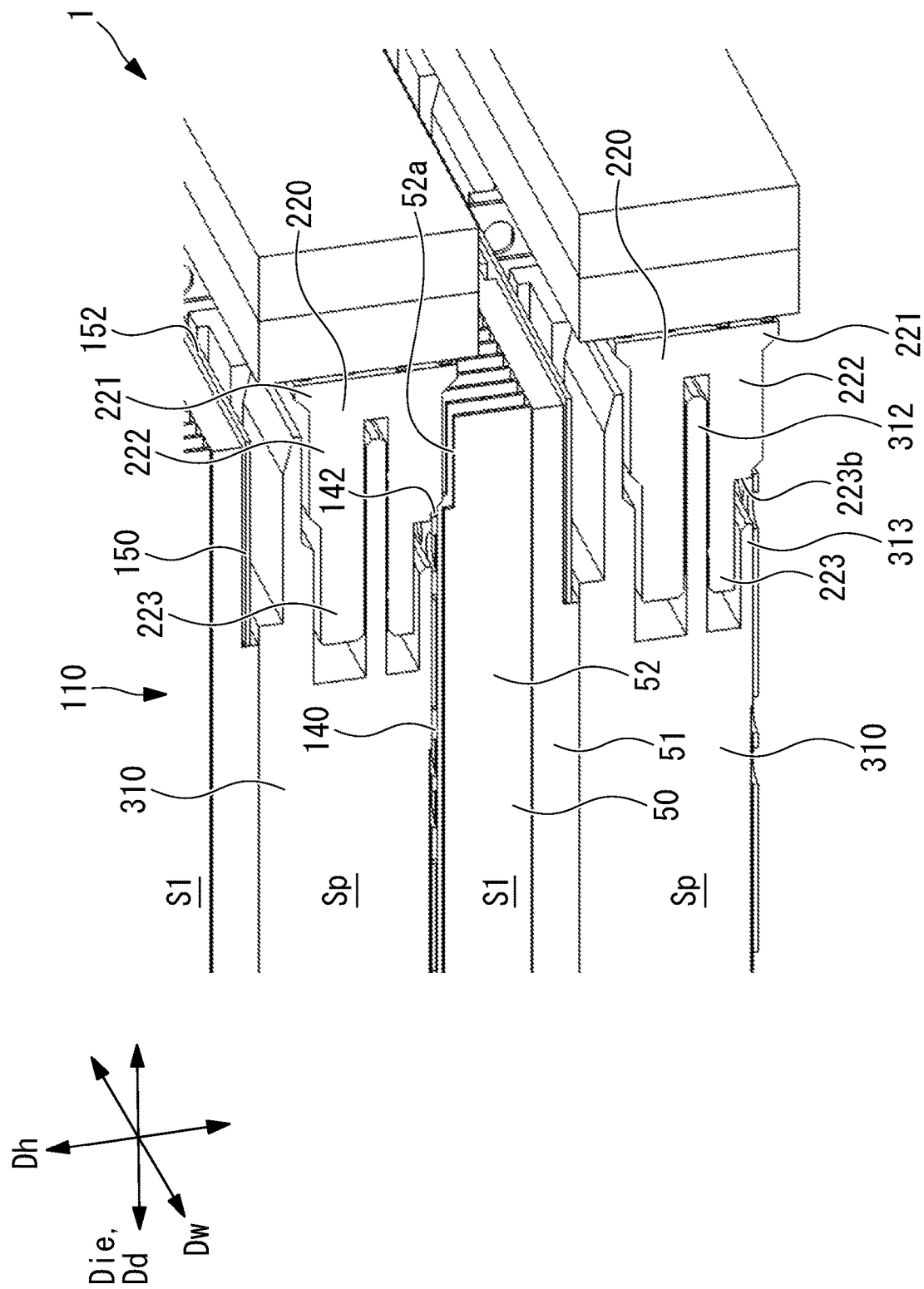
FIG. 31 is a partial sectional view of the receptacle assembly in which the optical module is housed.

As illustrated in FIG. 30 and FIG. 31, relief cutouts 142 (first cutouts) are formed in the top plate 140, the number of relief cutouts 142 corresponding to the number of connectors 220.

Each of the relief cutouts 142 is a cutout formed for avoidance of a part of the connector 220. As illustrated in FIG. 31, "a part of the connector 220" as used herein refers to, for example, a portion of the connector 220 protruding from the underside of the optical module 310 in the height direction Dh, and this portion corresponds to the base part 221 and the intermediate part 222 in the case of FIG. 30 and FIG. 31.

The relief cutout 142 is formed such that the edge of the top plate 140 facing the first face 211 of the circuit board 210 is apart from that first face 211, and the shape thereof is adapted to the shape of the portion of the connector 220 to avoid.

This enables avoidance of a part of the connector 220 without requiring the top plate 140 to be bent in a complex manner.

Note that one conceivable solution to avoid a part of the connector 220 is to lower the top plate 140 (to be closer to the bottom plate 150 defining another port Sp) without forming the relief cutouts 142. However, when a certain pitch between the connectors 220 in the height direction Dh is defined by a specification, the above solution undesirably requires a reduced dimension in the height direction Dh of the first adjacent space S1. This also requires a reduced dimension in the height direction Dh of the heat sink 50, which is not preferable in terms of cooling efficiency.

In other words, by using the relief cutouts 142 for the avoidance of a part of the connector 220, it is possible to shorten the pitch between the connectors 220 in the height direction Dh without reducing the dimension in the height direction Dh of the first adjacent space S1. Thus, the connectors 220 can be mounted at a high density in the height direction Dh. Eventually, the optical module 310 can be mounted at a high density, which leads to a reduction in size of the cage assembly 10.

Further, as illustrated in FIG. 31, a relief cutout 52*a* may be formed in each fin 52 of the heat sink 50 for avoidance of a part of the connector 220.

<<Arrangement of Pressing Heat Sink against Optical Module (Example 1)>>

Figure 32:
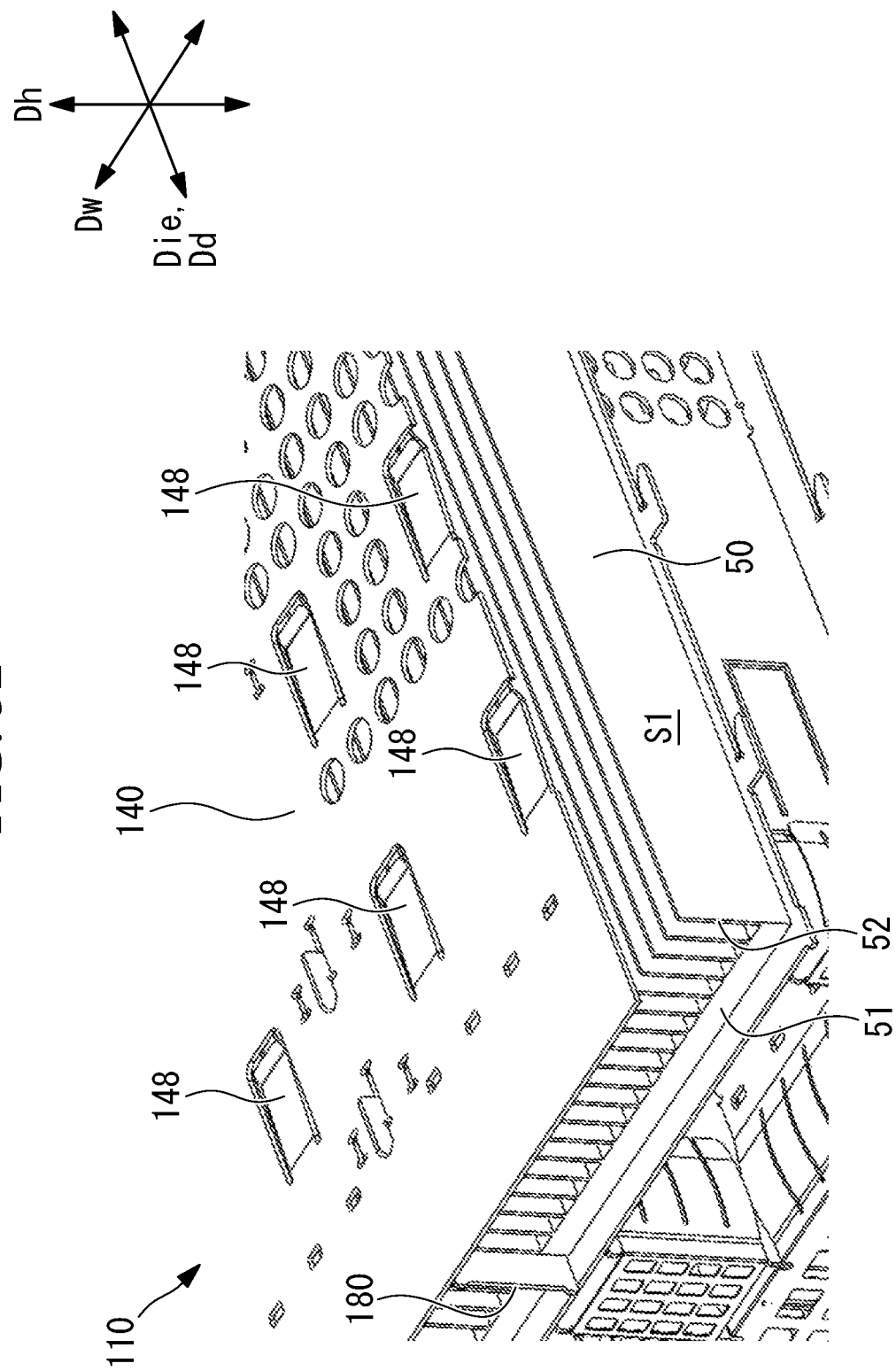
FIG. 32 is a partial front perspective view of the cage assembly.

As illustrated in FIG. 32, the top plate 140 is provided with a plurality of pressing springs 148.

Each of the pressing springs 148 is a tongue-like portion made by cutting and erecting a part of the top plate 140 and extends toward the first adjacent space S1 by the tip of the pressing spring 148 being bent so as to enter the first adjacent space S1 in an unloaded state. The tip of the pressing spring 148 is elastically deformable as a free end.

Note that the pressing spring 148 may be formed by connecting an end of a piece, which is a separate component, to the top plate 140, for example, instead of being formed by cutting and erecting a part of the top plate 140.

The pressing spring 148 configured as described above functions as follows.

Figure 33:
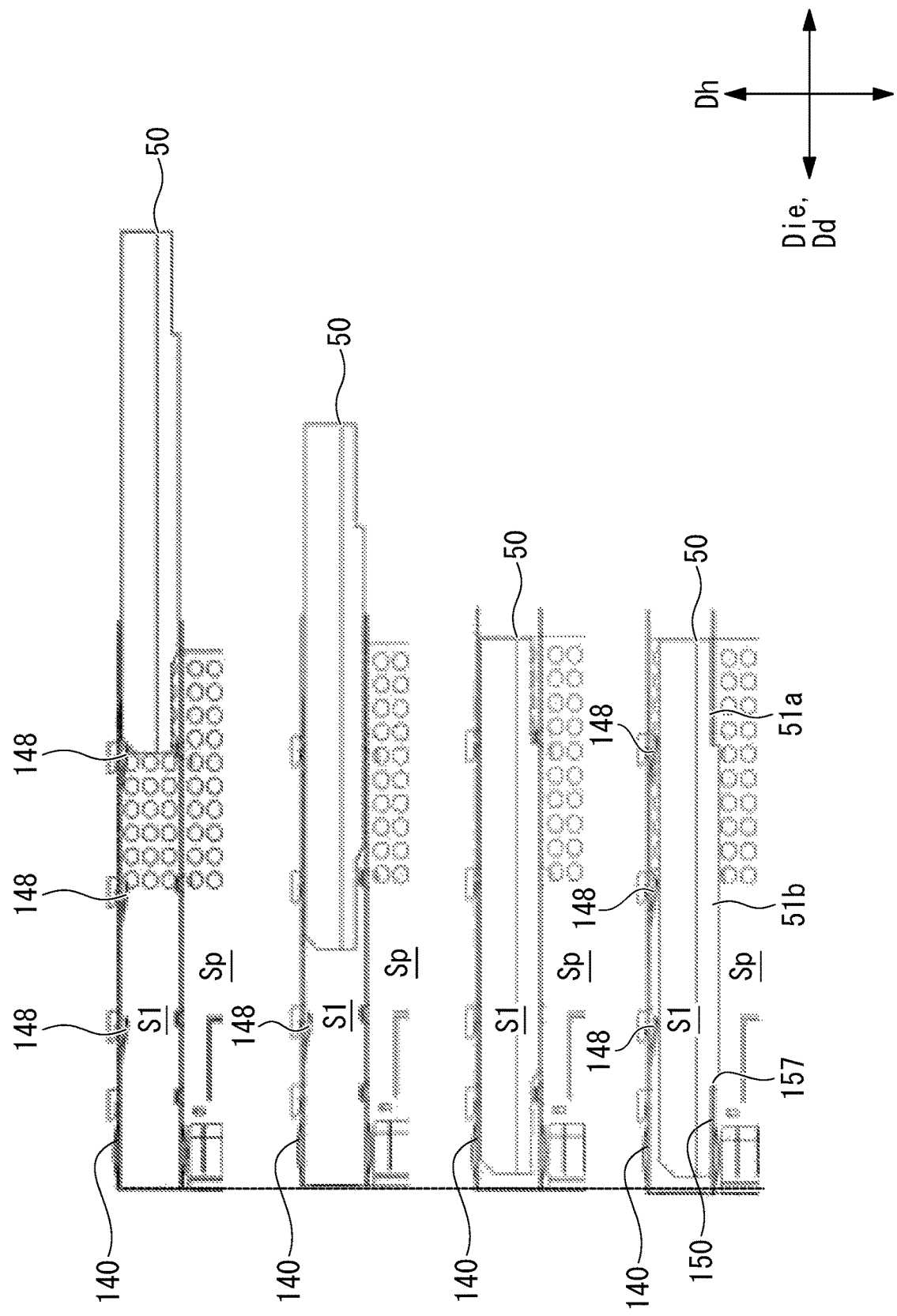
FIG. 33 is a sectional view illustrating views when inserting a heat sink into the cage.

As illustrated in FIG. 33, the heat sink 50 is inserted from the opening in the rear end into the empty first adjacent space S1 in the depth direction Dd.

When the heat sink 50 has been partially inserted into the first adjacent space S1, the pressing spring 148 that has come into contact with the heat sink 50 is elastically deformed, and thereby the tip of the pressing spring 148 is pushed up.

When the heat sink 50 has been inserted further into the first adjacent space S1, and the protruding part 51*b* formed on the bottom face 51*a* of the heat sink 50 has reached the through-part 157 formed in the bottom plate 150, the protruding part 51*b* enters the through-part 157, and the heat sink 50 moves downward.

At this time, the pressing spring 148 presses the heat sink 50 housed in the first adjacent space S1 by the elastic force thereof against the port Sp which is adjacent to the first adjacent space S1 and present under the first adjacent space S1 in the height direction Dh.

This causes the protruding part 51*b* of the heat sink 50 to be pressed against the optical module 310, and the protruding part 51*b* of the heat sink 50 can be in closer contact with the optical module 310.

As illustrated in FIG. 32, although the tip of the pressing spring 148 comes into contact with the fins 52 of the heat sink 50, the fins 52 are thin and thus are likely to be deformed due to the contact with the pressing spring 148.

Figure 34:
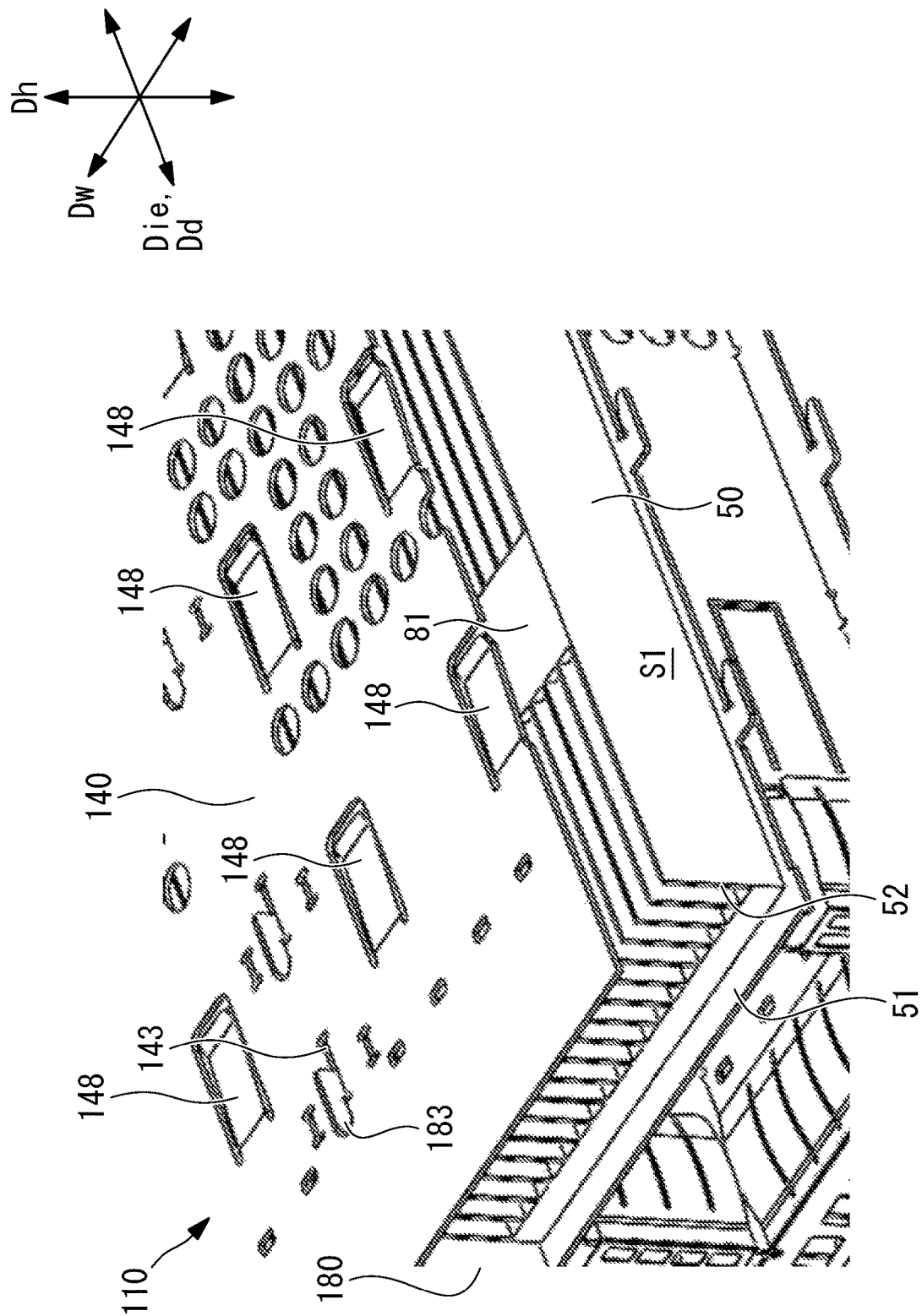
FIG. 34 is a partial front perspective view of the cage assembly (Example 1).

To address this, as illustrated in FIG. 34, a protective plate 81 may be provided between the fins 52 of the heat sink 50 and the pressing spring 148 of the top plate 140.

The protective plate 81 is a plate material and has a dimension greater than the pressing spring 148 in at least the width direction Dw.

Accordingly, the force from the pressing spring 148 is distributed in more fins 52, and the force from the pressing spring 148 loaded on a single fin 52 is reduced compared to a case where the protective plate 81 is not provided. This provides an advantageous effect of reducing deformation of the fins 52.

Note that the top plate 140 is pushed in a direction away from the heat sink 50 by counterforce applied from the pressing spring 148. Thus, deflection to expand in the height direction Dh may occur in the top plate 140.

To address this, the position of the pressing spring 148 provided on the top plate 140 is arranged near a latch part between the second partition plate 180 and the top plate 140. The "latch part" as used herein means the slit 143 of the top plate 140 on which the hook 183 of the second partition plate 180 is hung.

This makes it easier for the latch part to bear the counterforce applied from the pressing spring 148, which reduces deflection of the top plate 140.

<<Arrangement of Pressing Heat Sink against Optical Module (Example 2)>>

In this example, the portion corresponding to the pressing spring 148 described in <<Arrangement of Pressing Heat Sink against Optical Module (Example 1)>> is provided on a protective plate 83 (not on the top plate 140), which is a separate member.

Figure 35:
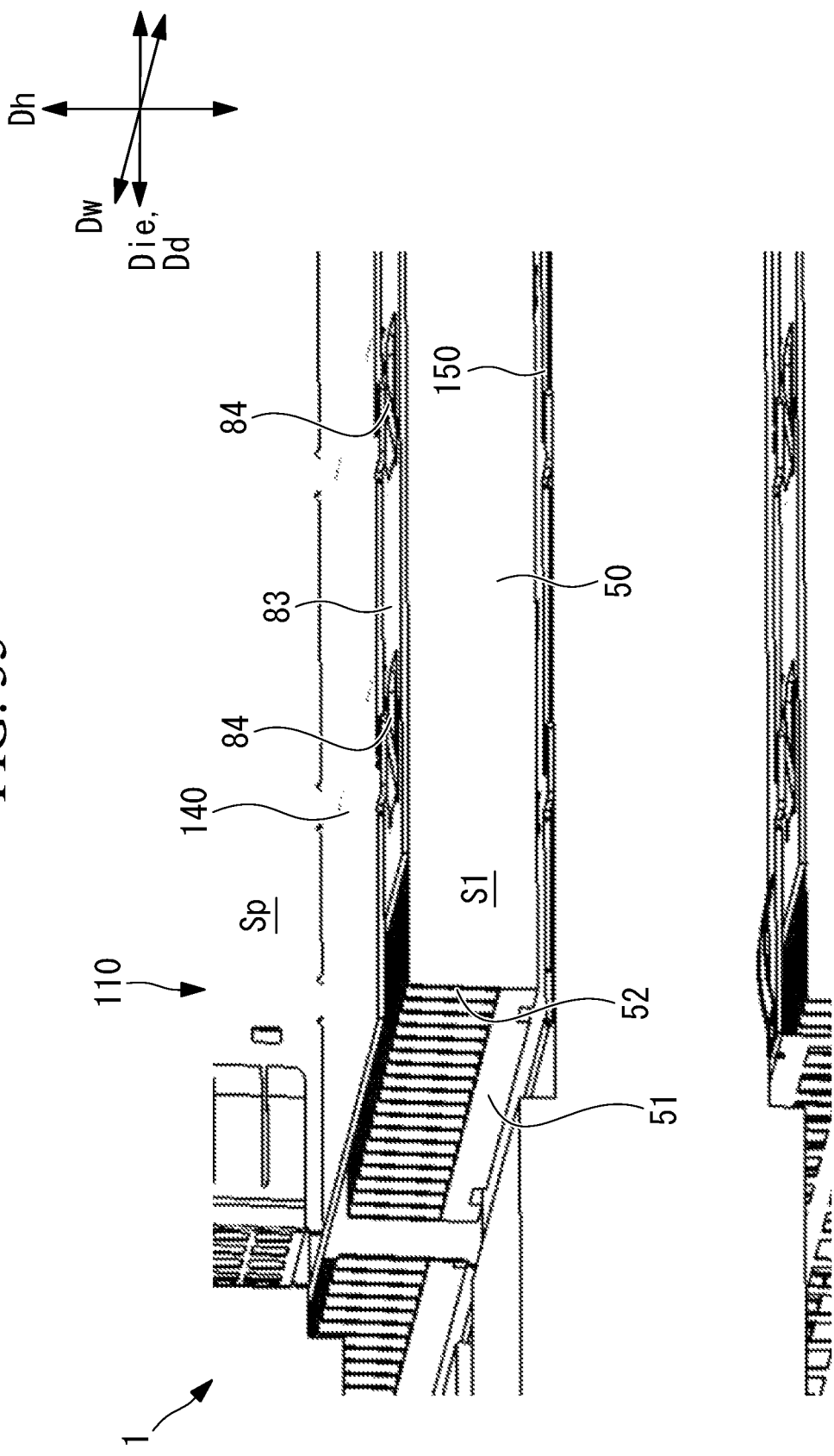
FIG. 35 is a partial front perspective view of the cage assembly (Example 2).

As illustrated in FIG. 35 and FIG. 36, the protective plate 83 is a plate material expanding in the width direction Dw and the depth direction Dd and having a thickness in the height direction Dh and is arranged between the top plate 140, which is not provided with the pressing spring 148, and the fins 52 of the heat sink 50.

The protective plate 83 is provided with a plurality of pushing springs 84.

Each of the pushing springs 84 is a tongue-like portion made by cutting and erecting a part of the protective plate 83 and extends toward the top plate 140 by being bent. The tip of the pushing spring 84 is elastically deformable as a free end.

Note that the pushing spring 84 may be formed by connecting the end of a piece, which is a separate component, to the protective plate 83, for example, instead of being formed by cutting and erecting a part of the protective plate 83.

The protective plate 83 configured as described above functions as follows.

In a state where the heat sink 50 is housed in the first adjacent space S1, the pushing spring 84 comes into contact with the top plate 140, and thereby the protective plate 83 presses the protective plate 83 against the heat sink 50 housed in the same first adjacent space S1 by the elastic force of the pushing spring 84. Thus, the protective plate 83 having the pushing spring 84 presses the heat sink 50 housed in the first adjacent space S1 by the elastic force of the pushing spring 84 against the port Sp which is adjacent to the first adjacent space S1 and present under the first adjacent space S1 in the height direction Dh.

This causes the protruding part 51*b* of the heat sink 50 to be pressed against the optical module 310, and the protruding part 51*b* of the heat sink 50 is in closer contact with the optical module 310. Further, with suitable design of the area of the protective plate 83, the force from the pushing spring 84 loaded on a single fin 52 is reduced compared to a case where the protective plate 83 is not provided, and an advantageous effect of reducing deformation of the fins 52 can be obtained.

<<Cutout for Improving Ventilation>>

As illustrated in FIG. 14, ventilating cutouts 152 (second cutouts) are formed in the bottom plate 150 forming the first adjacent spaces S1, the number of ventilating cutouts 152 corresponding to the number of heat sinks 50.

Each of the ventilating cutouts 152 is a portion formed such that the edge of the bottom plate 150 facing the first face 211 of the circuit board 210 is apart from the first face 211.

Accordingly, air that has passed between the fins 52 of the heat sink 50 can be smoothly guided to outside of the cage 100 (herein, the first adjacent spaces S1), and this can improve cooling efficiency of the heat sink 50.

<<Through-Opening of Circuit Board>>

Figure 37:
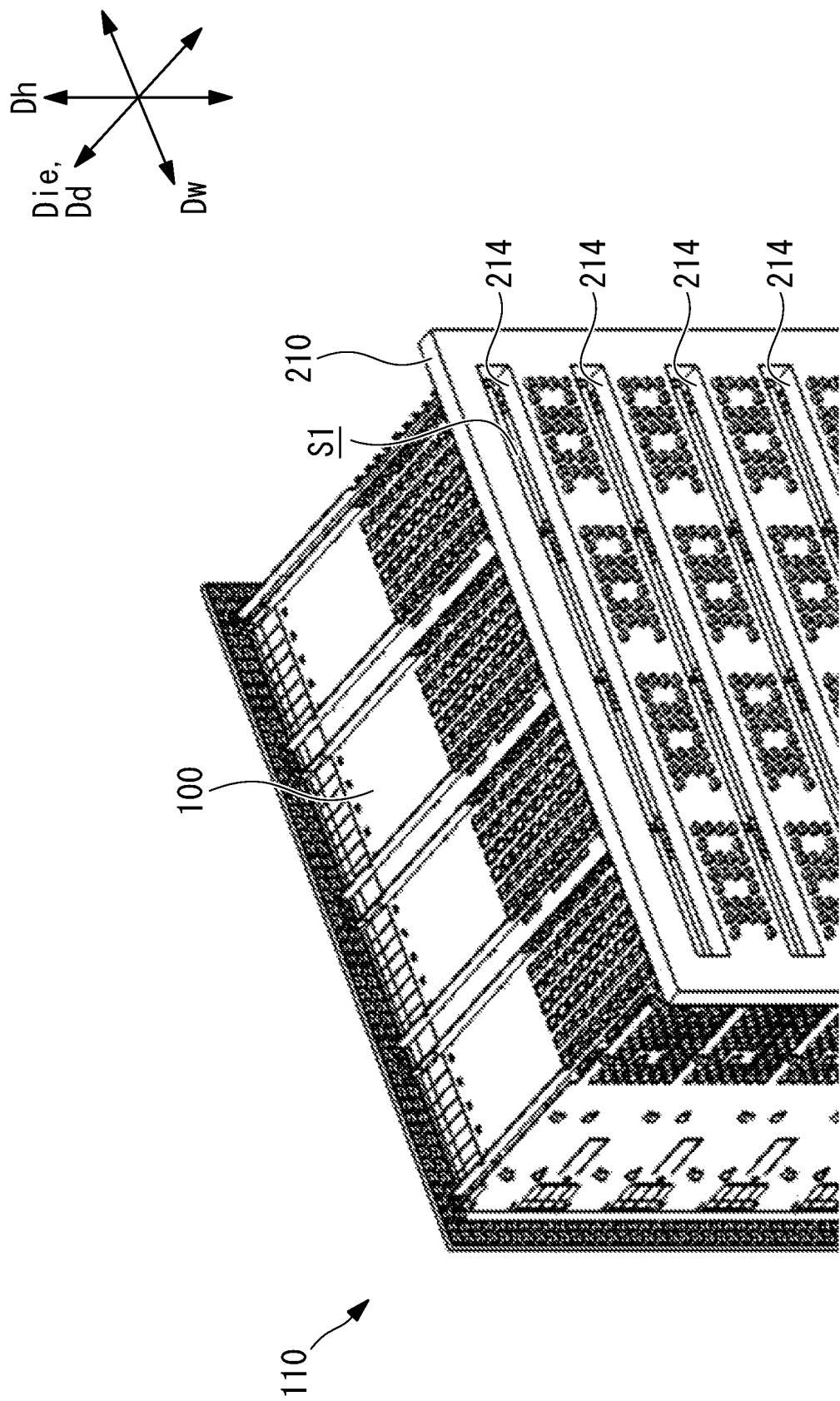
FIG. 37 is a partial rear perspective view of the cage assembly (backplate omitted).

As illustrated in FIG. 4 and FIG. 37, a plurality of through-openings 214 (circuit board through-openings) are formed in the circuit board 210.

Each of the through-openings 214 is a rectangular opening penetrating through the circuit board 210 in the depth direction Dd and, when viewed from rear in the depth direction Dd, overlaps the first adjacent space S1 in which the heat sink 50 is housed. Thus, the through-opening 214 communicates with the first adjacent space S1.

A single through-opening 214 is formed over a plurality of first adjacent spaces S1 (four first adjacent spaces S1 arranged in the width direction Dw in the case of FIG. 37) on the same level in the height direction Dh.

Accordingly, air that has passed between the fins 52 of the heat sink 50 can be smoothly guided to outside (rearward) of the receptacle assembly 1.

Note that the through-opening 214 may be formed in a single first adjacent space S1 in one-to-one manner.

<<Recess of Connector>>

As illustrated in FIG. 23, the optical module 310 has a protective wall 313.

The protective wall 313 is a plate-like portion to protect the module board 312 and is provided substantially parallel to the module board 312.

As illustrated in FIG. 29 and FIG. 31, a recess 223b is formed in the end part 223 of the connector 220.

The recess 223b is a portion that is recessed (a portion whose thickness is reduced) so that the connector 220 does not interfere with the protective wall 313 when the optical module 310 is inserted into the connector 220. Thus, the shape of the recess 223b is adapted to the shape of the protective wall 313.

<<Backplate>>

As illustrated in FIG. 2, each of the backplates 231, 232, 233 of the receptacle assembly 1 is a plate-like component provided so as to come into contact with the second face 212 of the circuit board 210 and is provided for preventing deformation of the circuit board 210 due to insertion/extraction of the optical module 310.

The backplates 231, 232, 233 will be described below.

<<<Backplate 231>>>

As illustrated in FIG. 2 and FIG. 38, the backplate 231 is a plate-like component and has an abutting face 231a facing the second face 212 of the circuit board 210.

The abutting face 231a is a flat face.

Accordingly, the abutting face 231a of the backplate 231 is in close contact with the second face 212 of the circuit board 210, and deformation of the circuit board 210 is more likely to be prevented.

For example, a threaded screw hole (not illustrated) is formed in the backplate 231, and a fastening member such as a screw (not illustrated) inserted into the flange 179 of the cage 100 and the circuit board 210 may be fitted into the threaded hole.

As illustrated in FIG. 4 and FIG. 38, a plurality of through-openings 231b (plate through-openings) are formed in the backplate 231.

Each of the through-openings 231b is a rectangular opening penetrating through the backplate 231 in the depth direction Dd and, when viewed from rear in the depth direction Dd, overlaps the through-opening 214 of the circuit board 210. Thus, the through-opening 231b also overlaps the first adjacent space S1 in which the heat sink 50 is housed, when viewed from rear in the depth direction Dd.

Accordingly, air that has passed between the fins 52 of the heat sink 50 can be smoothly guided to outside of the receptacle assembly 1.

<<<Backplate 232>>>

As illustrated in FIG. 39, a plurality of electronic components 215 are mounted on the second face 212 of the circuit board 210. Examples of the electronic components 215 may be a capacitor, a resistor, or the like.

Some electronic components 215 may protrude from the second face 212 of the circuit board 210. In such a case, it is not possible to cause the backplate 231 having the flat abutting face 231a to come into close contact with the second face 212.

To address this, as illustrated in FIG. 40 and FIG. 41, a plurality of fixing parts 232c are provided on the backplate 232 of the present example.

Each of the fixing parts 232c is a portion protruding from the abutting face 232a toward the circuit board 210. The degree of protrusion of the fixing part 232c is larger than the degree of protrusion of the electronic component 215 mounted on the second face 212.

The fixing part 232c is provided at a position not interfering with any electronic component 215 when the backplate 232 is attached to the circuit board 210. In the case of FIG. 40, the fixing parts 232c are provided on both sides of each through-opening 232b. However, as long as the fixing parts 232c do not interfere with any electronic component 215, the shape, the number, or the arrangement of fixing parts 232c is not limited to the above.

For example, a threaded hole is formed in the fixing part 232c, and a fastening member such as a screw (not illustrated) inserted into the flange 179 of the cage 100 and the circuit board 210 may be fitted into the threaded screw hole.

Since the through-opening 232b has the same configuration as the through-opening 231b of the backplate 231, the description thereof will be omitted here.

<<<Backplate 233>>>

As illustrated in FIG. 42, the backplate 232 of the present example is provided with a plurality of protrusions 233d in addition to a plurality of fixing parts 233c.

Each of the fixing parts 233c has the same configuration as the fixing part 232c of the backplate 232.

Each of the protrusions 233d is a portion protruding from the abutting face 233a toward the circuit board 210. The degree of protrusion of the protrusion 233d is approximately the same as the degree of protrusion of the fixing part 233c.

The protrusion 233d is provided at a position not interfering with any electronic component 215 when the backplate 233 is attached to the circuit board 210. In the case of FIG. 42, the protrusion 233d is provided between the through-openings 232b in the height direction Dh. However, as long as the protrusions 233d do not interfere with any electronic component 215, the shape, the number, or the arrangement of protrusions 233d is not limited to the above.

Since the protrusion 233d comes into contact with the second face 212 of the circuit board 210 because the protrusion 233d is provided, deformation of the circuit board 210 due to insertion of the optical module 310 can be prevented.

Since the through-opening 233b has the same configuration as the through-opening 231b of the backplate 231, the description thereof will be omitted here.

<<Second Heat Sink>>

Figure 44:
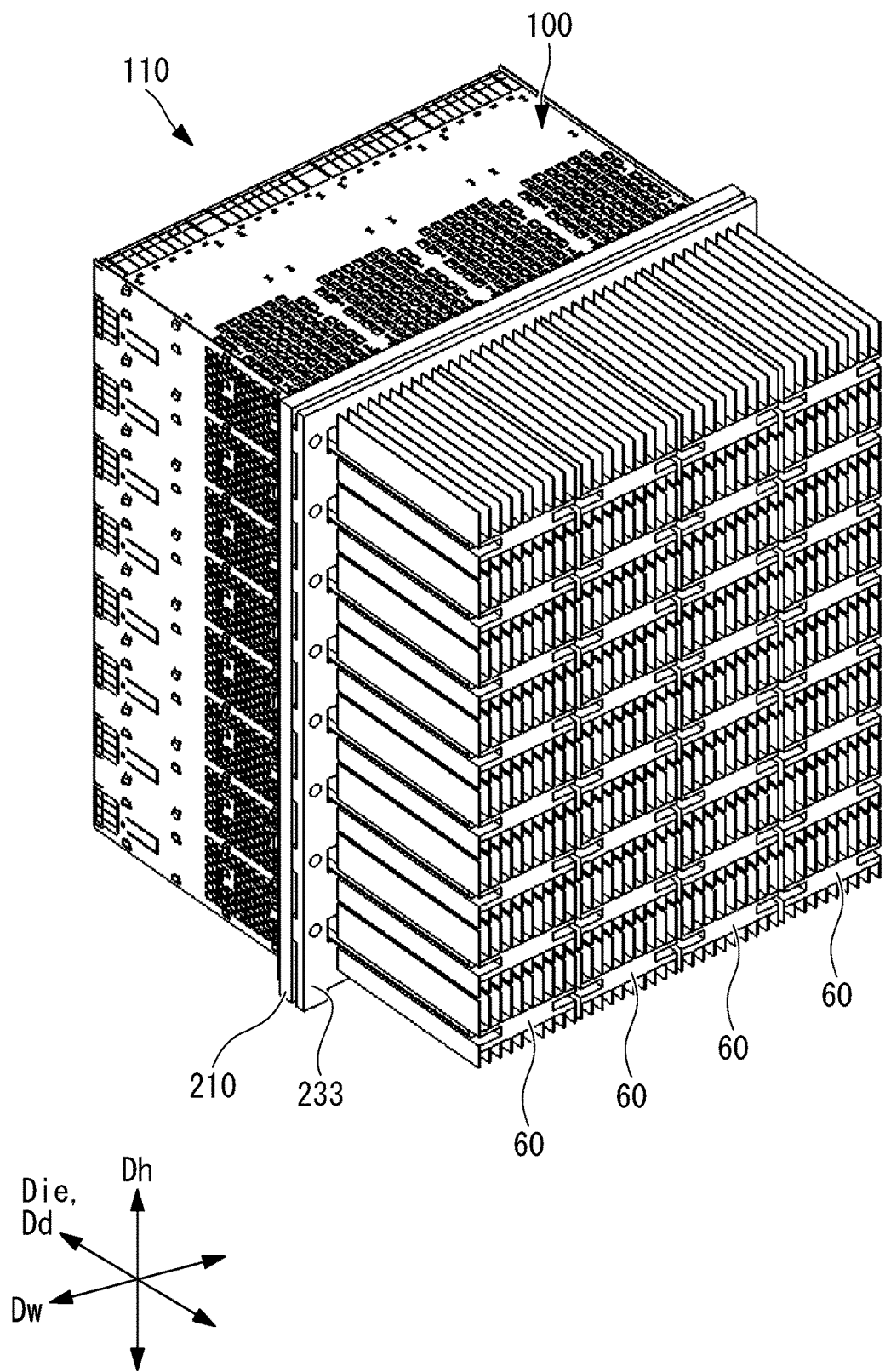
FIG. 44 is a rear perspective view of a cage assembly provided with second heat sinks.

As illustrated in FIG. 43 and FIG. 44, the cage assembly 10 may have one or more second heat sinks 60.

Each of the second heat sinks 60 is a component that comes into thermal contact with the heat sink 50 housed in the first adjacent space S1.

As illustrated in FIG. 45 and FIG. 46, the second heat sink 60 has a base 61 and a plurality of fins 62 erected in the height direction Dh from the base 61.

The second heat sink 60 is connected to the heat sink 50 via a heat pipe 65. This enables heat transfer between the heat sink 50 and the second heat sink 60.

As illustrated in FIG. 47 and FIG. 43, a set of the heat sink 50 and the second heat sink 60 integrated by the heat pipe 65 is attached to the cage 100 from the backside/the rear face of the backplates 231, 232, 233 (the backplate 233 is depicted in the case of FIG. 47 and FIG. 43).

Specifically, the heat sink 50 in the set is inserted and housed in the first adjacent space S1 of the cage 100 via the through-opening 233b of the backplate 233 and the through-opening 214 of the circuit board 210, and the second heat sink 60 in the set is arranged outside the cage 100 (outside the backplate 233).

Because the second heat sink 60 is attached, the cooling efficiency when the heat sink 50 cools the optical module 310 can be improved.

<<Nozzle>>

As illustrated in FIG. 48, the receptacle assembly 1 may have nozzles 240.

Each of the nozzles 240 is a component having a throat flow path 241 defined therein and attached to the backside/the rear face of the backplates 231, 232, 233 (the backplate 233 is depicted in the case of FIG. 48).

As illustrated in FIG. 49 and FIG. 50, the throat flow path 241 has the flow path area (the flow path area in a plane orthogonal to the depth direction Dd) that gradually increases from the inlet to the outlet.

The inlet of the throat flow path 241 communicates with the through-opening 233b of the backplate 233. Thus, air that has flown out of the through-opening 214 of the circuit board 210 is discharged to outside through the through-opening 233b of the backplate 233 and the throat flow path 241.

Because the nozzles 240 are attached, air that has flown out is suitably directed to facilitate smooth discharge of the air, and cooling efficiency of the heat sink 50 can be improved.

Modified Example

Figure 51:
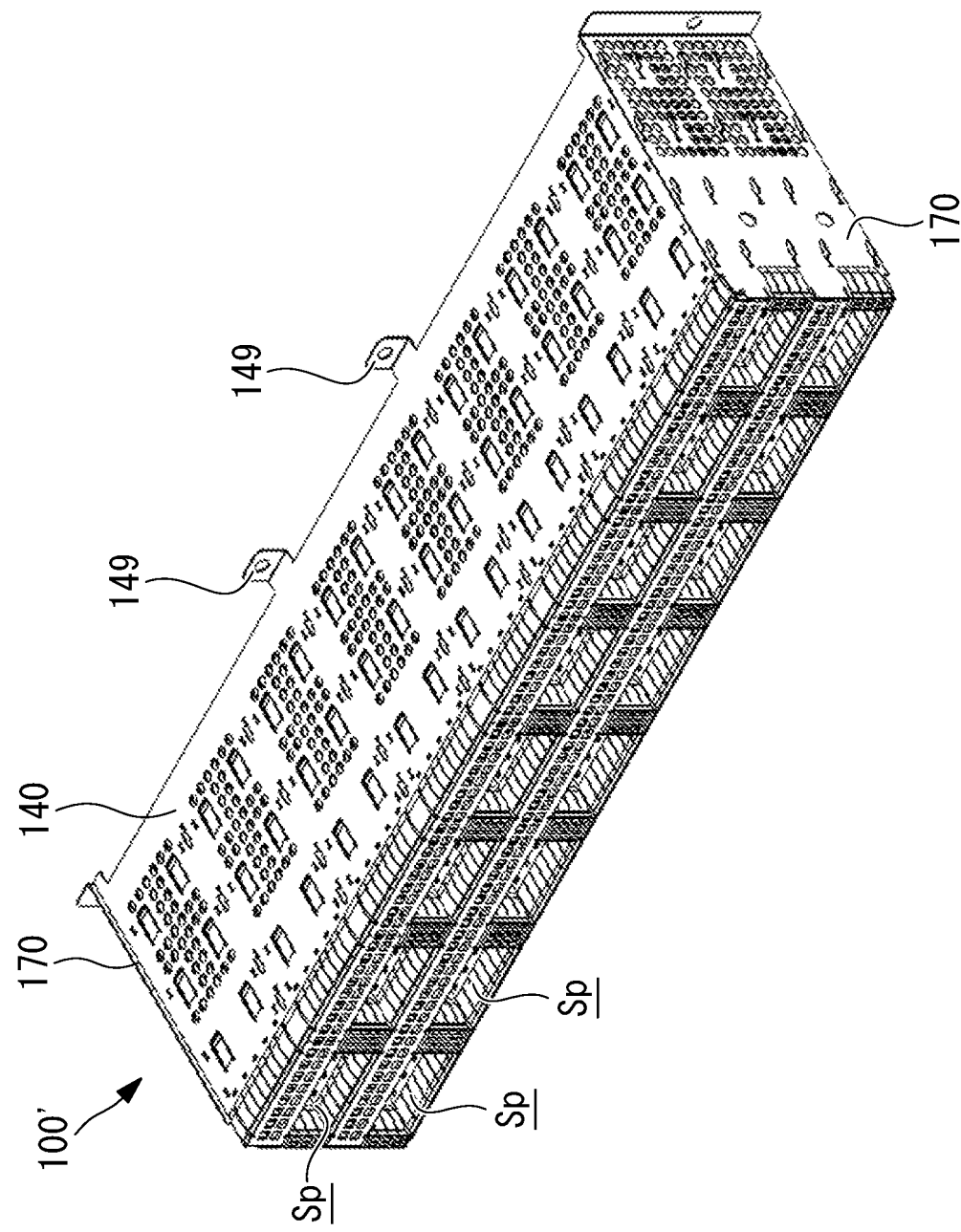
FIG. 51 is a front perspective view of a cage according to a modified example.
Figure 52:
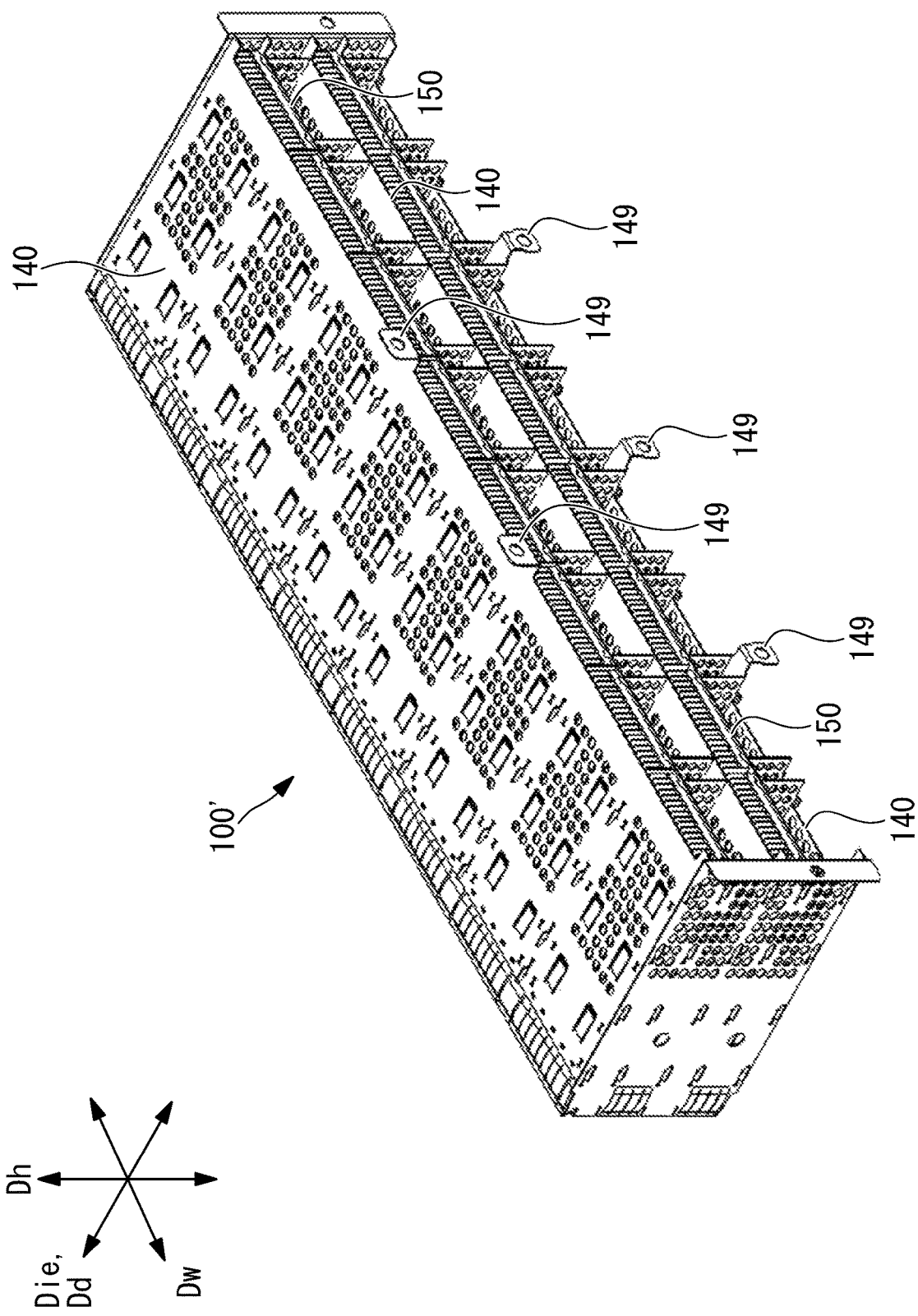
FIG. 52 is a rear perspective view of the cage according to the modified example.

Although the cage 100 having 8×4 ports Sp has been employed as an example of the embodiment in the above description so far, the number of ports Sp is not limited thereto. For example, as illustrated in FIG. 51 and FIG. 52, a cage 100' having 2×8 ports Sp may be employed.

In such a case, since the cage 100' has a larger dimension in the width direction Dw relative to the dimension in the height direction Dh, it is preferable to provide a flange 149 in the middle region in the width direction Dw of each of the uppermost and lowermost top plates 140.

Figure 53:
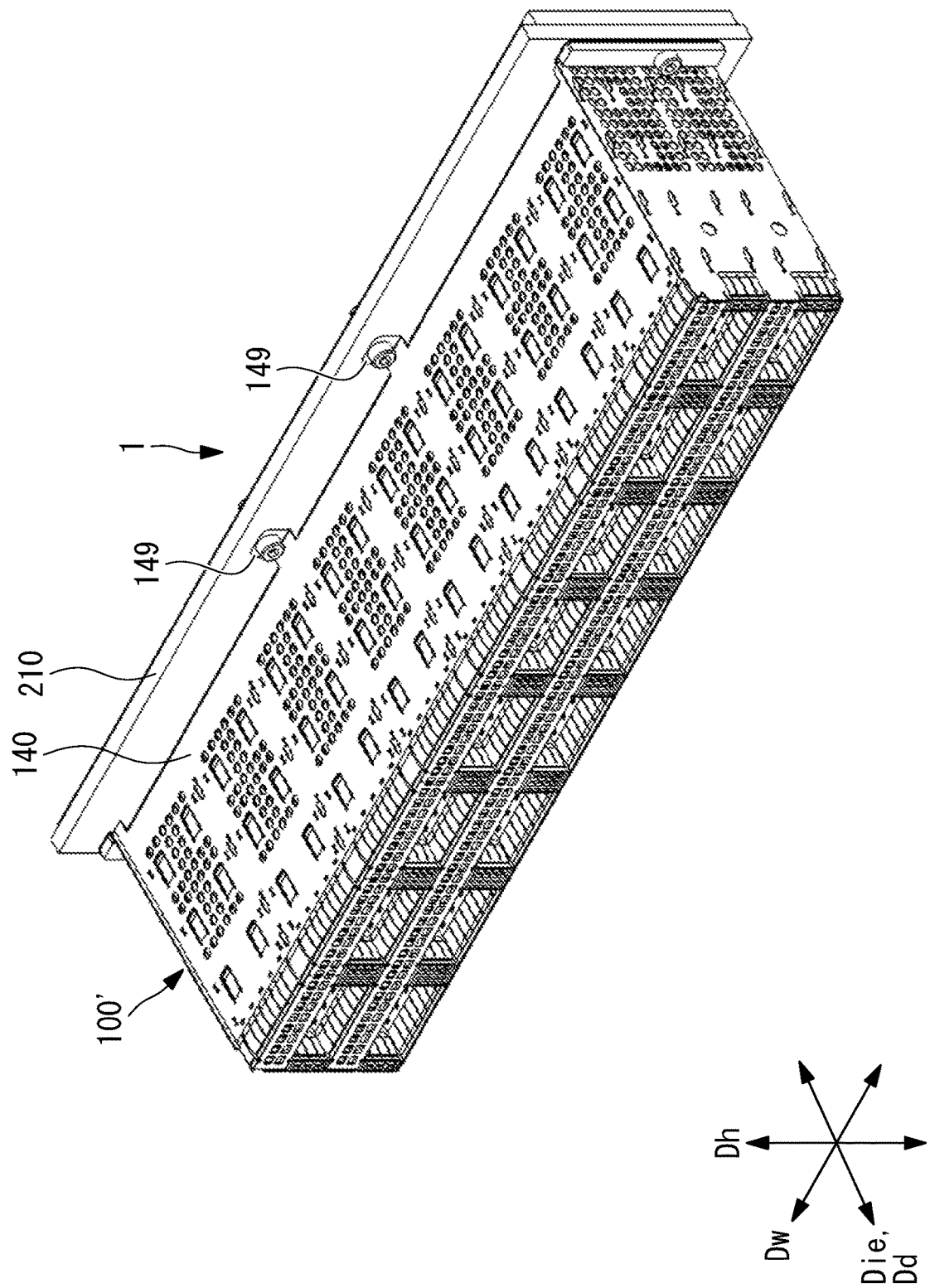
FIG. 53 is a front perspective view of a receptacle assembly according to the modified example.

As illustrated in FIG. 53 and FIG. 54, because the flange 149 is provided, the cage 100' can be fixed to the circuit board 210 by a fastening member by using the flange 149, and the cage 100' can be stably supported.

LIST OF REFERENCE SYMBOLS 1 receptacle assembly
10 cage assembly
50 heat sink
51 base
51a bottom face
51b protruding part
52 fin
52a relief cutout
53 heat dissipation material
60 second heat sink
61 base
62 fin
65 heat pipe
71 first shield member
71a plate-like part
71b front hole
71c finger part
72 second shield member
72a plate-like part
72b front hole
72c finger part
81 protective plate (with a pressing part in a top plate)
83 protective plate (without a pressing part in a top plate)
84 pushing spring (pushing part)
100, 100' cage
110 port wall
120 first adjacent wall
130 second adjacent wall
140 top plate (third-direction plate)
141 ventilating hole
142 relief cutout (first cutout)
143 slit
144 slit
146 hook
148 pressing spring (pressing part)
149 flange
150 bottom plate (third-direction plate)
152 ventilating cutout (second cutout)
153 slit
154 slit
156 hook
157 through-part
160, 160' partition plate (second-direction plate)
161 ventilating hole
162 lock tab
164 latch claw
170 side plate (second-direction plate)
171 ventilating hole
172 visual observation hole
176 slit
179 flange
180 second partition plate (second-direction plate)
181 ventilating hole
183 hook
210 circuit board (external circuit board)
21 first face
212 second face
214 through-opening (circuit board through-opening)
215 electronic component
220 connector
22 base part
222 intermediate part
223 end part
223a slot opening
223b recess
231 backplate
231a abutting face
231b through-opening (plate through-opening)
232 backplate
232a abutting face
232b through-opening (plate through-opening)
232c fixing part
233 backplate
233a abutting face
233b through-opening (plate through-opening)
233c fixing part
233d protrusion
240 nozzle
241 throat flow path
310 optical module
311 casing
311a lock groove
312 module board
313 protective wall
P pair of partition plates
Sp port
S1 first adjacent space
S2 second adjacent space

What is claimed is:

1. A cage assembly configured to be attached to a first face of an external circuit board and house an external module, the external module being inserted in the cage assembly along a first direction that is substantially orthogonal to the first face, the cage assembly comprising:

when a direction orthogonal to the first direction is defined as a second direction, and a direction orthogonal to the first direction and the second direction is defined as a third direction, a cage configured to house the external module; and a heat sink configured to thermally contact with the external module, wherein the cage includes a port wall defining a port in which the external module is housed, a first adjacent wall defining a first adjacent space that is adjacent to the port in the second direction, and a second adjacent wall defining a second adjacent space that is adjacent to the port in the third direction and in which the external module is not housed, and wherein the heat sink is housed in the first adjacent space.

2. The cage assembly according to claim 1, wherein the first adjacent space is larger than the port in the third direction.

3. The cage assembly according to claim 1, wherein at least any one of the port wall, the first adjacent wall, and the second adjacent wall includes a plurality of holes.

4. The cage assembly according to claim 3, wherein the plurality of holes are arranged in a region close to the external circuit board.

5. The cage assembly according to claim 1 further comprising:

a first shield member; and a second shield member, wherein the first adjacent space includes a first opening on the opposite side from the external circuit board, wherein the second adjacent space includes a second opening on the opposite side from the external circuit board, wherein the first shield member covers the first opening, wherein the second shield member covers the second opening, wherein the first shield member includes a plurality of holes, wherein the plurality of holes are arranged in only a portion of the first shield member, the portion covering the first opening, wherein the second shield member includes a plurality of holes, and wherein the plurality of holes are arranged in only a portion of the second shield member, the portion covering the second opening.

6. The cage assembly according to claim 1 further comprising a heat dissipation material provided on a face of the heat sink facing the external module.

7. The cage assembly according to claim 1, wherein the port wall includes a latch part configured to latch the external module, and wherein the second adjacent wall includes a hole through which the latch part is visible in the third direction.

8. The cage assembly according to claim 7, wherein the second adjacent wall including the hole is arranged only both sides in the third direction.

9. The cage assembly according to claim 1, wherein the external module is a module connected to an external connector mounted on the external circuit board, and wherein the port wall includes a first cutout formed in an edge facing the external circuit board such that the first cutout is apart from the external circuit board and is adapted to a shape of the external connector.

10. The cage assembly according to claim 1 further comprising a protective plate arranged between the heat sink and the first adjacent wall, wherein the first adjacent wall includes a pressing part, and wherein the pressing part extends from the first adjacent wall toward the protective plate and presses the heat sink against the port by being in contact with the protective plate.

11. The cage assembly according to claim 1 further comprising a protective plate arranged between the heat sink and the first adjacent wall, wherein the protective plate includes a pushing part, and wherein the pushing part extends from the protective plate toward the first adjacent wall and pushes the heat sink against the port by being in contact with the first adjacent wall.

12. The cage assembly according to claim 10, wherein the first adjacent wall includes two second-direction plates extending in the second direction and facing each other in the third direction, and two third-direction plates extending in the third direction and facing each other in the second direction, wherein the first adjacent wall is configured with the two second-direction plates being arranged between the two third-direction plates and being latched to the third-direction plates by a latch part, and wherein the pressing part is located in the third-direction plates near the latch part.

13. The cage assembly according to claim 10, wherein the heat sink includes a protruding part contacted with the external module on a bottom face of the heat sink, wherein the first adjacent wall includes two third-direction plates extending in the third direction and facing each other in the second direction, wherein one of the third-direction plates which is in contact with the bottom face of the heat sink includes a through-part that the protruding part of the heat sink enters, and wherein another one of the third-direction plates which is not in contact with the bottom face of the heat sink includes the pressing part.

14. The cage assembly according to claim 11, wherein the heat sink includes a protruding part contacted with the external module on a bottom face of the heat sink, wherein the first adjacent wall includes two third-direction plates extending in the third direction and facing each other in the second direction, wherein one of the third-direction plates which is in contact with the bottom face of the heat sink includes a through-part that the protruding part of the heat sink enters, and wherein another one of the third-direction plates which is not in contact with the bottom face of the heat sink faces the protective plate and is in contact with the pushing part of the protective plate.

15. The cage assembly according to claim 1, wherein the first adjacent wall includes two third-direction plates extending in the third direction and facing each other in the second direction, and wherein one of the third-direction plates which is not in contact with the bottom face of the heat sink includes a second cutout in an edge facing the external circuit board, the second cutout being formed so as to be apart from the external circuit board.

16. A receptacle assembly comprising:

the cage assembly according to claim 1;

a circuit board as the external circuit board; and a connector mounted on the first face of the circuit board, wherein the circuit board includes a circuit board through-opening penetrating in the first direction, and wherein the circuit board through-opening overlaps the first adjacent space when viewed in the first direction.

17. The receptacle assembly according to claim 16, wherein the external module includes a module board inserted into the connector and a protective wall configured to protect the module board, and wherein the connector includes a recess adapted to a shape of the protective wall.

18. The receptacle assembly according to claim 16 further comprising a backplate provided on a second face that is the backside of the first face of the circuit board, wherein the backplate is in close contact with the second face.

19. The receptacle assembly according to claim 16 further comprising a backplate provided on a second face that is the backside of the first face of the circuit board, wherein an electronic component is mounted on the second face of the circuit board, wherein the backplate includes a fixing part to which a fastening member for fixing to the circuit board is attached, and wherein the fixing part is a portion more protruding toward the circuit board than other portions and is provided at a position not interfering with the electronic component mounted on the second face.

20. The receptacle assembly according to claim 19, wherein the backplate includes a protrusion contacted with the second face, and wherein the protrusion is a portion protruding toward the circuit board by approximately the same degree as the fixing part and is provided at a position not interfering with the electronic component mounted on the second face.

21. The receptacle assembly according to claim 16 further comprising a second heat sink that is in thermal contact with the heat sink, wherein the second heat sink protrudes from a second face that is the backside of the first face of the circuit board that is in thermal contact with the heat sink.

22. The receptacle assembly according to claim 21 further comprising a heat pipe connecting the heat sink and the second heat sink to each other.

23. The receptacle assembly according to claim 16 further comprising a nozzle defining a throat flow path, wherein the throat flow path is a flow path to guide air flowing out of the circuit board through-opening to outside and is configured such that the flow path area gradually increases along the first direction.

24. The receptacle assembly according to claim 18, wherein the backplate includes a plate through-opening penetrating in the first direction, and wherein the circuit board through-opening and the plate through-opening overlap each other when viewed in the first direction.

25. The receptacle assembly according to claim 19, wherein the backplate includes a plate through-opening penetrating in the first direction, and wherein the circuit board through-opening and the plate through-opening overlap each other when viewed in the first direction.

* * * * *